US012224273B2

United States Patent
Akimoto

(10) Patent No.: US 12,224,273 B2
(45) Date of Patent: Feb. 11, 2025

(54) IMAGE DISPLAY DEVICE MANUFACTURING METHOD AND IMAGE DISPLAY DEVICE

(71) Applicant: NICHIA CORPORATION, Anan (JP)

(72) Inventor: Hajime Akimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 385 days.

(21) Appl. No.: 17/735,432

(22) Filed: May 3, 2022

(65) Prior Publication Data
US 2022/0262782 A1 Aug. 18, 2022

Related U.S. Application Data

(63) Continuation of application No. PCT/JP2020/041208, filed on Nov. 4, 2020.

(30) Foreign Application Priority Data

Nov. 11, 2019 (JP) ................. 2019-204187

(51) Int. Cl.
*H01L 27/14* (2006.01)
*H01L 25/16* (2023.01)
*H01L 25/18* (2023.01)
*H01L 33/00* (2010.01)
(Continued)

(52) U.S. Cl.
CPC ............ *H01L 25/167* (2013.01); *H01L 25/18* (2013.01); *H01L 33/007* (2013.01);
(Continued)

(58) Field of Classification Search
CPC ..... H01L 25/167; H01L 25/18; H01L 33/007; H01L 33/0093; H01L 33/22; H01L 33/62;
(Continued)

(56) References Cited

U.S. PATENT DOCUMENTS

2008/0102545 A1   5/2008  Yamagata et al.
2008/0210945 A1*  9/2008  Miyairi ............ H01L 21/02532
                                                        438/479
(Continued)

FOREIGN PATENT DOCUMENTS

CN      108615740 A     10/2018
JP      2002-141492 A    5/2002
(Continued)

OTHER PUBLICATIONS

International Search Report with English translation and Written Opinion mailed Dec. 28, 2020 corresponding International Application No. PCT/JP2020/041208; 14 pages.

*Primary Examiner* — Tan N Tran
(74) *Attorney, Agent, or Firm* — Foley & Lardner LLP

(57) ABSTRACT

A method of manufacturing an image display device includes: providing a semiconductor growth substrate comprising a semiconductor layer; providing a circuit substrate comprising: a circuit element, a first wiring layer, and a first insulating film; forming a first metal layer that is located on the first insulating film and is electrically connected to the first wiring layer; bonding the semiconductor growth substrate to the circuit substrate and electrically connecting the first metal layer to the semiconductor layer; etching the semiconductor layer to form a light-emitting element; etching the first metal layer to form a plug electrically connected to the light-emitting element; forming a second insulating film covering the plug, the light-emitting element, and the first insulating film; removing a portion of the second insulating film to expose a light-emitting surface of the light-emitting element; and forming a second wiring layer electrically connected to the light-emitting surface.

12 Claims, 38 Drawing Sheets

(51) Int. Cl.
  *H01L 33/22* (2010.01)
  *H01L 33/62* (2010.01)
  *H01L 23/00* (2006.01)
  *H01L 33/32* (2010.01)
  *H01L 33/60* (2010.01)

(52) U.S. Cl.
  CPC .......... *H01L 33/0093* (2020.05); *H01L 33/22* (2013.01); *H01L 33/62* (2013.01); *H01L 24/08* (2013.01); *H01L 24/24* (2013.01); *H01L 24/82* (2013.01); *H01L 33/0008* (2013.01); *H01L 33/32* (2013.01); *H01L 33/60* (2013.01); *H01L 2224/08145* (2013.01); *H01L 2224/24051* (2013.01); *H01L 2224/24137* (2013.01); *H01L 2224/24146* (2013.01); *H01L 2224/245* (2013.01); *H01L 2224/82365* (2013.01); *H01L 2924/0549* (2013.01)

(58) Field of Classification Search
  CPC ......... H01L 24/08; H01L 24/24; H01L 24/82; H01L 33/0008; H01L 33/32; H01L 33/60; H01L 2224/08145; H01L 2224/24051; H01L 2224/24137; H01L 2224/24146; H01L 2224/245; H01L 2224/82365; H01L 2924/0549; H01L 33/50; H01L 27/156; G09F 9/00; G09F 9/30; G09F 9/33
  USPC .................................................... 257/59, 72
  See application file for complete search history.

(56) References Cited

U.S. PATENT DOCUMENTS

| | | |
|---|---|---|
| 2009/0315965 A1 | 12/2009 | Yamagata et al. |
| 2010/0026779 A1 | 2/2010 | Yonehara et al. |
| 2013/0127364 A1 | 5/2013 | Mohammed et al. |
| 2014/0367633 A1 | 12/2014 | Bibl et al. |
| 2014/0367705 A1 | 12/2014 | Bibl et al. |
| 2019/0131343 A1* | 5/2019 | Templier ............. H01L 25/0756 |
| 2019/0157512 A1 | 5/2019 | Jung et al. |
| 2019/0229235 A1 | 7/2019 | Iguchi |
| 2019/0244942 A1 | 8/2019 | Yamaguchi et al. |
| 2019/0267357 A1 | 8/2019 | Iguchi et al. |
| 2019/0273179 A1 | 9/2019 | Iguchi et al. |
| 2019/0302917 A1 | 10/2019 | Pan |
| 2019/0319020 A1 | 10/2019 | Pan |
| 2019/0355766 A1* | 11/2019 | Zhang ................. H01L 27/1262 |
| 2019/0385513 A1 | 12/2019 | Iguchi et al. |
| 2020/0098952 A1 | 3/2020 | Kajiyama et al. |

FOREIGN PATENT DOCUMENTS

| | | |
|---|---|---|
| JP | 2007-242645 A | 9/2007 |
| JP | 2008-135419 A | 6/2008 |
| JP | 2010-219310 A | 9/2010 |
| JP | 2016-522585 A | 7/2016 |
| JP | 2016-523450 A | 8/2016 |
| JP | 2017-045855 A | 3/2017 |
| JP | 2018-205456 A | 12/2018 |
| JP | 2019-512742 A | 5/2019 |
| JP | 2019-129226 A | 8/2019 |
| JP | 2019-522894 A | 8/2019 |
| JP | 2019-152851 A | 9/2019 |
| JP | 2019-153783 A | 9/2019 |
| TW | I387129 B | 2/2013 |
| TW | I542033 B | 7/2016 |
| TW | 201917714 A | 5/2019 |
| WO | WO-2018/074611 A1 | 4/2018 |
| WO | WO-2018/116814 A1 | 6/2018 |
| WO | WO-2019/049360 A1 | 3/2019 |

* cited by examiner

IMAGE DISPLAY DEVICE MANUFACTURING METHOD AND IMAGE DISPLAY DEVICE

CROSS-REFERENCE TO RELATED APPLICATIONS

The present application is a bypass continuation of PCT Application No. PCT/JP2020/041208, filed Nov. 4, 2020, which claims priority to Japanese Application No. 2019-204187, filed Nov. 11, 2019. The contents of these applications are hereby incorporated by reference in their entireties.

BACKGROUND

The present disclosure relates to an image display device manufacturing method and an image display device.

Realization of a thin image display device having high brightness, a wide viewing angle, high contrast, and low power consumption has been desired. To accommodate such market demands, advancements have been made in the development of a display device that utilizes a self-light-emitting element.

The emergence of a display device that uses, as a self-light-emitting element, a micro light-emitting diode (LED), which is a fine light-emitting element, is expected. As a manufacturing method of a display device that uses a micro LED, a method of sequentially transferring individually formed micro LEDs to a drive circuit has been introduced. Nevertheless, as the number of micro LED elements increases as image quality advances, such as full high definition, 4K, and 8K, in the individual formation and the sequential transfer of a large number of micro LEDs to a substrate on which a drive circuit and the like are formed, a significant amount of time is required for the transfer process. Furthermore, connection failure or the like between a micro LED and the drive circuit or the like may occur, resulting in a decrease in yield.

There is known a technique of growing a semiconductor layer including a light-emitting layer on a Si substrate, forming an electrode on the semiconductor layer, and then bonding the semiconductor layer to a circuit substrate on which a drive circuit is formed (see, for example, Japanese Publication No. 2002-141492A).

SUMMARY

According to certain embodiments of the present invention, an image display device manufacturing method is provided that reduces the amount of time required for a transfer process of a light-emitting element and improves yield.

An image display device manufacturing method according to an embodiment of the present invention includes preparing a second substrate provided with a semiconductor layer including a light-emitting layer, the semiconductor layer being grown on a first substrate, preparing a third substrate including a circuit element formed on a light-transmitting substrate, a first wiring layer formed on the circuit element, and a first insulating film covering the circuit element and the first wiring layer, forming a first metal layer formed on the first insulating film and connected to the first wiring layer, bonding the second substrate to the third substrate and electrically connecting the first metal layer to the semiconductor layer, etching the semiconductor layer to form a light-emitting element, etching the first metal layer to form a plug electrically connected to the light-emitting element, forming a second insulating film covering the plug, the light-emitting element, and the first insulating film, removing a portion of the second insulating film to expose a light-emitting surface at a side opposite to a surface of the light-emitting element on a side of the first insulating film, and forming a second wiring layer electrically connected to the light-emitting surface.

An image display device manufacturing method according to another embodiment of the present invention includes preparing a second substrate provided with a semiconductor layer including a light-emitting layer, the semiconductor layer being grown on a first substrate, preparing a third substrate including a circuit element formed on a light-transmitting substrate, a first wiring layer formed on the circuit element, and a first insulating film covering the circuit element and the first wiring layer, forming a plug formed on the first insulating film and connected to the first wiring layer, bonding the second substrate to the third substrate and electrically connecting the plug to the semiconductor layer, etching the semiconductor layer to form a light-emitting element, forming a second insulating film covering the plug, the light-emitting element, and the first insulating film, removing a portion of the second insulating film to expose a light-emitting surface at a side opposite to a surface of the light-emitting element on a side of the first insulating film, and forming a second wiring layer electrically connected to the light-emitting surface.

An image display device according to another embodiment of the present invention includes a light-transmitting substrate including a first surface, a circuit element provided on the first surface, a first wiring layer provided on the circuit element and electrically connected to the circuit element, a first insulating film covering the circuit element and the first wiring layer on the first surface, a first plug provided on the first insulating film and connected to the first wiring layer, a first light-emitting element provided on the first plug, electrically connected to the first plug, and including a light-emitting surface on a surface at a side opposite to a surface on a side of the first insulating film, a second insulating film covering at least a portion of the first light-emitting element, the first insulating film, and the first plug, and a second wiring layer provided on the second insulating film and electrically connected to the light-emitting surface of the first light-emitting element.

An image display device according to another embodiment of the present invention includes a substrate including a first surface and having flexibility, a circuit element provided on the first surface, a first wiring layer provided on the circuit element and electrically connected to the circuit element, a first insulating film covering the circuit element and the first wiring layer on the first surface, a first plug provided on the first insulating film and connected to the first wiring layer, a first light-emitting element provided on the first plug, electrically connected to the first plug, and including a light-emitting surface on a surface at a side opposite to a surface on a side of the first insulating film, a second insulating film covering at least a portion of the first light-emitting element, the first insulating film, and the first plug, and a second wiring layer provided on the second insulating film and electrically connected to the light-emitting surface of the first light-emitting element.

An image display device according to another embodiment of the present invention includes a light-transmitting substrate including a first surface, a plurality of transistors provided on the first surface, a first wiring layer provided on the plurality of transistors and electrically connected to the plurality of transistors, a first insulating film covering the plurality of transistors and the first wiring layer on the first surface, a plug provided on the first insulating film and connected to the first wiring layer, a first semiconductor layer of a first conductivity type provided on the plug and electrically connected to the plug, a light-emitting layer provided on the first semiconductor layer, a second semiconductor layer of a second conductivity type, different from the first conductivity type, provided on the light-emitting layer, a second insulating film covering the plug, the first insulating film, the light-emitting layer, and the first semiconductor layer, and covering at least a portion of the second semiconductor layer, and a second wiring layer connected to a light-transmitting electrode arranged on a plurality of exposed surfaces of the second semiconductor layer, each exposed from the second insulating film in accordance with the plurality of transistors.

According to certain embodiments of the present invention, an image display device manufacturing method that reduces the amount of time required for a transfer process of a light-emitting element and improves yield is realized.

DETAILED DESCRIPTION

Embodiments of the present invention will be described below with reference to the drawings.

Note that the drawings are schematic or conceptual, and the relationships between thicknesses and widths of portions, the proportions of sizes between portions, and the like are not necessarily the same as the actual values thereof. Further, the dimensions and the proportions may be illustrated differently between the drawings, even in a case in which the same portion is illustrated.

Note that, in the specification and the drawings, elements similar to those described in relation to a drawing thereinabove are denoted using like reference signs, and a detailed description is omitted as appropriate.

First Embodiment

Figure 1:
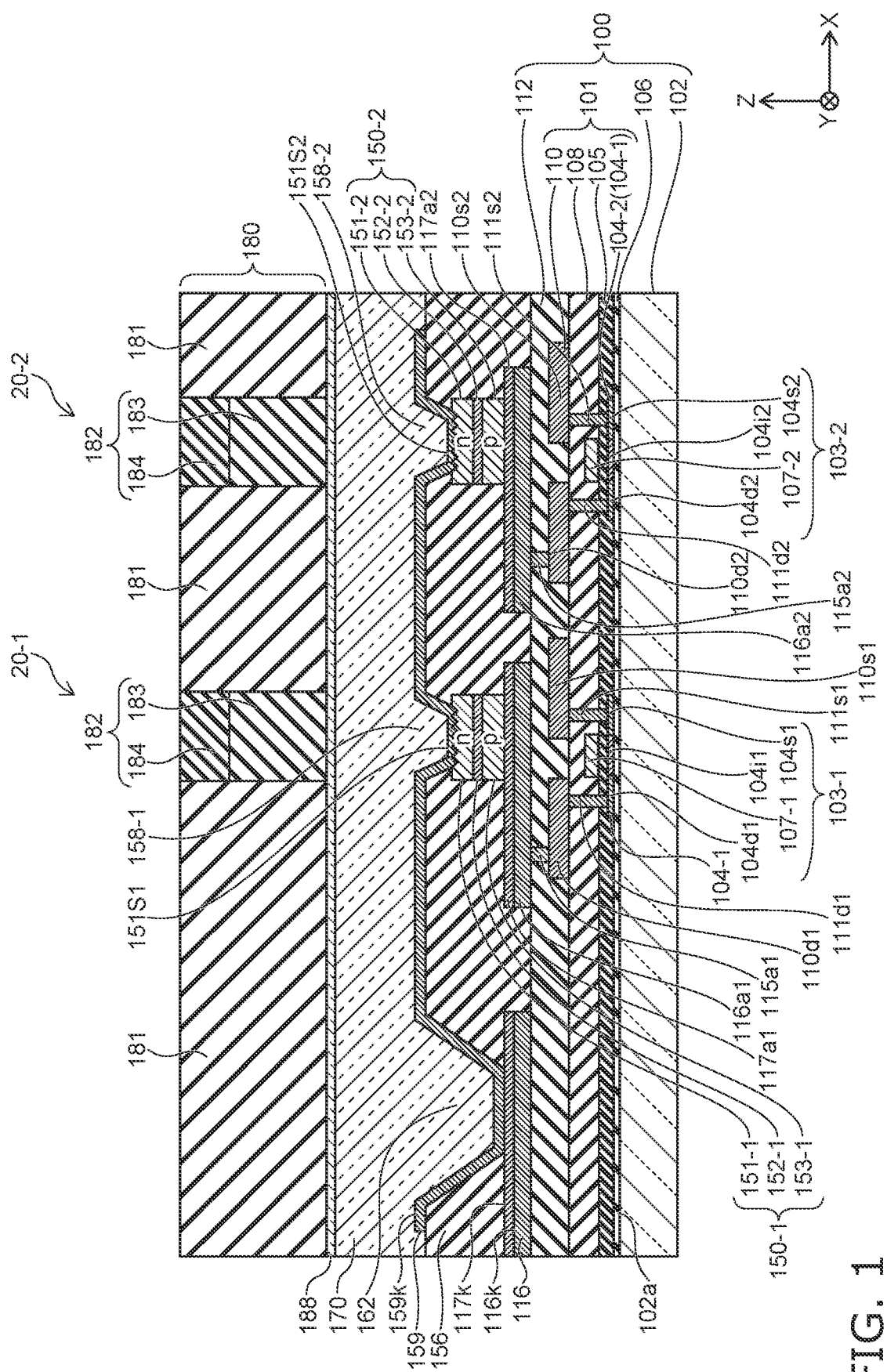
FIG. 1 is a schematic cross-sectional view illustrating a portion of an image display device according to a first embodiment.

FIG. 1 is a schematic cross-sectional view illustrating a portion of an image display device according to an embodiment.

A pixel constituting an image displayed on the image display device is constituted by a plurality of sub-pixels. FIG. 1 schematically illustrates a configuration of sub-pixels 20-1, 20-2 of the image display device of the present embodiment.

In the following, description is sometimes made using a three-dimensional coordinate system of XYZ. The sub-pixels 20-1, 20-2 are arrayed on a two-dimensional plane along with other sub-pixels. The two-dimensional plane in which the sub-pixels 20-1, 20-2 are arrayed is defined as an XY plane. A plurality of sub-pixels including the sub-pixels 20-1, 20-2 are arrayed in an X-axis direction and a Y-axis direction.

FIG. 1 schematically illustrates a cross section when the sub-pixels 20-1, 20-2 are cut at a plane parallel to the XZ plane.

The sub-pixel 20-1 includes a light-emitting surface 151S1 substantially parallel to the XY plane. The sub-pixel 20-2 includes a light-emitting surface 151S2 substantially parallel to the XY plane. These light-emitting surfaces 151S1, 151S2 emit light mainly in a positive direction of a Z axis orthogonal to the XY plane.

As illustrated in FIG. 1, the sub-pixel 20-1 of the image display device of the present embodiment includes a transistor 103-1, a light-emitting element 150-1, and a plug 116*a*1. The sub-pixel 20-2 includes a transistor 103-2, a light-emitting element 150-2, and a plug 116a2. The sub-pixels 20-1, 20-2 include a substrate 102, a first wiring layer 110, a first interlayer insulating film 112, a second interlayer insulating film 156, and a second wiring layer 159. In the plurality of sub-pixels including the sub-pixels 20-1, 20-2, the substrate 102, the first wiring layer 110, the second wiring layer 159, the first interlayer insulating film 112, and the second interlayer insulating film 156 are shared.

In the present embodiment, the substrate 102 on which circuit elements including the transistors 103-1, 103-2 are formed is a light-transmitting substrate, and is, for example, a glass substrate. The substrate 102 includes a first surface 102a, and the transistors 103-1, 103-2 are formed on the first surface 102a. The transistors 103-1, 103-2 are, for example, thin film transistors (TFTs). The light-emitting elements 150-1, 150-2 are driven by such TFTs formed on the glass substrate. The process of forming circuit elements including the TFT on a large glass substrate is established for the manufacture of a liquid crystal panel, an organic electroluminescent (EL) panel, and the like, resulting in the advantage that an existing plant can be utilized.

The sub-pixels 20-1, 20-2 further include a color filter 180. The color filter 180 is shared by the plurality of sub-pixels including the sub-pixels 20-1, 20-2. The color filter (wavelength conversion member) 180 is provided on a surface resin layer 170 with a transparent thin film adhesive layer 188 interposed therebetween. The surface resin layer 170 is provided on the second interlayer insulating film 156 and the second wiring layer 159.

A configuration of the sub-pixels 20-1, 20-2 of the image display device of the present embodiment will now be described in detail.

The transistors 103-1, 103-2 are formed on a TFT lower layer film 106 formed on the first surface 102a of the substrate 102. The TFT lower layer film 106 is provided to ensure flatness when the transistors 103-1, 103-2 are formed, and to protect TFT channels 104-1, 104-2 of the transistors 103-1, 103-2, respectively, from contamination and the like during heat treatment. The TFT lower layer film 106 is an insulating film such as $SiO_2$, for example.

In addition to the transistors 103-1, 103-2 for driving the light-emitting elements 150-1, 150-2, other circuit elements such as a transistor and a capacitor are formed on the substrate 102, and these circuit elements are connected by wiring portions and the like, forming a circuit 101. For example, the transistors 103-1, 103-2 correspond to a drive transistor 26 illustrated in FIG. 2 described below.

Hereinafter, the circuit 101 is a circuit that includes the TFT channels 104-1, 104-2, an insulating layer 105, an insulating film 108, vias 111s1, 111s2, 111d1, 111d2, and the first wiring layer 110. The structure including the substrate 102, the TFT lower layer film 106, the circuit 101, and the first interlayer insulating film 112 may be referred to as a circuit substrate 100.

The transistors 103-1, 103-2 are p-channel TFTs in this example. The transistor 103-1 includes the TFT channel 104-1 and a gate 107-1. The transistor 103-2 includes the TFT channel 104-2 and a gate 107-2. The transistors 103-1, 103-2 are preferably formed by a low temperature polysilicon (LTPS) process. The TFT channels 104-1, 104-2 are regions of polycrystalline Si formed on the substrate 102. The TFT channels 104-1, 104-2 are polycrystallized and activated by annealing regions formed as amorphous Si by laser irradiation. The TFTs are formed in an LTPS process to achieve a sufficiently high mobility.

The TFT channel 104-1 includes regions 104s1, 104i1, 104d1. The TFT channel 104-2 includes regions 104s2, 104i2, 104d2. The regions 104s1, 104i1, 104d1 and the regions 104s2, 104i2, 104d2 are all provided on the TFT lower layer film 106. The region 104i1 is provided between the regions 104s1, 104d1. The region 104i2 is provided between the regions 104s2, 104d2. The regions 104s1, 104d1 and the regions 104s2, 104d2 are doped with a p-type impurity such as boron ions ($B^+$) or boron fluoride ions ($BF_2^+$). The regions 104s1, 104d1 are respectively ohmic connected to the vias 111s1, 111d1. The regions 104s2, 104d2 are respectively ohmic connected to the vias 111s2, 111d2.

The gate 107-1 is provided on the TFT channel 104-1 with the insulating layer 105 interposed therebetween. The gate 107-2 is provided on the TFT channel 104-2 with the insulating layer 105 interposed therebetween. The insulating layer 105 insulates the TFT channel 104-1 and the gate 107-1, and insulates the TFT channel 104-2 and the gate 107-2. The insulating layer 105 is also provided for insulating the area between adjacent circuit elements.

In the transistor 103-1, when a voltage lower than that of region 104s1 is applied to the gate 107-1, a channel may be formed in the region 104i1. A current flowing between the region 104s1 and the region 104d1 is controlled by the voltage across the region 104s1 of the gate 107-1. Similarly, in the transistor 103-2, when a voltage lower than that of region 104s2 is applied to the gate 107-2, a channel may be formed in the region 104i2. Therefore, a current flowing between the region 104s2 and the region 104d2 is controlled by the voltage across the region 104s2 of the gate 107-2.

The insulating layer 105 is, for example, $SiO_2$. The insulating layer 105 may be a multi-layer insulating layer including $SiO_2$, $Si_3N_4$, or the like in accordance with the covered region.

The gates 107-1, 107-2 are, for example, polycrystalline Si. The polycrystalline Si film of the gates 107-1, 107-2 can be generally created by a chemical vapor deposition (CVD) process.

In this example, the gates 107-1, 107-2 and the insulating layer 105 are covered by the insulating film 108. The insulating film 108 is, for example, $SiO_2$ or $Si_3N_4$. The insulating film 108 functions as a flattening film for forming the first wiring layer 110. The insulating film 108 is a multi-layer insulating film containing $SiO_2$ or $Si_3N_4$, for example.

The vias 111s1, 111d1 are provided through the insulating film 108. The vias 111s2, 111d2 are provided through the insulating film 108. The first wiring layer (first wiring layer) 110 is formed on the insulating film 108. The first wiring layer 110 includes a plurality of wiring portions that can differ in potential, and includes wiring portions 110s1, 110d1 and wiring portions 110s2, 110d2. In the wiring layer in the cross-sectional views of FIG. 1 and subsequent drawings, the reference sign of the wiring layer is displayed at a position lateral to one wiring portion included in the denoted wiring layer.

The via 111s1 is provided between the wiring portion 110s1 and the region 104s1. The via 111s1 electrically connects the wiring portion 110s1 and the region 104s1. The via 111d1 is provided between the wiring portion 110d1 and the region 104d1. The via 111d1 electrically connects the wiring portion 110d1 and the region 104d1. The via 111s2 is provided between the wiring portion 110s2 and the region 104s2. The via 111s2 electrically connects the wiring portion 110s2 and the region 104s2. The via 111d2 is provided between the wiring portion 110d2 and the region 104d2. The via 111d2 electrically connects the wiring portion 110d2 and the region 104d2.

The wiring portions 110s1, 110s2 are electrically connected to a power source line 3 illustrated in FIG. 2 described below. Accordingly, the region 104s1 is electrically connected to the power source line 3 via the wiring portion 110s1, and the region 104s2 is electrically connected to the power source line 3 via the wiring portion 110s2. The wiring portion (first wiring portion) 110d1 is electrically connected to a p-type semiconductor layer 153-1 of the light-emitting element 150-1 via a connecting portion 115a1, the plug 116a1, and a conductive thin film 117a1. The wiring portion (second wiring portion) 110d2 is electrically connected to a p-type semiconductor layer 153-2 of the light-emitting element 150-2 via a connecting portion 115a2, the plug 116a2, and a conductive thin film 117a2.

The first wiring layer 110, the vias 111s1, 111d1, and the vias 111s2, 111d2 are formed of Al, an Al alloy, or a layered film of Al and Ti or the like, for example. In a layered film of Al and Ti, for example, Al is layered on a thin film of Ti, and Ti is further layered on Al.

The first interlayer insulating film 112 is provided on the insulating film 108 and the first wiring layer 110, and is provided on a lateral surface of the connecting portions 115a1, 115a2. The first interlayer insulating film (first insulating film) 112 is an organic insulating film such as phosphorus silicon glass (PSG) or boron phosphorus silicon glass (BPSG), for example. The first interlayer insulating film 112 is provided to achieve uniform bonding in wafer bonding. The first interlayer insulating film 112 also functions as a protective film that protects a front surface of the circuit substrate 100.

The wiring layer (third wiring layer) 116 is provided on the first interlayer insulating film 112. The wiring layer 116 includes the plugs 116a1, 116a2 and a wiring portion 116k. In this example, the conductive thin film 117a1 is provided over the plug 116a1. The conductive thin film 117a2 is provided over the plug 116a2. A conductive thin film 117k is provided over the wiring portion 116k.

The plug (first plug) 116a1 is connected to the wiring portion 110d1 via the connecting portion 115a1. The plug (second plug) 116a2 is connected to the wiring portion 110d2 via the connecting portion 115a2. The wiring portion (third wiring portion) 116k is connected to a ground line 4 in FIG. 2 described below, for example.

The wiring layer 116 is formed of a metal material similar to that of the first wiring layer 110, the via 111s1, and the like, for example. The conductive thin films 117a1, 117a2, 117k are preferably conductive films having hole injection properties such as an indium tin oxide (ITO) film.

The light-emitting element 150-1 is provided on the conductive thin film 117a1. The light-emitting element 150-2 is provided on the conductive thin film 117a2.

The light-emitting element 150-1 includes the p-type semiconductor layer (first semiconductor layer) 153-1, a light-emitting layer 152-1, and an n-type semiconductor layer (second semiconductor layer) 151-1. The p-type semiconductor layer 153-1, the light-emitting layer 152-1, and the n-type semiconductor layer 151-1 are layered in this order from the side of the conductive thin film 117a1 toward the side of the light-emitting surface 151S1.

The light-emitting element 150-2 includes the p-type semiconductor layer 153-2, a light-emitting layer 152-2, and an n-type semiconductor layer 151-2. The p-type semiconductor layer 153-2, the light-emitting layer 152-2, and the n-type semiconductor layer 151-2 are layered in this order from the side of the conductive thin film 117a2 toward the side of the light-emitting surface 151S2.

The light-emitting element 150-1 is provided on the conductive thin film 117a1, and thus the conductive thin film 117a1 is electrically connected to the p-type semiconductor layer 153-1. The light-emitting element 150-2 is provided on the conductive thin film 117a2, and thus the conductive thin film 117a2 is electrically connected to the p-type semiconductor layer 153-2. In the case of the conductive thin films 117a1, 117a2 being conductive films having hole injection properties, the light-emitting elements 150-1, 150-2 can be driven at a lower voltage.

The light-emitting elements 150-1, 150-2 have substantially square or rectangular shapes in an XY plane view, for example, but a corner portion may be rounded. The light-emitting elements 150-1, 150-2 may have, for example, an elliptical shape or a circular shape in an XY plane view. With appropriate selection of the shape, the arrangement, and the like of the light-emitting element in plan view, a degree of freedom of the layout is improved.

As the light-emitting elements 150-1, 150-2, a gallium nitride compound semiconductor including a light-emitting layer such as $In_XAl_YGa_{1-X-Y}N$ (where $0 \leq X$, $0 \leq Y$, $X+Y<1$), for example, is preferably used. Hereinafter, the gallium nitride compound semiconductor described above may be simply referred to as gallium nitride (GaN). The light-emitting elements 150-1, 150-2 in one embodiment of the present invention are so-called light-emitting diodes, and a wavelength of light emitted by the light-emitting elements 150-1, 150-2 is about 467 nm±20 nm, for example. The wavelength of light emitted by the light-emitting elements 150-1, 150-2 may be a blue violet emission of about 410 nm±20 nm. The wavelength of the light emitted by the light-emitting element 150 is not limited to the values described above and may be an appropriate value.

An area of the light-emitting element in an XY plane view is set in accordance with the light emission colors of red, green, and blue sub-pixels. The areas of the light-emitting elements 150-1, 150-2 in an XY plane view are set as appropriate according to visibility, a conversion efficiency of a color conversion unit 182 of the color filter 180, and the like. In this example, the areas of the two light-emitting elements 150-1, 150-2 in an XY plane view are the same. The light-emitting elements 150-1, 150-2 are respectively mounted on the conductive thin films 117a1, 117a2, each having a surface substantially parallel to the XY plane, and thus the areas of the light-emitting elements 150-1, 150-2 in an XY plane view are the areas of the regions surrounded by outer peripheries of the light-emitting elements 150-1, 150-2 projected onto the XY plane.

The outer periphery of the light-emitting element 150-1 is located within an outer periphery of the plug 116a1 when the light-emitting element 150-1 is projected onto the plug 116a1 in an XY plane view.

Similarly, the outer periphery of the light-emitting element 150-2 is located within an outer periphery of the plug 116a2 when the light-emitting element 150-2 is projected onto the plug 116a2 in an XY plane view.

Preferably, the plugs 116a1, 116a2 are formed of a metal material having light reflectivity, and the conductive thin films 117a1, 117a2 have light transmittance. Therefore, the plug 116a1 functions as a light-reflecting plate that reflects light scattering downward of the light-emitting element 150-1 toward the light-emitting surface 151S1 side. Further, the plug 116a2 functions as a light-reflecting plate that reflects light scattering downward of the light-emitting element 150-2 toward the light-emitting surface 151S2 side. By appropriately selecting the material of the plugs 116a1, 116a2, the scattering of light downward of the light-emitting elements 150-1, 150-2 can be reflected toward the light-emitting surface 151S1, 151S2 side, and thus improving a light emission efficiency.

The plug 116a1 reflects the scattering of light downward of the light-emitting element 150-1 toward the light-emitting surface 151S1 side, making it possible to ensure that the scattering light does not reach the transistor 103-1. Similarly, the plug 116a2 reflects the scattering of light downward of the light-emitting element 150-2 toward the light-emitting surface 151S2 side, making it possible to ensure that the scattering light does not reach the transistor 103-2. The plugs 116a1, 116a2 block light scattering downward of the light-emitting elements 150-1, 150-2, thereby inhibiting the light from reaching the transistors 103-1, 103-2 and making it possible to prevent malfunction of the transistors 103-1, 103-2.

The second interlayer insulating film 156 covers the first interlayer insulating film 112, the plugs 116a1, 116a2, the wiring portion 116k, the conductive thin films 117a1, 117a2, 117k, and the light-emitting elements 150-1, 150-2. The second interlayer insulating film 156, by covering the light-emitting elements 150-1, 150-2, the plugs 116a1, 116a2, the wiring portion 116k, and the like, protects these from a surrounding environment, such as dust and humidity, and the like. The second interlayer insulating film 156, by covering the light-emitting elements 150-1, 150-2, the plugs 116a1, 116a2, the wiring portion 116k, and the like, insulates these from other conductors. A front surface of the second interlayer insulating film 156 need only be flat enough to allow formation of the second wiring layer 159 on the second interlayer insulating film 156.

The organic insulating material used for the second interlayer insulating film 156 is preferably a white resin. The second interlayer insulating film 156 that is a white resin can reflect the laterally emitted light of the light-emitting elements 150-1, 150-2 and the return light caused by the interface of the color filter 180 and the like, and substantially improve the light emission efficiency of the light-emitting elements 150-1, 150-2.

The white resin is formed by dispersing scattering microparticles having a Mie scattering effect on a transparent resin such as a silicon-based resin such as spin-on glass (SOG) or a novolac phenolic resin. The microparticles are colorless or white, and have a diameter of about one-tenth to several times the wavelength of the light emitted by the light-emitting elements 150-1, 150-2. Microparticles having a diameter of about one-half the wavelength of the light are suitably used as the scattering microparticles. Examples of such scattering microparticles include $TiO_2$, $Al_2SO_3$, and ZnO. Alternatively, the white resin can also be formed by utilizing a number of fine pores or the like dispersed within a transparent resin. The second interlayer insulating film 156 may be whitened by using a $SiO_2$ film or the like formed by atomic layer deposition (ALD) or CVD, for example, instead of SOG or the like.

The second interlayer insulating film 156 may be a black resin. With the second interlayer insulating film 156 being a black resin, the scattering of light within the sub-pixels 20-1, 20-2 is suppressed, and stray light is more effectively suppressed. An image display device in which stray light is suppressed can display a sharper image.

An opening 158-1 is formed at a position corresponding to the light-emitting element 150-1 of the second interlayer insulating film 156. The light-emitting surface 151S1 is exposed from the second interlayer insulating film 156 through the opening 158-1. An opening 158-2 is formed at a position corresponding to the light-emitting element 150-2 of the second interlayer insulating film 156. The light-emitting surface 151S2 is exposed from the second interlayer insulating film 156 through the opening 158-2. The light-emitting surfaces 151S1, 151S2 exposed from the openings 158-1, 158-2 are roughened. In a case in which the light-emitting surfaces 151S1, 151S2 are roughened, the light emission efficiency of the light-emitting elements 150-1, 150-2 is improved.

An opening 162 is formed at a position corresponding to the wiring portion 116k of the second interlayer insulating film 156. The conductive thin film 117k formed over the wiring portion 116k is exposed from the second interlayer insulating film 156 through the opening 162.

The second wiring layer 159 is provided on the second interlayer insulating film 156. The second wiring layer 159 includes a light-transmitting electrode 159k. The light-transmitting electrode 159k is connected to the conductive thin film 117k via the opening 162. The light-transmitting electrode 159k is connected to the light-emitting surface 151S1 via the opening 158-1. The light-transmitting electrode 159k is connected to the light-emitting surface 151S2 via the opening 158-2. The light-transmitting electrode 159k is provided across the openings 162, 158-1, 158-2 and electrically connects the conductive thin film 117k and the n-type semiconductor layers 151-1, 151-2. The second wiring layer 159 is formed by a light-transmitting conductive film and is formed by an ITO film, for example.

The wiring portion 116k and the conductive thin film 117k are connected to the ground line 4 illustrated in FIG. 2 described below, for example. Accordingly, the n-type semiconductor layers 151-1, 151-2 of the light-emitting elements 150-1, 150-2 are electrically connected to the ground line 4 via the light-transmitting electrode 159k, the conductive thin film 117k, and the wiring portion 116k.

The p-type semiconductor layer 153-1 of the light-emitting element 150-1 is electrically connected to the region 104d1 via the conductive thin film 117a1, the plug 116a1, the connecting portion 115a1, the wiring portion 110d1, and the via 111d1. The region 104d1 corresponds to a drain electrode of transistor 103-1. The region 104s1 is electrically connected to the power source line 3 illustrated in FIG. 2 by the via 111s1 and wiring portion 110s1. The region 104s1 corresponds to a source electrode of the transistor 103-1.

The p-type semiconductor layer 153-2 of the light-emitting element 150-2 is electrically connected to the region 104d2 via the conductive thin film 117a2, the plug 116a2, the connecting portion 115a2, the wiring portion 110d2, and the via 111d2. The region 104d2 corresponds to a drain electrode of transistor 103-2. The region 104s2 is electrically connected to the power source line 3 illustrated in FIG. 2 by the via 111s2 and wiring portion 110s2. The region 104s2 corresponds to a source electrode of transistor 103-2.

The surface resin layer 170 covers the second interlayer insulating film 156 and the second wiring layer 159. The surface resin layer 170 is a transparent resin and provides a flat surface for protecting the second interlayer insulating film 156 and the second wiring layer 159, and for adhering the color filter 180.

The color filter 180 includes a light-blocking portion 181 and the color conversion unit 182. The color conversion unit 182 is provided directly above the light-emitting surfaces 151S1, 151S2 of the light-emitting element 150 in accordance with the shapes of the light-emitting surfaces 151S1, 151S2. In the color filter 180, a portion other than the color conversion unit 182 is the light-blocking portion 181. The light-blocking portion 181 is a so-called black matrix, and can reduce bleeding caused by the color mixing of light emitted from the adjacent color conversion unit 182 and the like, and thus display a sharp image.

The color conversion unit 182 is one layer or two or more layers. In FIG. 1, a case in which the color conversion unit 182 is two layers is illustrated. Whether the color conversion unit 182 is one layer or two layers is determined by the color, that is, the wavelength, of the light emitted by the sub-pixel 20. In a case in which the light emission color of the sub-pixel 20 is red or green, the color conversion unit 182 is preferably the two layers of a color conversion layer 183 and a filter layer 184 through which red light or green light passes, which are described below. In a case in which the light emission color of the sub-pixel 20 is blue, one layer is preferred.

In a case in which the color conversion unit 182 is two layers, a first layer closer to the light-emitting element 150 is the color conversion layer 183, and a second layer is the filter layer 184. That is, the filter layer 184 is layered on the color conversion layer 183.

The color conversion layer 183 is a layer that converts the wavelength of the light emitted by the light-emitting element 150 to a desired wavelength. In a case in which the sub-pixel 20 emits red light, the color conversion layer 183 converts light of 467 nm±20 nm, which is the wavelength of the light-emitting element 150, to light having a wavelength of about 630 nm±20 nm, for example. In a case in which the sub-pixel 20 emits green light, the color conversion layer 183 converts light of 467 nm±20 nm, which is the wavelength of the light-emitting element 150, to light having a wavelength of about 532 nm±20 nm, for example.

The filter layer 184 blocks the wavelength component of the remaining blue light emission without color conversion by the color conversion layer 183.

In a case in which the color of the light emitted by the sub-pixel 20 is blue, the sub-pixel 20 may output the light via the color conversion layer 183 or may output the light as is and not via the color conversion layer 183. In a case in which the wavelength of the light emitted by the light-emitting element 150 is about 467 nm±20 nm, the sub-pixel 20 may output the light not via the color conversion layer 183. In a case in which the wavelength of the light emitted by the light-emitting element 150 is set to 410 nm±20 nm, it is preferable to provide the one layer of the color conversion layer 183 in order to convert the wavelength of the light to be output to about 467 nm±20 nm.

Even in the case of the sub-pixel 20 having a blue color, the sub-pixel 20 may include the filter layer 184. With the filter layer 184 through which blue light is transmitted provided to the blue sub-pixel 20, minute reflection of external light other than the blue light generated at a front surface of the light-emitting element 150 is suppressed.

Figure 2:
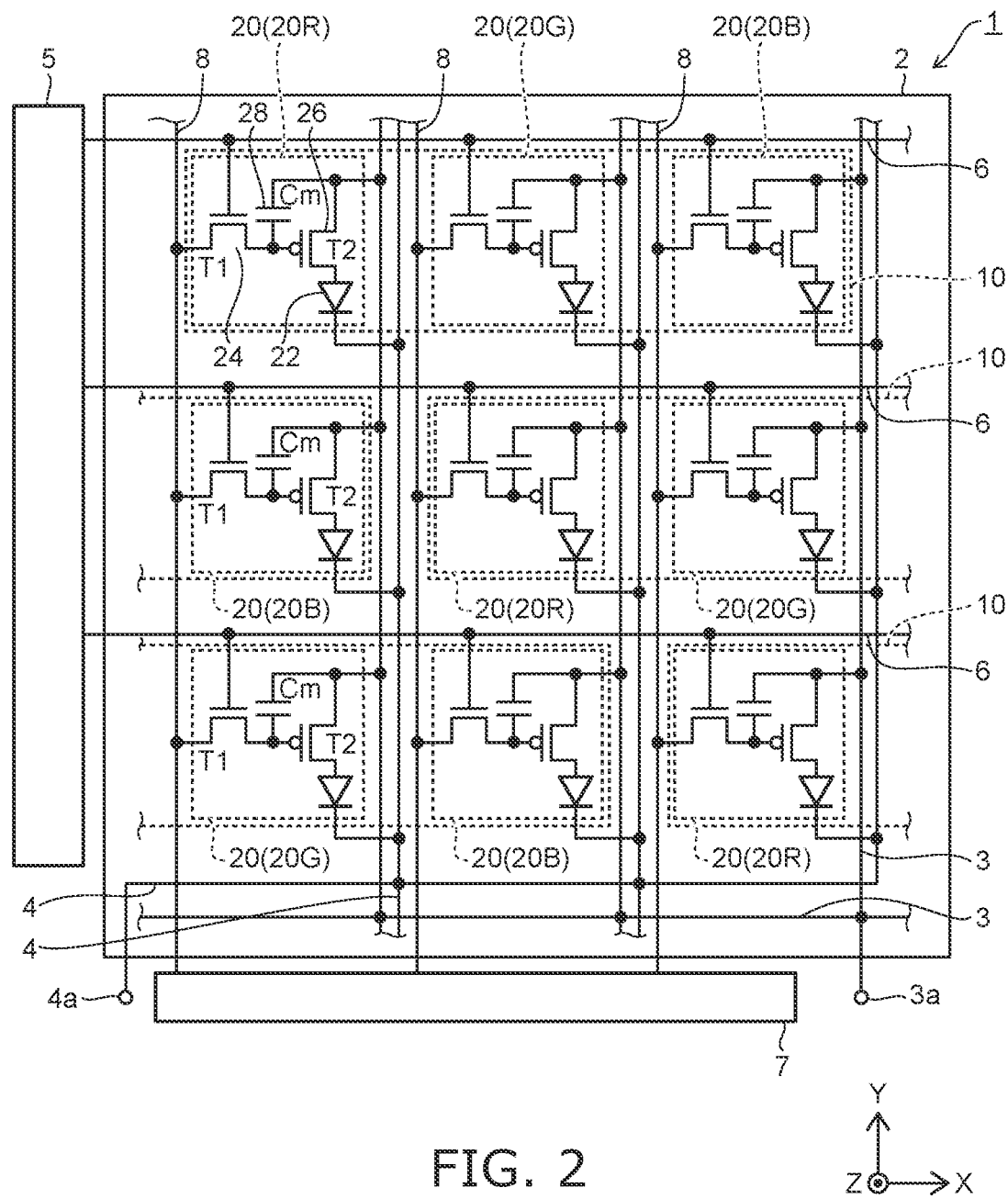
FIG. 2 is a schematic block diagram illustrating the image display device according to the first embodiment.

FIG. 2 is a schematic block diagram illustrating an image display device according to the present embodiment.

As illustrated in FIG. 2, an image display device 1 according to the present embodiment includes a display region 2. The sub-pixels 20 are arrayed in the display region 2. The sub-pixels 20 are arrayed, for example, in a lattice pattern. For example, n sub-pixels 20 are arrayed along the X axis, and m sub-pixels 20 are arrayed along the Y axis.

A pixel 10 includes a plurality of the sub-pixels 20 that emit different colors of light. A sub-pixel 20R emits red light. A sub-pixel 20G emits green light. A sub-pixel 20B emits blue light. The three types of sub-pixels 20R, 20G, 20B emit light at a desired brightness, and thus the light emission color and brightness of one pixel 10 are determined.

One pixel 10 includes the three sub-pixels 20R, 20G, 20B, and the sub-pixels 20R, 20G, 20B are arrayed in a linear shape on the X axis, for example, as in the example illustrated in FIG. 2. In each pixel 10, sub-pixels of the same color may be arrayed in the same column or, as in this example, sub-pixels of different colors may be arrayed on a per column basis.

The image display device 1 further includes the power source line 3 and the ground line 4. The power source line 3 and the ground line 4 are wired in a lattice pattern along the array of the sub-pixels 20. The power source line 3 and the ground line 4 are electrically connected to each sub-pixel 20, and power is supplied to each sub-pixel 20 from a direct current power source connected between a power source terminal 3a and a ground (GND) terminal 4a. The power source terminal 3a and the GND terminal 4a are respectively provided at end portions of the power source line 3 and the ground line 4, and are connected to a direct current power source circuit provided outside the display region 2. A positive voltage is supplied to the power source terminal 3a based on the GND terminal 4a.

The image display device 1 further includes a scanning line 6 and a signal line 8. The scanning line 6 is wired in a direction parallel to the X axis. That is, the scanning line 6 is wired along the array of the sub-pixels 20 in a row direction. The signal line 8 is wired in a direction parallel to the Y axis. That is, the signal line 8 is wired along the array of the sub-pixels 20 in a column direction.

The image display device 1 further includes a row selection circuit 5 and a signal voltage output circuit 7. The row selection circuit 5 and the signal voltage output circuit 7 are provided along an outer edge of the display region 2. The row selection circuit 5 is provided in the Y-axis direction of the outer edge of the display region 2. The row selection circuit 5 is electrically connected to the sub-pixel 20 of each column via the scanning line 6, and supplies a selection signal to each sub-pixel 20.

The signal voltage output circuit 7 is provided in the X-axis direction of the outer edge of the display region 2. The signal voltage output circuit 7 is electrically connected to the sub-pixel 20 of each row via the signal line 8, and supplies a signal voltage to each sub-pixel 20.

The sub-pixel 20 includes a light-emitting element 22, a selection transistor 24, the drive transistor 26, and a capacitor 28. In FIG. 2, the selection transistor 24 may be denoted as T1, the drive transistor 26 may be denoted as T2, and the capacitor 28 may be denoted as Cm.

The light-emitting element 22 is connected in series with the drive transistor 26. In the present embodiment, the drive transistor 26 is a p-channel TFT, and an anode electrode of the light-emitting element 22 connected to the p-type semiconductor layer is connected to a drain electrode that is a main electrode of the drive transistor 26. The series circuit of the light-emitting element 22 and the drive transistor 26 is connected between the power source line 3 and the ground line 4. The drive transistor 26 corresponds to the transistors 103-1, 103-2 in FIG. 1, and the light-emitting element 22 corresponds to the light-emitting elements 150-1, 150-2 in FIG. 1. The current flowing to the light-emitting element 22 is determined by the voltage applied across the gate-source of the drive transistor 26, and the light-emitting element 22 emits light at a brightness corresponding to the flowing current.

The selection transistor 24 is connected between a gate electrode of the drive transistor 26 and the signal line 8 via the main electrode. A gate electrode of the selection transistor 24 is connected to the scanning line 6. The capacitor 28 is connected between the gate electrode of the drive transistor 26 and the power source line 3.

The row selection circuit 5 selects one row from the array of m rows of the sub-pixels 20 to supply a selection signal to the scanning line 6. The signal voltage output circuit 7 supplies a signal voltage having the required analog voltage value to each sub-pixel 20 in the selected row. The signal voltage is applied across the gate-source of the drive transistor 26 of the sub-pixels 20 of the select row. The signal voltage is held by the capacitor 28. The drive transistor 26 introduces a current corresponding to the signal voltage to the light-emitting element 22. The light-emitting element 22 emits light at a brightness corresponding to the current flowing in the light-emitting element 22.

The row selection circuit 5 supplies the selection signal by sequentially switching the selected row. That is, the row selection circuit 5 scans the rows in which the sub-pixels 20 are arrayed. A current corresponding to the signal voltage flows in the light-emitting element 22 of the sub-pixels 20 sequentially scanned, and light is emitted. Each pixel 10 emits light of the light emission color and brightness determined by the light emission color and the brightness emitted by the sub-pixels 20 of each RGB color, and an image is displayed in the display region 2.

A manufacturing method of the image display device 1 according to the present embodiment will now be described.

FIGS. 3A to 8B are schematic cross-sectional views illustrating the manufacturing method of the image display device according to the present embodiment.

Figure 3A:
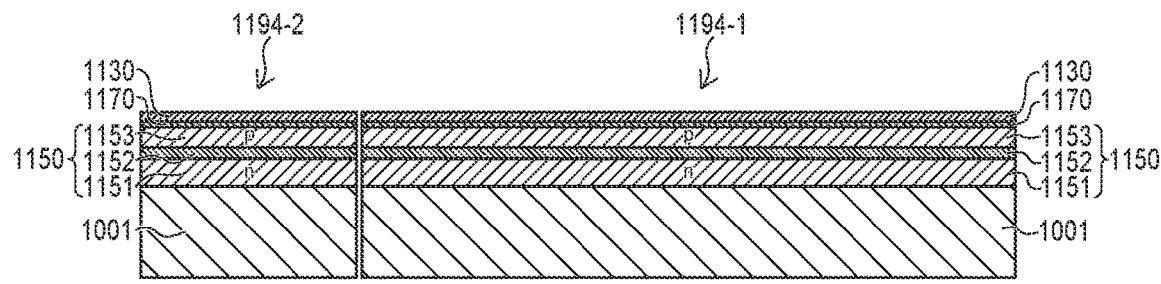
FIG. 3A is a schematic cross-sectional view illustrating a manufacturing method of the image display device according to the first embodiment.

As illustrated in FIG. 3A, in the manufacturing method of the image display device 1 of the present embodiment, at least one semiconductor growth substrate is prepared. In this example, a plurality of the semiconductor growth substrates (second substrates) 1194-1, 1194-2 are prepared. The semiconductor growth substrates 1194-1, 1194-2 each include a semiconductor layer 1150 formed on a crystal growth substrate (first substrate) 1001. The crystal growth substrate 1001 is a Si substrate or a sapphire substrate, for example. Preferably, a Si substrate is used.

The semiconductor layer 1150 includes an n-type semiconductor layer 1151, a light-emitting layer 1152, and a p-type semiconductor layer 1153. The n-type semiconductor layer 1151, the light-emitting layer 1152, and the p-type semiconductor layer 1153 are layered in the order of the n-type semiconductor layer 1151, the light-emitting layer 1152, and the p-type semiconductor layer 1153 from the crystal growth substrate 1001 side. For formation of the semiconductor layer 1150, a chemical vapor deposition (CVD) method, for example, is used, and metal-organic chemical vapor deposition (MOCVD) method is suitably used. The semiconductor layer 1150 is, for example, $In_X Al_{1-X-Y} Ga_{1-X-Y} N$ ($0 \leq X$, $0 \leq Y$, and $X+Y<1$).

In the early stage of crystal growth, crystal defects may occur due to inconsistency of crystal lattice constants, and a crystal with a crystal defect exhibits an n-shape. Therefore, as in this example, in a case in which layering is from the n-type semiconductor layer 1151 to the crystal growth substrate 1001, a margin in terms of the production process is increased, resulting in the advantage that yield is readily improved.

A metal layer (second metal layer) 1130 is formed on each of the semiconductor growth substrates 1194-1, 1194-2 on which the semiconductor layer 1150 is formed. The metal layer 1130 is formed on the p-type semiconductor layer 1153. A surface of the p-type semiconductor layer 1153 on which the metal layer 1130 is formed is a surface facing the surface on which the light-emitting layer 1152 is provided.

In a case in which the metal layer 1130 is formed on the surface of the p-type semiconductor layer 1153, the p-type semiconductor layer 1153 can be protected by the metal layer 1130, which has the advantage that the semiconductor growth substrate 1194 is readily retained.

Preferably, a conductive layer 1170 is formed on the p-type semiconductor layer 1153 before formation of the metal layer 1130. The conductive layer 1170 is formed between the metal layer 1130 and the p-type semiconductor layer 1153. The conductive layer 1170 is a layer of a conductive layer or conductive thin film having hole injection properties, such as an ITO film.

Figure 3B:
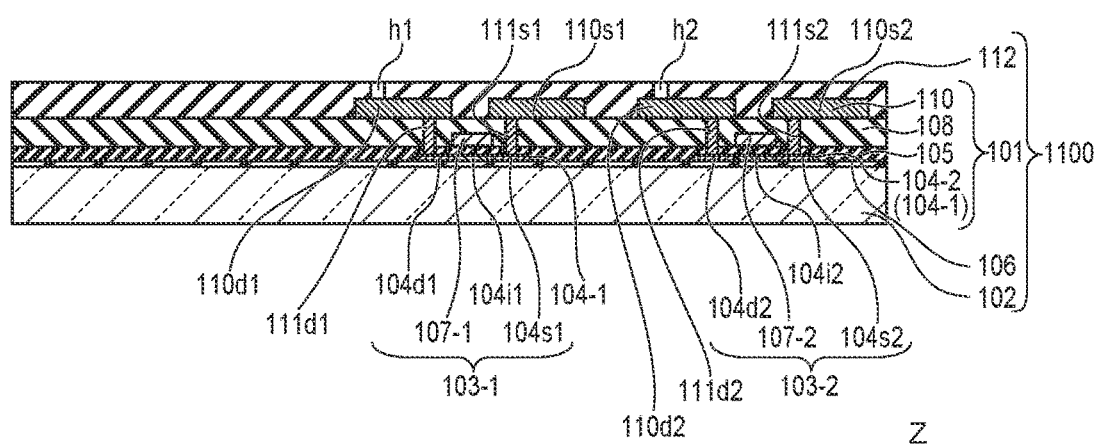
FIG. 3B is a schematic cross-sectional view illustrating the manufacturing method of the image display device according to the first embodiment.

As illustrated in FIG. 3B, a circuit substrate 1100 is prepared. The circuit substrate (third substrate) 1100 includes the circuit 101 described in FIG. 1 and the like. Contact holes h1, h2 are respectively formed at positions corresponding to the wiring portions 110d1, 110d2 on the first interlayer insulating film 112 of the circuit substrate 1100. The contact holes h1, h2 have depths that reach the wiring portions 110d1, 110d2. The contact holes h1, h2 may be formed deeper by overetching the wiring portions 110d1, 110d2.

Figure 4A:
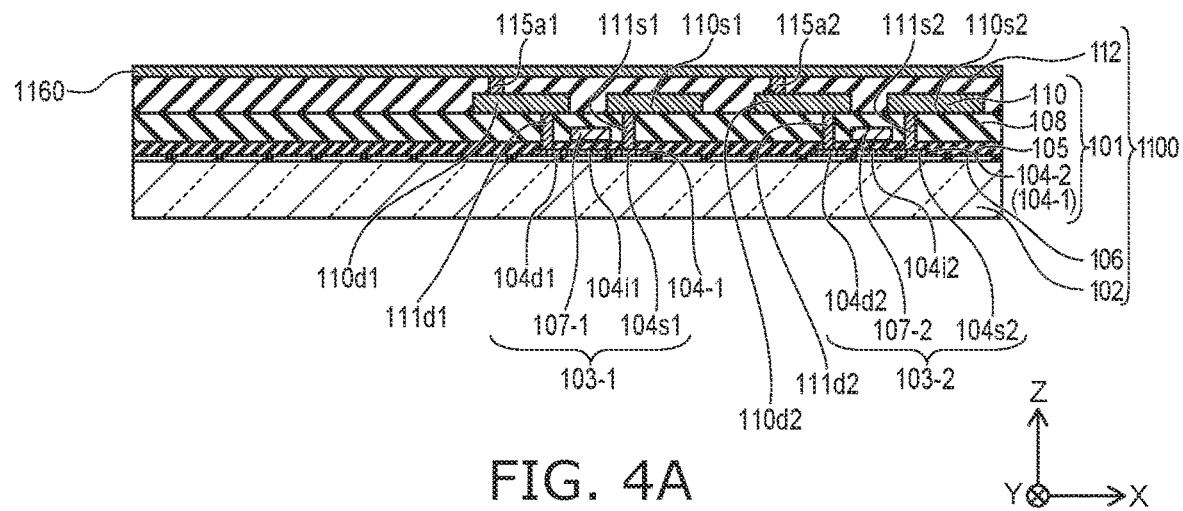
FIG. 4A is a schematic cross-sectional view illustrating the manufacturing method of the image display device according to the first embodiment.

As illustrated in FIG. 4A, a metal layer (first metal layer) 1160 is formed on the first interlayer insulating film 112. When the metal layer 1160 is formed, the material forming the metal layer 1160 is embedded in the contact holes h1, h2, and the connecting portions 115a1, 115a2 are formed.

Figure 4B:
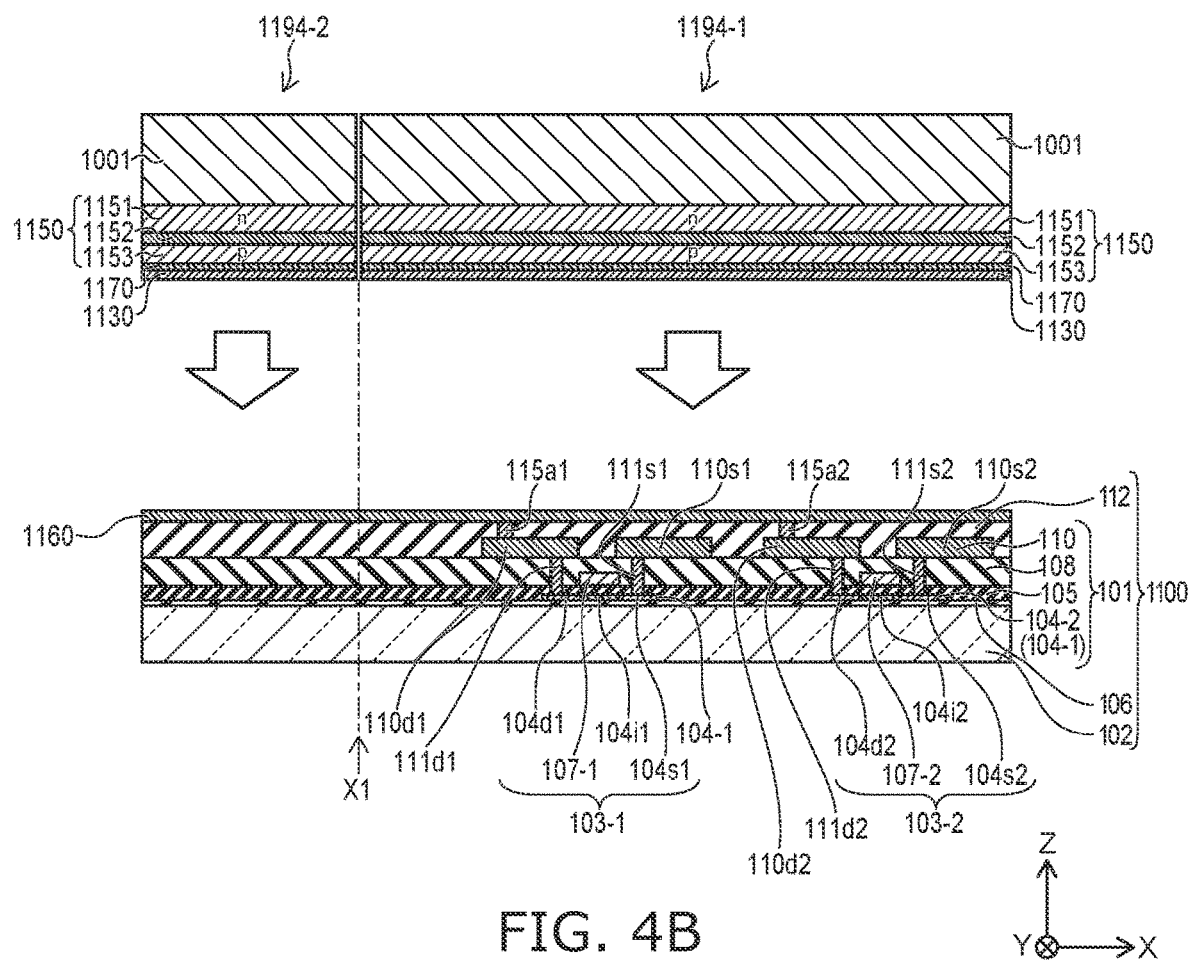
FIG. 4B is a schematic cross-sectional view illustrating the manufacturing method of the image display device according to the first embodiment.

As illustrated in FIG. 4B, the semiconductor growth substrates 1194-1, 1194-2 are inverted upside down and bonded to the circuit substrate 1100 on which the metal layer 1160 is formed. More specifically, bonding surfaces of the semiconductor growth substrates 1194-1, 1194-2 are exposed surfaces of the metal layer 1130. A bonding surface of the circuit substrate 1100 is an exposed surface of the metal layer 1160. These surfaces face each other and are bonded together.

In this example, the plurality of semiconductor growth substrates 1194-1, 1194-2 are adhered to one circuit substrate 1100. A position X1 is a position at which respective end portions of the semiconductor growth substrates 1194-1, 1194-2 are disposed in a case in which the semiconductor growth substrates 1194-1, 1194-2 are disposed adjacent to each other. As will be described in detail below, in the circuit substrate 1100, the light-emitting elements 150-1, 150-2 are not formed in a predetermined region including the position X1.

In the process of wafer bonding, for example, each of the substrates are heated and then bonded together by thermal compression bonding. When thermal compression bonding is performed, a low melting point metal or a low melting point alloy may be used. The low melting point metal is, for example, Sn or In, and the low melting point metal can be, for example, an alloy having Zn, In, Ga, Sn, Bi, or the like as a main component.

In wafer bonding, in addition to the above, the bonding surface of each substrate may be flattened using chemical mechanical polishing (CMP) or the like, and the bonding surfaces may be cleaned by a plasma treatment in a vacuum and brought into close contact.

Two modified examples in relation to the wafer bonding process are illustrated in FIG. 5A to FIG. 6B. In the wafer bonding process, the processes of FIG. 5A to FIG. 5C can be used instead of the processes of FIGS. 3A and 4B. Further, the processes of FIGS. 6A and 6B may be used instead of the processes of FIGS. 3A and 4B.

Figure 5A:
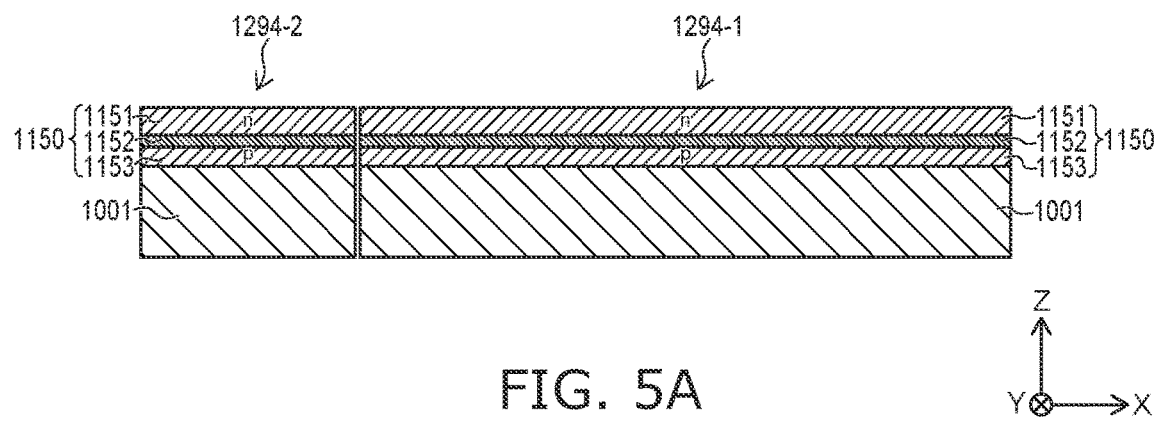
FIG. 5A is a schematic cross-sectional view illustrating a manufacturing method of the image display device according to the first embodiment.
Figure 5B:
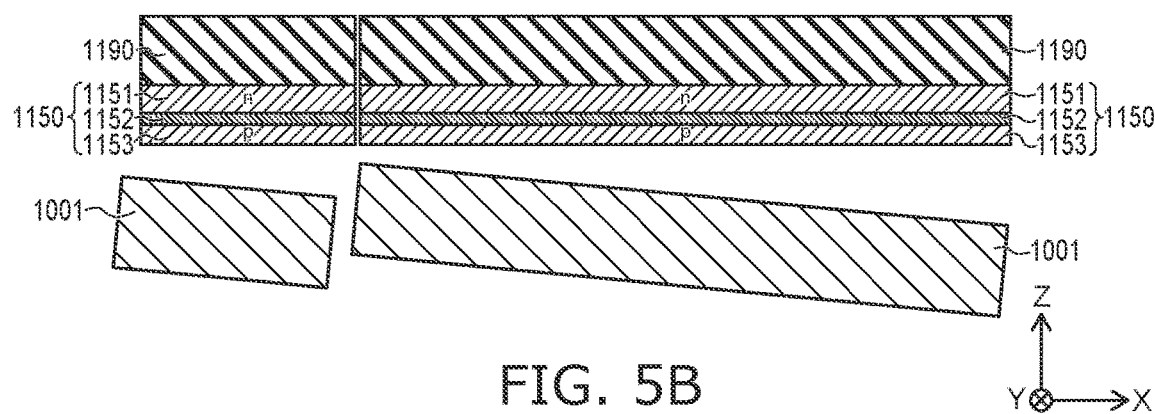
FIG. 5B is a schematic cross-sectional view illustrating the manufacturing method of the image display device according to the first embodiment.
Figure 5C:
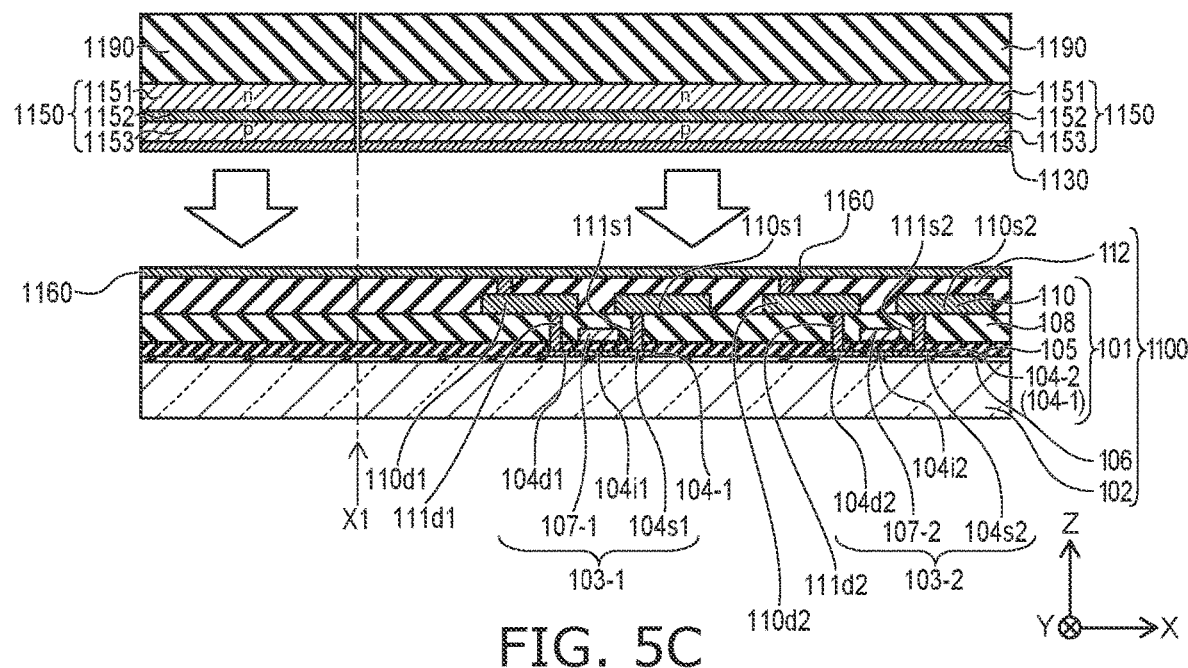
FIG. 5C is a schematic cross-sectional view illustrating the manufacturing method of the image display device according to the first embodiment.

In FIGS. 5A to 5C, after formation of the semiconductor layer 1150 on the crystal growth substrate 1001, the semiconductor layer 1150 is transferred to a support substrate 1190 different from the crystal growth substrate 1001.

As illustrated in FIG. 5A, semiconductor growth substrates 1294-1, 1294-2 are prepared. The semiconductor growth substrates 1294-1, 1294-2 each include the semiconductor layer 1150. The semiconductor layer 1150 includes the p-type semiconductor layer 1153, the light-emitting layer 1152, and the n-type semiconductor layer 1151. The p-type semiconductor layer 1153, the light-emitting layer 1152, and the n-type semiconductor layer 1151 are layered on the crystal growth substrate 1001 in the order of the p-type semiconductor layer 1153, the light-emitting layer 1152, and the n-type semiconductor layer 1151 from the side of the crystal growth substrate 1001.

As illustrated in FIG. 5B, after the semiconductor layer 1150 is formed on the crystal growth substrate 1001, the support substrate 1190 is adhered to the exposed surface of the n-type semiconductor layer 1151. The support substrate 1190 is formed of, for example, Si or quartz. After the support substrate 1190 is adhered to the semiconductor layer 1150, the crystal growth substrate 1001 is removed. To remove the crystal growth substrate 1001, wet etching or laser lift-off, for example, is used.

As illustrated in FIG. 5C, the metal layer 1130 is formed on the exposed surface of the p-type semiconductor layer 1153. As illustrated in FIG. 4A, the circuit substrate 1100 on which the metal layer 1160 is formed is prepared. The metal layer 1130 faces the metal layer 1160, and the metal layers 1130, 1160 are bonded together. Subsequently, the support substrate 1190 is removed by laser lift-off or the like.

Figure 6A:
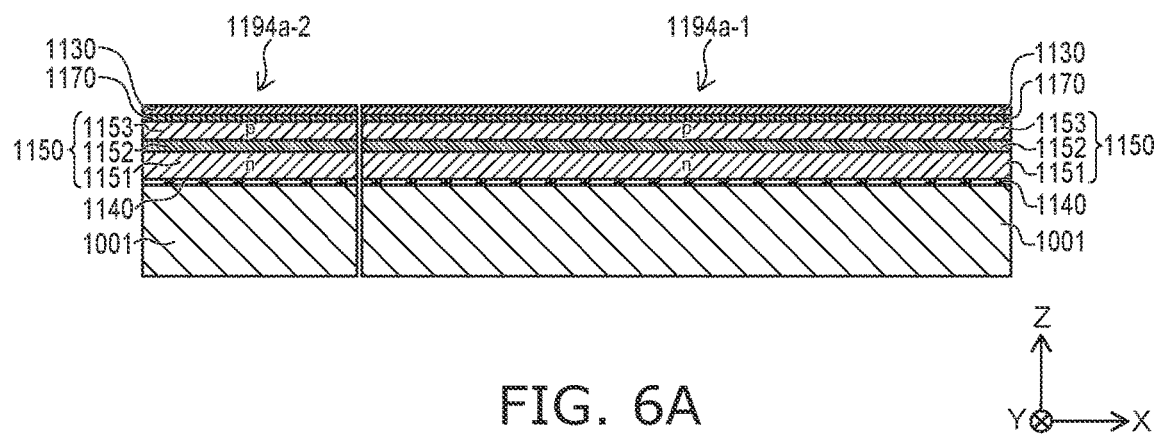
FIG. 6A is a schematic cross-sectional view illustrating the manufacturing method of the image display device according to the first embodiment.
Figure 6B:
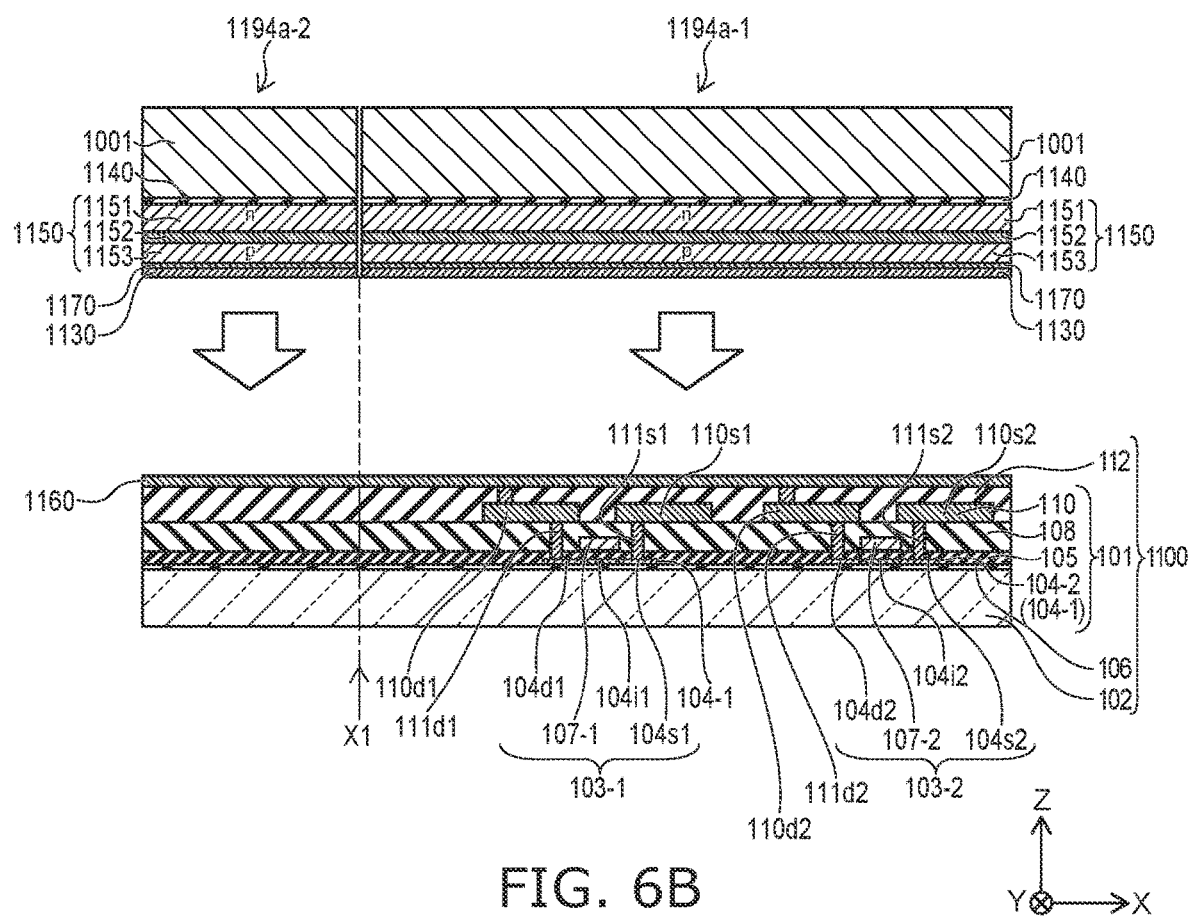
FIG. 6B is a schematic cross-sectional view illustrating the manufacturing method of the image display device according to the first embodiment.

In the example illustrated in FIGS. 6A and 6B, a buffer layer 1140 is provided on the crystal growth substrate 1001, and then the semiconductor layer 1150 is formed on the buffer layer 1140.

As illustrated in FIG. 6A, semiconductor growth substrates 1194*a*-1, 1194*a*-2 are prepared. The semiconductor growth substrates 1194*a*-1, 1194*a*-2 each include the buffer layer 1140 and the semiconductor layer 1150. The buffer layer 1140 is formed on one surface of the crystal growth substrate 1001. The semiconductor layer 1150 is formed on the crystal growth substrate 1001 with the buffer layer 1140 interposed therebetween. As the buffer layer 1140, a nitride such as AlN is suitably used. By crystal growth of the semiconductor layer 1150 with the buffer layer 1140 interposed therebetween, mismatch at the interface between the GaN crystal and the crystal growth substrate 1001 can be mitigated.

The semiconductor layer 1150 includes the n-type semiconductor layer 1151, the light-emitting layer 1152, and the p-type semiconductor layer 1153. The n-type semiconductor layer 1151, the light-emitting layer 1152, and the p-type semiconductor layer 1153 are layered on the crystal growth substrate 1001 in the order of the n-type semiconductor layer 1151, the light-emitting layer 1152, and the p-type semiconductor layer 1153 from the crystal growth substrate 1001 side.

On the prepared semiconductor growth substrates 1194*a*-1, 1194*a*-2, the metal layer 1130 is formed on the exposed surface of the p-type semiconductor layer 1153. As illustrated in FIG. 3A, the conductive layer 1170 is formed between the metal layer 1130 and the p-type semiconductor layer 1153.

As illustrated in FIG. 6B, the circuit substrate 1100 on which the metal layer 1160 is formed is prepared. The exposed surface of the metal layer 1130 faces the exposed surface of the metal layer 1160, and the metal layers 1130, 1160 are bonded together.

In this example, the buffer layer 1140 remains on the n-type semiconductor layer 1151 after removal of the crystal growth substrate 1001, and thus the buffer layer 1140 is removed in any subsequent process. The process of removing the buffer layer 1140 may be performed after the process of forming the light-emitting element, or may be performed before formation of the light-emitting element, for example. To remove the buffer layer 1140, wet etching, for example, is used.

The description of the manufacturing process after wafer bonding will now continue.

Figure 7A:
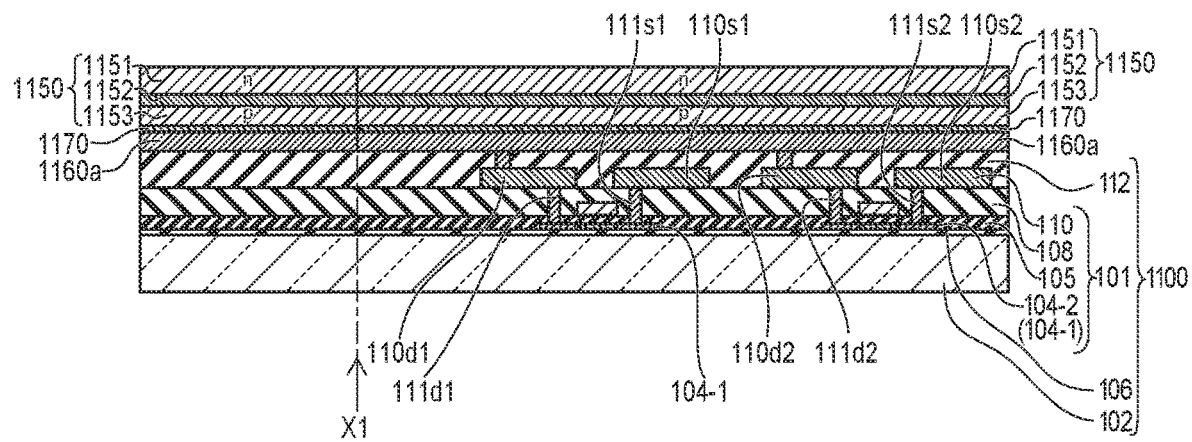
FIG. 7A is a schematic cross-sectional view illustrating the manufacturing method of the image display device according to the first embodiment.

As illustrated in FIG. 7A, the crystal growth substrate 1001 is removed by wet etching, laser lift-off, or the like. The bonded metal layers 1130, 1160 form a metal layer 1160*a*.

Figure 7B:
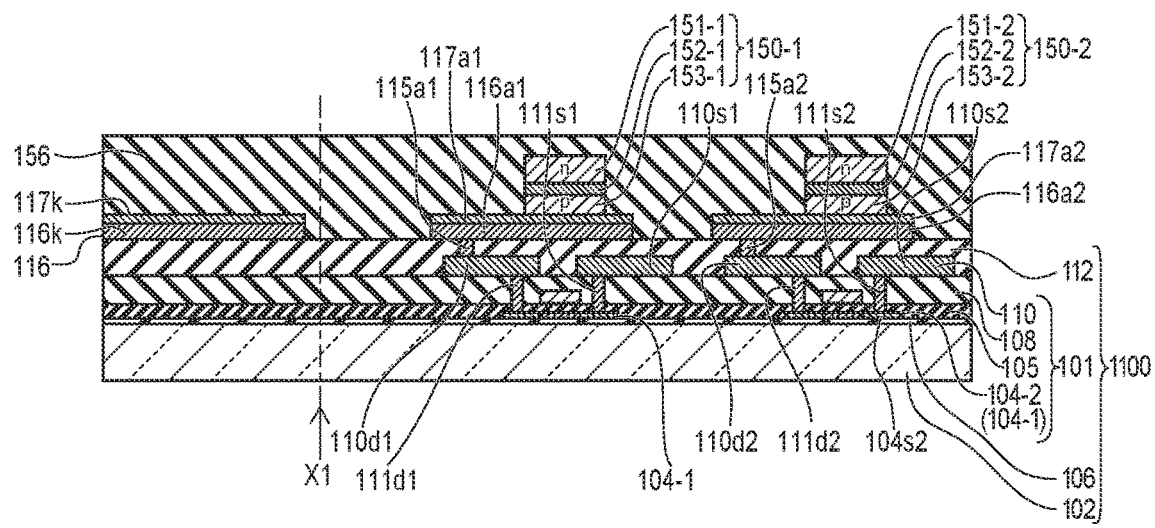
FIG. 7B is a schematic cross-sectional view illustrating the manufacturing method of the image display device according to the first embodiment.

As illustrated in FIG. 7B, the semiconductor layer 1150 illustrated in FIG. 7A is molded into a desired shape by etching, forming the light-emitting elements 150-1, 150-2. For the formation of the light-emitting elements 150-1, 150-2, a dry etching process, for example, is used, and anisotropic ion etching (reactive ion etching (RIE)) is suitably used. Subsequently, the bonded metal layer 1160*a* illustrated in FIG. 7A is etched to form the wiring layer (third wiring layer) 116. The wiring layer 116 includes the plugs 116*a*1, 116*a*2 and the wiring portion 116*k*. The conductive layer 1170 illustrated in FIG. 7A is also etched simultaneously with the metal layer 1160*a* and is molded into the conductive thin films 117*a*1, 117*a*2, 117*k*. The conductive thin film 117*a*1 covers the plug 116*a*1, and the conductive thin film 117*a*2 covers the plug 116*a*2. The conductive thin film 117*k* covers the wiring portion 116*k*.

The outer periphery of the plug 116*a*1 is molded so that the outer periphery of the light-emitting element 150-1 projected onto the plug 116*a*1 is located within the outer periphery of the plug 116*a*1 in an XY plane view. The outer periphery of the plug 116*a*2 is molded so that the outer periphery of the light-emitting element 150-2 projected onto the plug 116*a*2 is located within the outer periphery of the plug 116*a*2 in an XY plane view.

The light-emitting elements 150-1, 150-2 are formed at positions sufficiently distant from the position X1. The position X1 is a position corresponding to the end portions of the semiconductor layer 1150 illustrated in FIG. 4B, and the crystal quality of the semiconductor layer 1150 readily deteriorates at and near the position corresponding to the position X1. Therefore, on the positive direction side of the X axis from the position X1, the light-emitting elements 150-1, 150-2 are formed at positions sufficiently distant from the end portion. On the negative direction side of the X axis from the position X1, in this example, no other circuit elements are formed, including the light-emitting elements, and the wiring portion 116*k* is formed.

The second interlayer insulating film 156 is formed covering the first interlayer insulating film 112, the plugs 116*a*1, 116*a*2, the wiring portion 116*k*, the conductive thin films, 117*a*1, 117*a*2, 117*k*, and the light-emitting elements 150-1, 150-2.

Figure 8A:
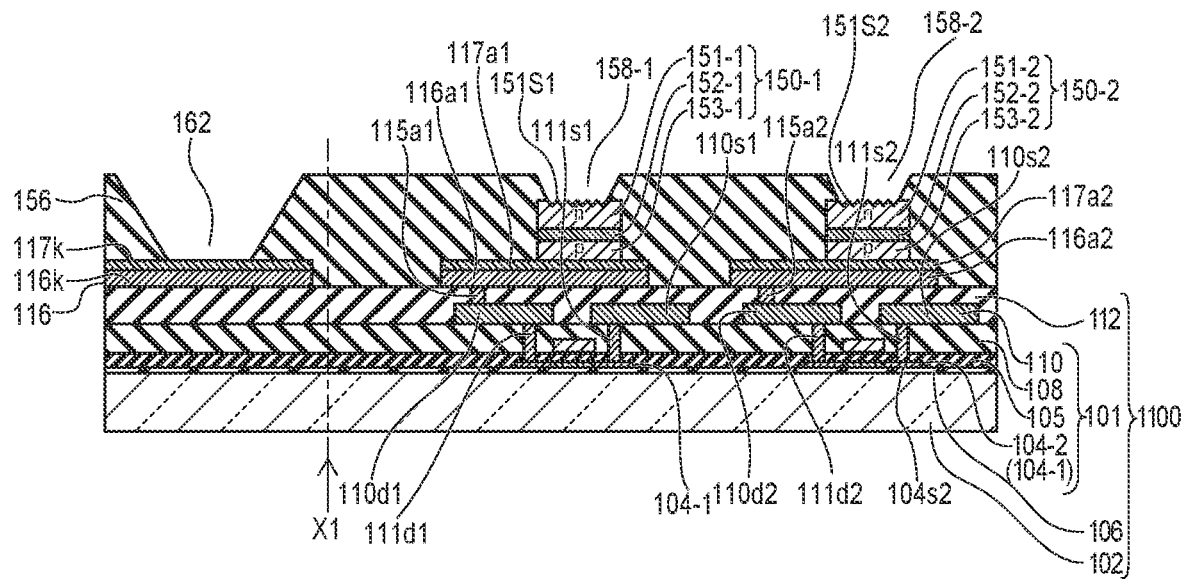
FIG. 8A is a schematic cross-sectional view illustrating the manufacturing method of the image display device according to the first embodiment.

As illustrated in FIG. 8A, a portion of the second interlayer insulating film 156 is etched until the n-type semiconductor layer 151-1 is reached to form the opening 158-1. The portion of the second interlayer insulating film 156 that is removed is at a position corresponding to the light-emitting element 150-1. The light-emitting surface 151S1 is exposed from the second interlayer insulating film 156. A portion of the second interlayer insulating film 156 is etched until the n-type semiconductor layer 151-2 is reached to form the opening 158-2. The portion of the second interlayer insulating film 156 that is removed is at a position corresponding to the light-emitting element 150-2. The light-emitting surface 151S2 is exposed from the second interlayer insulating film 156. A portion of the second interlayer insulating film 156 is etched until the conductive thin film 117k is reached to form the opening 162. The portion of the second interlayer insulating film 156 that is removed is at a position corresponding to the wiring portion 116k. The conductive thin film 117k is exposed from the second interlayer insulating film 156. The openings 158-1, 158-2, 162 are formed simultaneously, for example. As described above, in the process of forming the second interlayer insulating film 156, the front surface of the second interlayer insulating film 156 need only have a level of flatness that can cover the light-emitting elements 150-1, 150-2. The exposed light-emitting surface 151S1 of the n-type semiconductor layer 151-1 and the exposed light-emitting surface 151S2 of the n-type semiconductor layer 151-2 are roughened to improve the light emission efficiency.

Figure 8B:
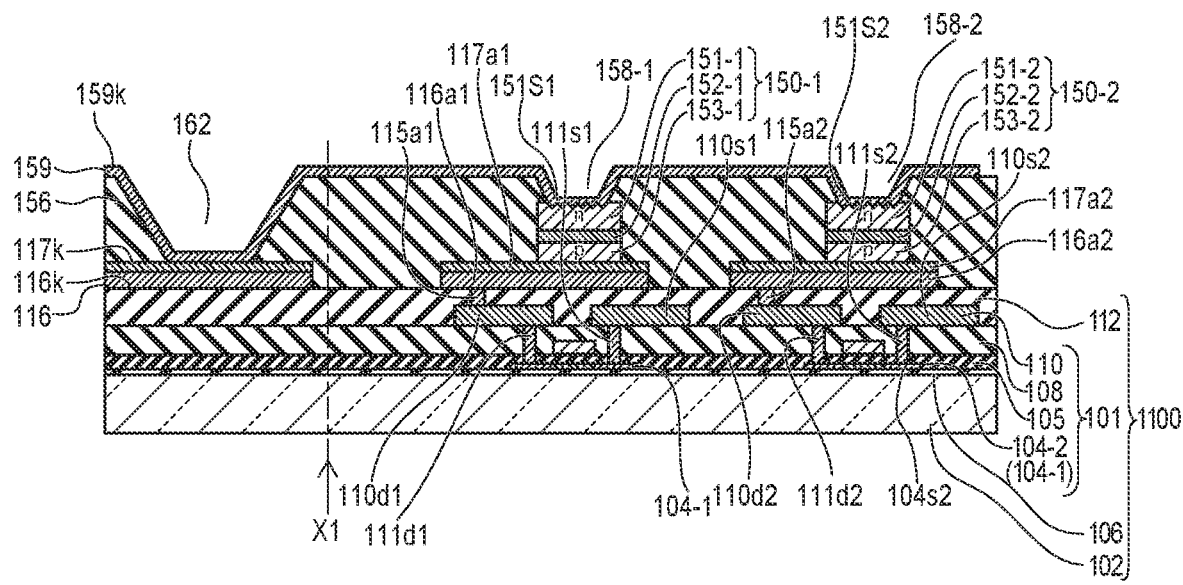
FIG. 8B is a schematic cross-sectional view illustrating the manufacturing method of the image display device according to the first embodiment.

As illustrated in FIG. 8B, the second wiring layer 159 is formed on the second interlayer insulating film 156. The second wiring layer 159 includes the light-transmitting electrode 159k. The light-transmitting electrode 159k is formed across the surface of the conductive thin film 117k exposed from the second interlayer insulating film 156 by the opening 162 and the light-emitting surfaces 151S1, 151S2. The light-transmitting electrode 159k electrically connects the n-type semiconductor layers 151-1, 151-2 to the conductive thin film 117k and the wiring portion 116k.

In the above, a configuration in which the metal layers 1130, 1160 are formed on both the semiconductor growth substrates 1194-1, 1194-2 and the circuit substrate 1100 has been described, but the metal layer 1160 need only be provided on at least the circuit substrate 1100 side.

The portion of the circuit other than the sub-pixels 20-1, 20-2 is formed in the circuit substrate 1100. For example, the row selection circuit 5 illustrated in FIG. 2 is formed in the circuit substrate 1100 along with drive transistors, selection transistors, and the like. That is, the row selection circuit 5 may be incorporated at the same time by the manufacturing process described above. On the other hand, it is desirable to incorporate the signal voltage output circuit 7 into a semiconductor device manufactured by a manufacturing process that permits high integration by microprocessing. The signal voltage output circuit 7 is mounted on another substrate together with a central processing unit (CPU) and other circuit elements, and is interconnected with the wiring portions of the circuit substrate 1100 before incorporation of, for example, a color filter described below, or after incorporation of the color filter.

The circuit substrate 1100 includes the substrate 102 composed of a glass substrate and including the circuit 101, and the substrate 102 is substantially rectangular, for example. The circuit 101 for one image display device 1 is formed on the circuit substrate 1100 as described above. Further, the circuit 101 for a plurality of image display devices may be formed on the circuit substrate 1100. In the case of a larger screen size or the like, the circuit 101 for constituting one image display device may be divided into a plurality of the circuit substrates 1100, and the divided circuits may all be combined to constitute one image display device.

The semiconductor layer 1150 having substantially the same dimensions as those of the crystal growth substrate 1001 is formed on the crystal growth substrate 1001. For example, the crystal growth substrate 1001 can be rectangular with the same dimensions as those of the rectangular circuit substrate 1100. The crystal growth substrate is not limited to having the same shape or a similar shape as that of the circuit substrate 1100, and may have another shape. For example, the crystal growth substrate 1001 may have a generally circular wafer shape or the like having a diameter such that includes the circuit 101 formed in the rectangular circuit substrate 1100.

Figure 9:
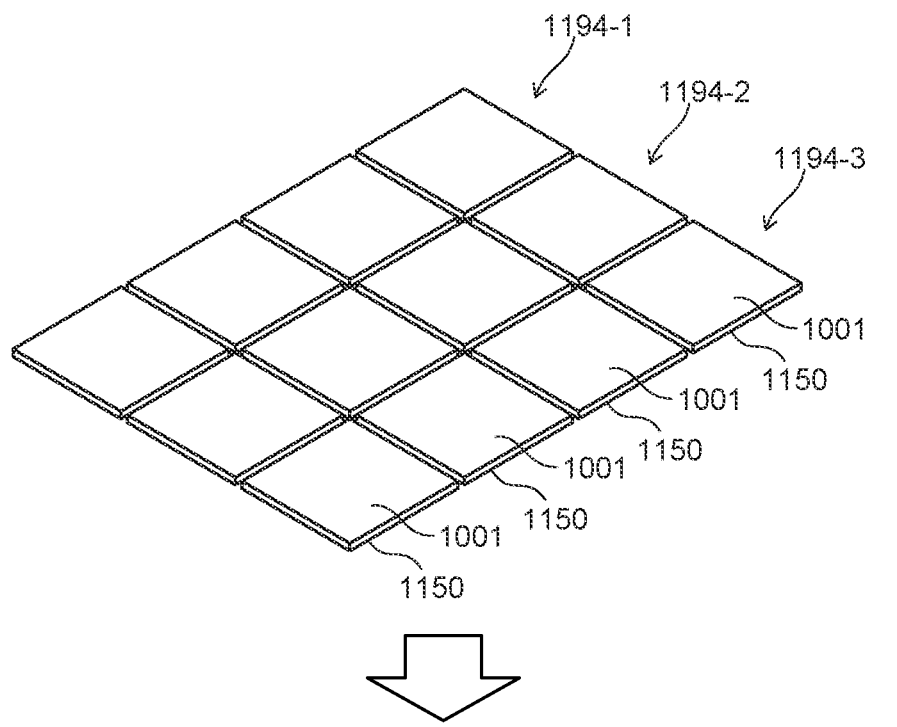
FIG. 9 is a schematic perspective view illustrating a manufacturing method of the image display device according to the first embodiment.
Figure 9:
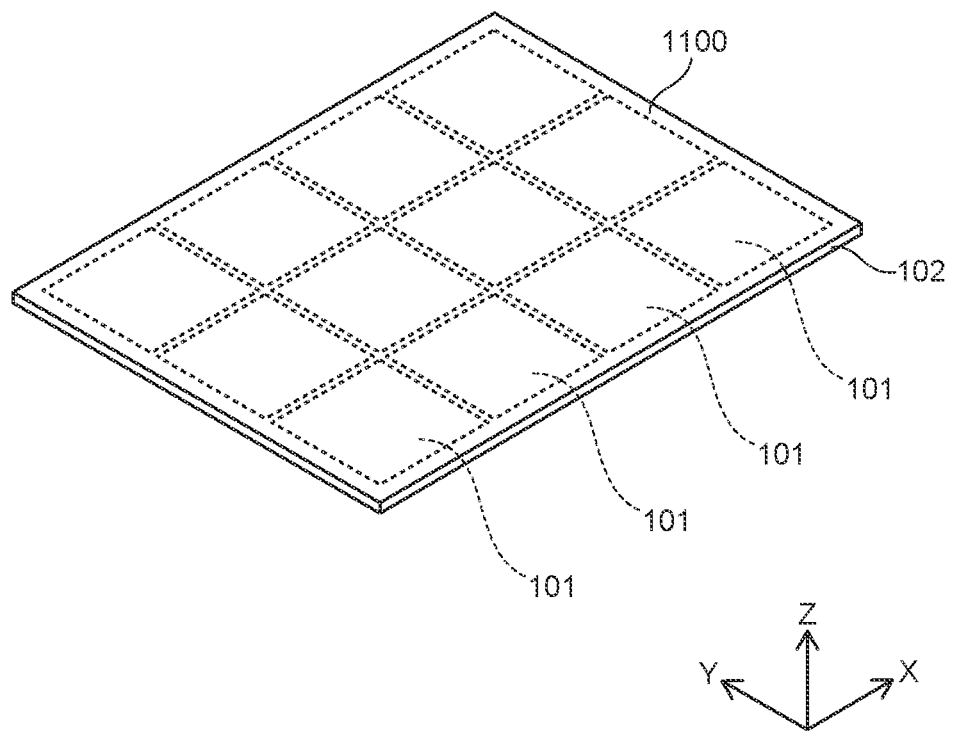

FIG. 9 is a perspective view illustrating a manufacturing method of the image display device according to the present embodiment.

As illustrated in FIG. 9, the plurality of semiconductor growth substrates 1194-1, 1194-2, 1194-3, and the like may be prepared to bond the semiconductor layer 1150 formed on the plurality of crystal growth substrates 1001 to one circuit substrate 1100. The semiconductor growth substrate 1194-3 is the same as the semiconductor growth substrates 1194-1, 1194-2 described above, and the semiconductor layer 1150 is formed on the crystal growth substrate 1001 illustrated in FIG. 3A and the like on the semiconductor growth substrates 1194-1, 1194-2, 1194-3, and the like.

In the circuit substrate 1100, a plurality of the circuits 101 are disposed in a lattice pattern, for example, on one substrate 102. The circuit 101 includes all sub-pixels 20-1, 20-2 and the like required for one image display device 1. An interval about a scribe line width is provided between the circuits 101 adjacently disposed. Circuit elements and the like are not disposed at an end portion or near an end portion of the circuit 101.

The semiconductor layer 1150 is formed with an end portion thereof matching an end portion of the crystal growth substrate 1001. Thus, the end portions of the semiconductor growth substrates 1194-1, 1194-2, 1194-3 are matchingly arranged and bonded with the end portions of the circuits 101, thereby making it possible to match the end portions of the semiconductor layer 1150 and the end portions of the circuit 101 after bonding.

When the semiconductor layer 1150 is grown on the crystal growth substrate 1001, the crystal quality readily deteriorates at and near the end portions of the semiconductor layer 1150. Therefore, by matching the end portions of the semiconductor layer 1150 and the end portions of the circuits 101, regions near the end portions of the semiconductor layer 1150 on the semiconductor growth substrates 1194-1, 1194-2, 1194-3 that readily deteriorate in crystal quality can be ensured not to be used for the display region of the image display device 1. Here, there are various degrees of freedom in the method of arranging the crystal growth substrate 1001. For example, as described above in connection with FIGS. 4B and 7B mentioned above, in a case in which a plurality of the semiconductor layers 1150 are bonded to one circuit substrate 1100, a circuit arrangement in which the light-emitting elements 150-1, 150-2 are not formed at the boundary or in a region near the boundary of two semiconductor layers 1150 adjacent to each other or the like is preferred.

Contrary to the above, a plurality of circuit substrates 1100 may be prepared to bond the plurality of circuit substrates 1100 to the semiconductor layer 1150 formed on one semiconductor growth substrate.

Figure 10:
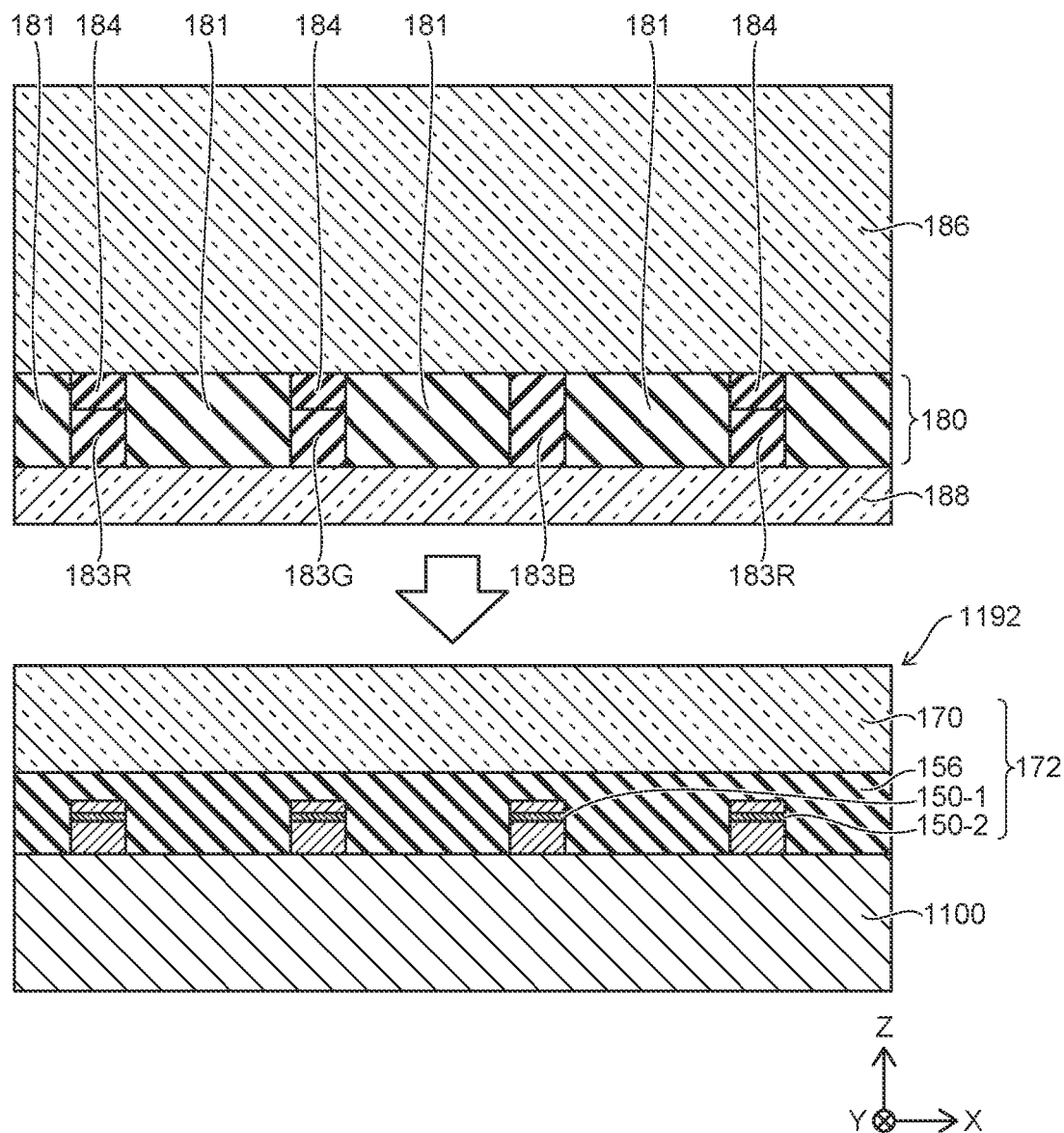
FIG. 10 is a schematic cross-sectional view illustrating the manufacturing method of the image display device according to the first embodiment.

FIG. 10 is a schematic cross-sectional view illustrating the manufacturing method of the image display device according to the present embodiment.

In FIG. 10, to avoid complexities, the structure in the circuit substrate 1100, the first interlayer insulating film 112, the connecting portions 115a1, 115a2, the plugs 116a1, 116a2, the wiring portion 116k, the conductive thin films 117a1, 117a2, 117k, the second wiring layer 159, and the like are omitted. Further, in FIG. 10, a portion of the color conversion member such as the color filter 180 is illustrated. In FIG. 10, the structure including the light-emitting elements 150-1, 150-2, the second interlayer insulating film 156, the surface resin layer 170, the plugs omitted in the illustration, and the like is referred to as a light-emitting circuit portion 172. Further, the structure in which the light-emitting circuit portion 172 is provided on the circuit substrate 1100 is referred to as a structure 1192.

As illustrated in FIG. 10, one surface of the color filter (wavelength conversion member) 180 is adhered to the structure 1192. The other surface of the color filter 180 is adhered to the glass substrate 186. The one surface of the color filter 180 is provided with the transparent thin film adhesive layer 188 and adhered to a surface of the structure 1192 on the side of the light-emitting circuit portion 172 with the transparent thin film adhesive layer 188 interposed therebetween.

In the color filter 180, in this example, color conversion units are arrayed in the positive direction of the X axis in the order of red, green, and blue. A color conversion layer 183R of a red color is provided in a first layer for red, a color conversion layer 183G of a green color is provided in the first layer for green, and the filter layer 184 is provided in a second layer for both. For blue, a single layer of a color conversion layer 183B may be provided and the filter layer 184 may be provided. While the light-blocking portion 181 is provided between each color conversion unit, the frequency characteristics of the filter layer 184, needless to say, can be changed for each color of the color conversion unit.

The color filter 180 is adhered to the structure 1192 with the positions of the color conversion layers 183R, 183G, 183B of each color aligned to the position of the light-emitting element 150.

FIGS. 11A to 11D are schematic cross-sectional views illustrating a modified example of the manufacturing method of the image display device according to the present embodiment. FIGS. 11A to 11D illustrate a method of forming the color filter by ink jetting.

Figure 11A:
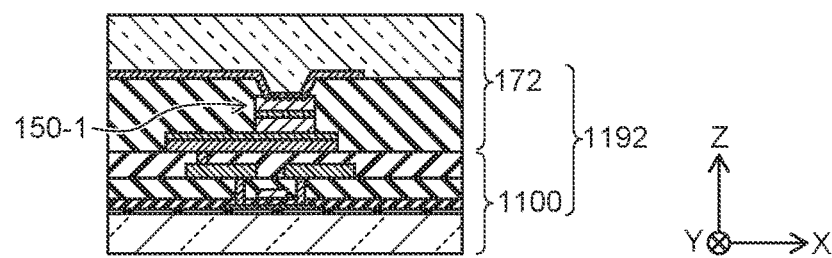
FIG. 11A is a schematic cross-sectional view illustrating the manufacturing method of the image display device according to the first embodiment.

As illustrated in FIG. 11A, the structure 1192 in which the light-emitting circuit portion 172 is adhered to the circuit substrate 1100 is prepared.

Figure 11B:
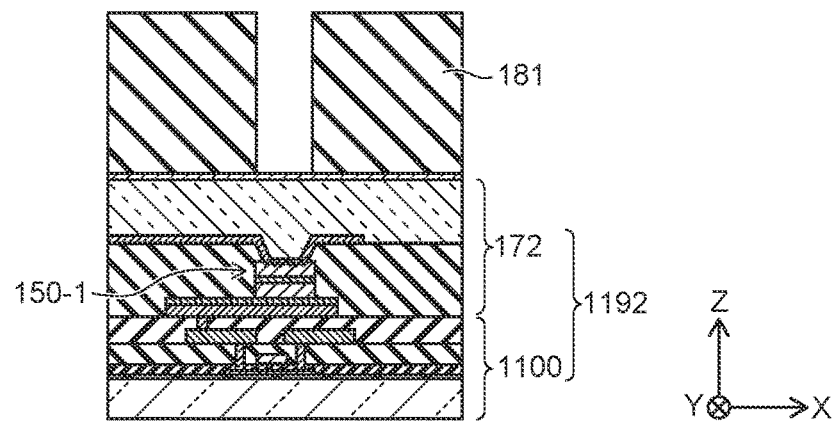
FIG. 11B is a schematic cross-sectional view illustrating the manufacturing method of the image display device according to the first embodiment.

As illustrated in FIG. 11B, the light-blocking portion 181 is formed on the structure 1192. The light-blocking portion 181 is formed using, for example, screen printing or a photolithography technique.

Figure 11C:
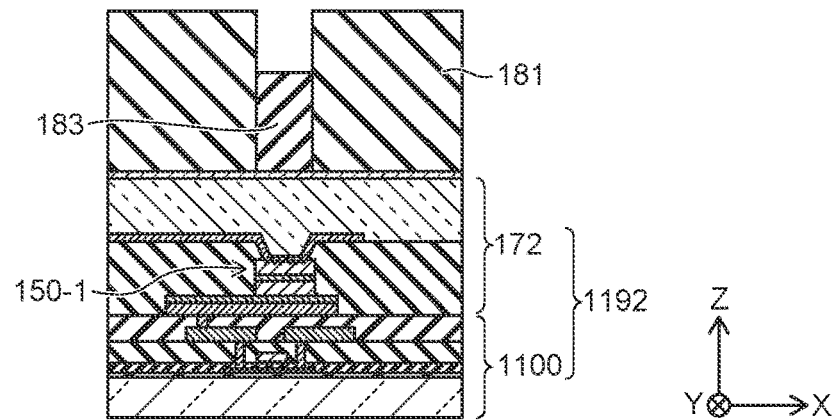
FIG. 11C is a schematic cross-sectional view illustrating the manufacturing method of the image display device according to the first embodiment.

As illustrated in FIG. 11C, a phosphor corresponding to the light emission color is ejected from an inkjet nozzle to form the color conversion layer 183. The phosphor colors the region where the light-blocking portion 181 is not formed. As the phosphor, for example, a fluorescent coating that uses a typical phosphor material, a perovskite phosphor material, or a quantum dot phosphor material is used. Use of a perovskite phosphor material or a quantum dot phosphor material makes it possible to realize each light emission color, high chromaticity, and high color reproducibility, and is thus preferred. After the drawing by the inkjet nozzle, drying is performed at an appropriate temperature and for an appropriate time. A thickness of the coating film at the time of coloring is set thinner than a thickness of the light-blocking portion 181.

As already described, in a case in which the color conversion unit is not to be formed for a blue light-emitting sub-pixel, the color conversion layer 183 is not formed. Further, for a blue light-emitting sub-pixel, in a case in which the color conversion unit need only be a single layer when the blue color conversion layer is formed, a thickness of the coating film of the blue phosphor is preferably about the same as the thickness of the light-blocking portion 181.

Figure 11D:
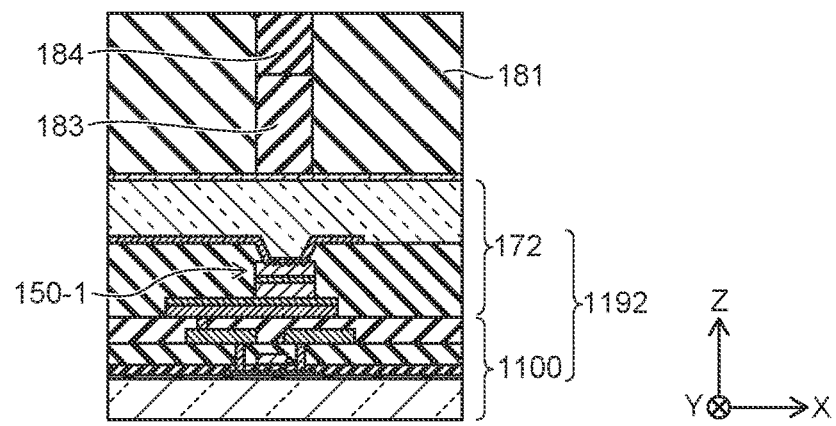
FIG. 11D is a schematic cross-sectional view illustrating the manufacturing method of the image display device according to the first embodiment.

As illustrated in FIG. 11D, the coating for the filter layer 184 is ejected from an inkjet nozzle. The coating is applied so as to overlap the coating film of the phosphor. The total thickness of the coating film of the phosphor and the coating is about the same as the thickness of the light-blocking portion 181.

Effects of the image display device 1 of the present embodiment will now be described.

In the manufacturing method of the image display device 1 of the present embodiment, the semiconductor layer 1150 is bonded to the circuit substrate 1100 including circuit elements such as the transistors 103-1, 103-2 for driving the light-emitting elements 150-1, 150-2. Subsequently, the semiconductor layer 1150 is etched to form the light-emitting elements 150-1, 150-2. Therefore, the process of transferring the light-emitting elements 150-1, 150-2 can be significantly shortened compared to individually transferring separated pieces of light-emitting elements to the circuit substrate 1100.

For example, the number of sub-pixels exceeds 24 million in an image display device with 4K image quality, and exceeds 99 million in the case of an image display device with 8K image quality. To individually mount such a large number of light-emitting elements onto a circuit substrate requires an enormous amount of time, making it difficult to realize an image display device that uses micro LEDs at a realistic cost. Further, individually mounting a large number of light-emitting elements reduces yield due to connection failure and the like during mounting, and thus further increases in cost cannot be avoided.

As described above, in the manufacturing method of the image display device 1 of the present embodiment, the entire semiconductor layer 1150 is adhered to the circuit substrate 1100 prior to separating the semiconductor layer 1150 into pieces, and thus the transfer process is completed in one undertaking.

Further, because the semiconductor layer 1150 is adhered to the circuit substrate 1100 at the wafer level without being separated into pieces in advance or forming electrodes at positions corresponding to the circuit elements, alignment is not required. Therefore, the adhering process can be easily performed in a short period of time. Without alignment required at the time of adherence, the size of the light-emitting element 150 is readily reduced, which is suitable for a high-definition display.

In the present embodiment, a TFT formed on a glass substrate can be used as the circuit substrate 1100, for example, making it possible to utilize an existing flat panel manufacturing process and plant.

In the present embodiment, the plugs 116a1, 116a2 are formed in the circuit substrate 1100. The plug 116a1 is electrically connected to the transistor 103-1 for driving. The plug 116a2 is electrically connected to the transistor 103-2 for driving. The semiconductor layer 1150 is etched, thereby respectively forming the light-emitting elements 150-1, 150-2 on the plugs 116a1, 116a2. Therefore, the light-emitting element 150-1 is reliably electrically connected to the transistor 103-1, and the light-emitting element 150-2 is reliably electrically connected to the transistor 103-2. Accordingly, a reduction in yield due to connection failure of a light-emitting element or the like is suppressed.

In the present embodiment, the wiring layer 116 including the wiring portion 116k is formed in the same layer as that of the plugs 116a1, 116a2. Because the wiring portion 116k is formed on the same circuit substrate 1100 as that of the plugs 116a1, 116a2, the wiring portion 116k can be utilized as a wiring portion required for low impedance, such as the power source line and the ground line, making it possible to increase the degree of freedom in the layout of the wiring portions and arrangement of the circuit 101. The wiring portion 116k is formed simultaneously with the plugs 116a1, 116a2, and thus a wiring portion having low impedance can be readily realized without adding a process for the wiring portion 116k.

In the present embodiment, the electrical connection on the light-emitting surface 151S1, 151S2 side is made via the light-transmitting electrode 159k. Therefore, the area of the light-emitting surfaces 151S1, 151S2 can be sufficiently ensured, and high light emission efficiency can be achieved.

In the image display device 1 of the present embodiment, the plugs 116a1, 116a2 also function as light-reflecting plates. The light scattered downward from the light-emitting elements 150-1, 150-2 is reflected by the plugs 116a1, 116a2 and distributed on the light-emitting surface 151S1, 151S2 side. Therefore, the light emission efficiency of the light-emitting elements 150-1, 150-2 is substantially improved.

The plugs 116a1, 116a2 function as light-reflecting plates as well as light-blocking plates. The plugs 116a1, 116a2 block light scattering downward of the light-emitting elements 150-1, 150-2. This makes it possible to suppress the irradiation of light to circuit elements in the vicinity below the light-emitting elements 150-1, 150-2 and prevent malfunction and the like of the circuit elements.

In the present embodiment, wiring portions such as the power source line and the ground line are defined as the wiring portion 116k and the first wiring layer 110, thereby making it possible to improve the degree of freedom of the wiring pattern of the power source line, the ground line, and the like, and improve a design efficiency of the image display device.

Second Embodiment

Figure 12:
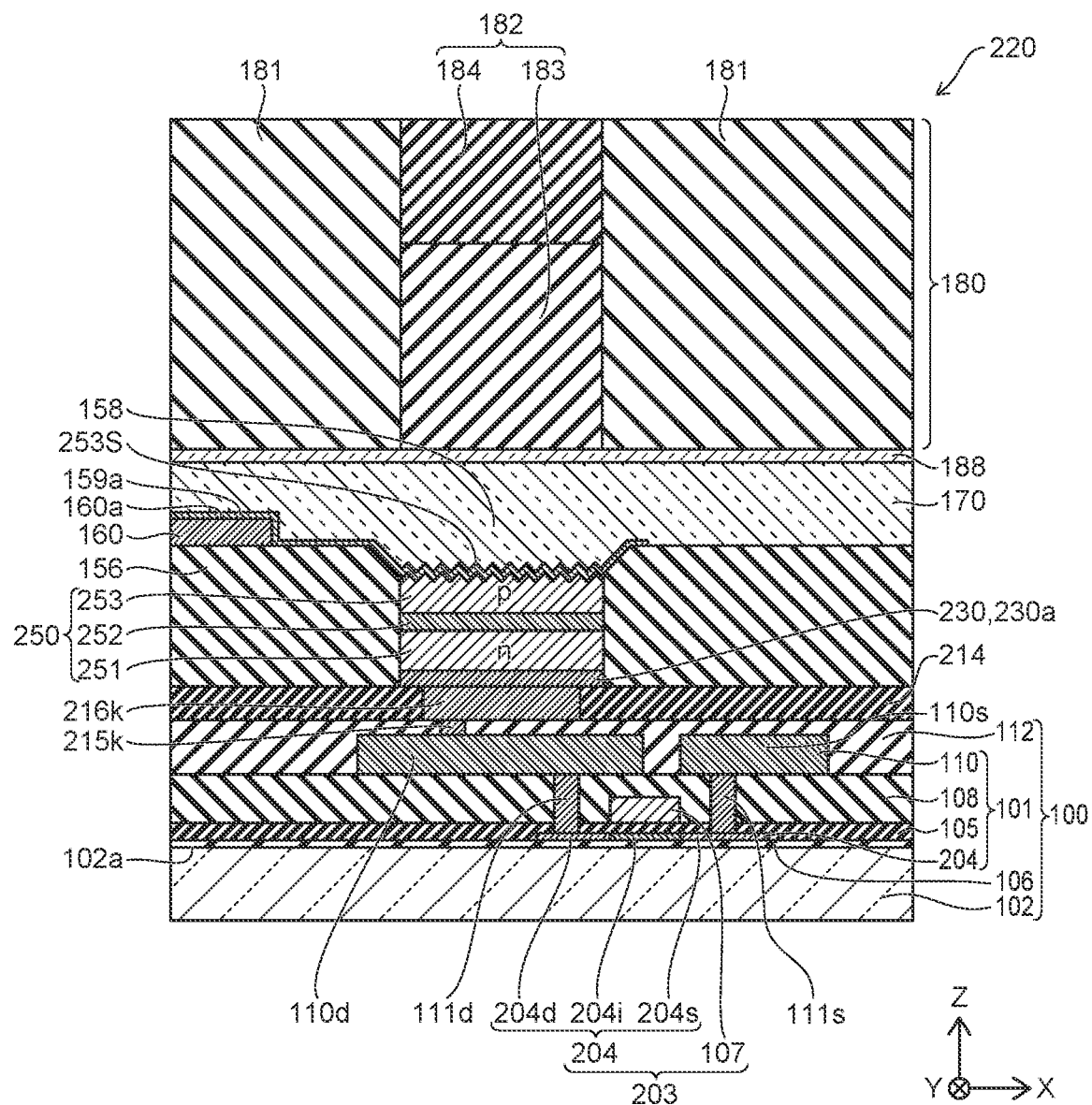
FIG. 12 is a schematic cross-sectional view illustrating a portion of an image display device according to a second embodiment.

FIG. 12 is a schematic cross-sectional view illustrating a portion of an image display device according to the present embodiment.

FIG. 12 schematically illustrates a cross section when a sub-pixel 220 is cut at a plane parallel to the XZ plane.

The present embodiment differs from the embodiment described above in that a flattening film 214 is provided, and a plug 216k is embedded in the flattening film 214. Note that, in the present embodiment, one sub-pixel 220 is described. However, as in the case of the other embodiments, a plurality of the sub-pixels 220 are provided in the XY plane and arrayed in the X-axis direction and the Y-axis direction. Further, an area of a light-emitting element 250 may also be a different area depending on the light emission color and the like. Components that are the same as those of the other embodiment described above are denoted by the same reference signs, and detailed descriptions thereof will be omitted as appropriate.

As illustrated in FIG. 12, the sub-pixel 220 of the image display device of the present embodiment includes a transistor 203, the first wiring layer 110, the first interlayer insulating film 112, the plug 216k, the light-emitting element 250, the second interlayer insulating film 156, and a second wiring layer 160. The sub-pixel 220 further includes the color filter 180 as in the other embodiment described above.

The transistor 203 is formed on the substrate 102. The transistor 203 is an n-channel TFT in this example. The transistor 203 includes a TFT channel 204 and the gate 107. The transistor 203 is formed by an LTPS process or the like as in the other embodiment described above. In the present embodiment, the circuit 101 includes the TFT channel 204, the insulating layer 105, the insulating film 108, the vias 111s, 111d, and the first wiring layer 110.

The TFT channel 204 includes regions 204s, 204i, 204d. The regions 204s, 204i, 204d are provided on the TFT lower layer film 106. The regions 204s, 204d are doped with an n-type impurity such as phosphorous (P). The region 204s is ohmic connected to the via 111s. The region 204d are ohmic connected to the via 111d.

The gate 107 is provided on the TFT channel 204 with the insulating layer 105 interposed therebetween. The insulating layer 105 insulates the TFT channel 204 and the gate 107.

In the transistor 203, when a voltage higher than that of the region 204s is applied to the gate 107, a channel is formed in the region 204i. A current flowing between the regions 204s, 204d is controlled by the voltage across the region 204s of the gate 107. The TFT channel 204 and the gate 107 are formed of a material and by a manufacturing method that are the same as those of the TFT channels 104-1, 104-2 and the gates 107-1, 107-2 in the other embodiment described above.

The vias 111s, 111d are provided through the insulating film 108. The via 111s is provided between the wiring portion 110s and the region 204s. The via 111s electrically connects the wiring portion 110s and the region 204s. The via 111d is provided between the wiring portion 110d and the region 204d. The via 111d electrically connects the wiring portion 110d and the region 204d. The vias 111s, 111d are formed of a material and by a manufacturing method that are the same as those of the vias 111s1, 111d1, and the like in the other embodiment described above.

The wiring portion 110s is electrically connected to the ground line 4 of the circuit illustrated in FIG. 15 described below, for example. The wiring portion 110d is electrically connected to an n-type semiconductor layer 251 via a connecting portion 215k, the plug 216k, and a light-reflecting plate 230a.

The flattening film 214 is provided on the first interlayer insulating film 112. The flattening film 214 is a film or a layer having insulating properties and is, for example, similar to the first interlayer insulating film 112, an organic insulating film such as PSG or BPSG, or an inorganic insulating film such as spin-on glass (SOG).

The plug 216k is provided on the first interlayer insulating film 112. A lateral surface of the plug 216k is covered with the flattening film 214. That is, the plug 216k is embedded in the flattening film 214. The plug 216k and the flattening film 214 each include the same surface substantially parallel to the XY plane. The surface of the plug 216k and the flattening film 214 is collectively flattened as described below.

The connecting portion 215k is provided between the plug 216k and the wiring portion 110d. The connecting portion 215k is formed of a conductive member and electrically connects the plug 216k and the wiring portion 110d. The plug 216k and the connecting portion 215k are formed of the same material as that of the first wiring layer 110, for example.

The light-emitting element 250 is provided on the plug 216k with the light-reflecting plate 230a interposed therebetween. The light-emitting element 250 includes the n-type semiconductor layer (first semiconductor layer) 251, a light-emitting layer 252, and a p-type semiconductor layer (second semiconductor layer) 253. The n-type semiconductor layer 251, the light-emitting layer 252, and the p-type semiconductor layer 253 are layered in the order of the n-type semiconductor layer 251, the light-emitting layer 252, and the p-type semiconductor layer 253 from the side of the first interlayer insulating film 112 toward the side of a light-emitting surface 253S. Accordingly, the n-type semiconductor layer 251 is electrically connected to the plug 216k via the light-reflecting plate 230a.

The light-emitting element 250 has the same shape as that of the light-emitting elements 150-1, 150-2 of the other embodiment described above in an XY plane view. An appropriate shape is selected according to the layout of the circuit elements and the like.

The light-emitting element 250 is a light-emitting diode similar to those of the light-emitting elements 150-1, 150-2 of the other embodiment described above. That is, the wavelength of the light emitted by the light-emitting element 250 corresponds to blue light emission having a wavelength of, for example, about 467 nm±20 nm or blue violet light emission having a wavelength of about 410 nm±20 nm. The wavelength of the light emitted by the light-emitting element 250 is not limited to the values described above and may be an appropriate value.

The second wiring layer (second wiring layer) 160 is provided on the second interlayer insulating film 156. The second wiring layer 160 includes a wiring portion 160a. The wiring portion 160a is connected to the power source line 3 of the circuit illustrated in FIG. 15 described below, for example. The second wiring layer 160 is formed of the same material as that of the first wiring layer 110 and the like, for example.

In this example, a third wiring layer 230 is provided on the flattening film 214 and the plug 216k. The third wiring layer 230 includes the light-reflecting plate 230a. The light-reflecting plate 230a is provided for each sub-pixel and the plurality of light-reflecting plates 230a are electrically insulated. As described above, the light-emitting elements 250 are respectively provided on the light-reflecting plates 230a.

The third wiring layer 230 and the light-reflecting plate 230a are formed of a material having high conductivity. The light-reflecting plate 230a includes, for example, Ti, Al, and alloys of Ti and Sn. Cu, V, or the like, or a noble metal having high light reflectivity such as Ag or Pt may be included. With the light-reflecting plate 230a being formed of such a metal material or the like having high conductivity, the light-emitting element 250 and the circuit 101 are electrically connected at a low resistance.

In an XY plane view, an outer periphery of the light-emitting element 250 is located within an outer periphery of the light-reflecting plate 230a when the light-emitting element 250 is projected onto the light-reflecting plate 230a. The outer periphery of the light-emitting element 250 being located within the outer periphery of the light-reflecting plate 230a also refers to the outer peripheries matching each other. Thus, the light-reflecting plate 230a can reflect light scattering downward of the light-emitting element 250 toward the light-emitting surface 253S side. By reflecting the light scattering downward of the light-emitting element 250 toward the light-emitting surface 253S side, the light emission efficiency of the light-emitting element 250 can substantially be improved. Further, by reflecting the light scattering downward of the light-emitting element 250 toward the light-emitting surface 253S side, malfunction of circuit elements, such as the transistor 203, caused by the light scattering downward can be prevented.

A light-transmitting electrode 159a is provided over the wiring portion 160a. The light-transmitting electrode 159a is provided over the light-emitting surface 253S of the p-type semiconductor layer 253 that is open. The light-transmitting electrode 159a is provided between the wiring portion 160a and the light-emitting surface 253S, and electrically connects the wiring portion 160a and the p-type semiconductor layer 253.

The n-type semiconductor layer 251 is electrically connected to the region 204d via the light-reflecting plate 230a, the plug 216k, the connecting portion 215k, the wiring portion 110d, and the via 111d. The region 204d corresponds to a drain electrode of the transistor 203. The region 204s corresponds to a source electrode of the transistor 203 and is electrically connected to the ground line 4 through the via 111s and the wiring portion 110s.

The p-type semiconductor layer 253 is electrically connected to the power source line 3 via the light-transmitting electrode 159a and the wiring portion 160a.

Modified Example

Figure 13:
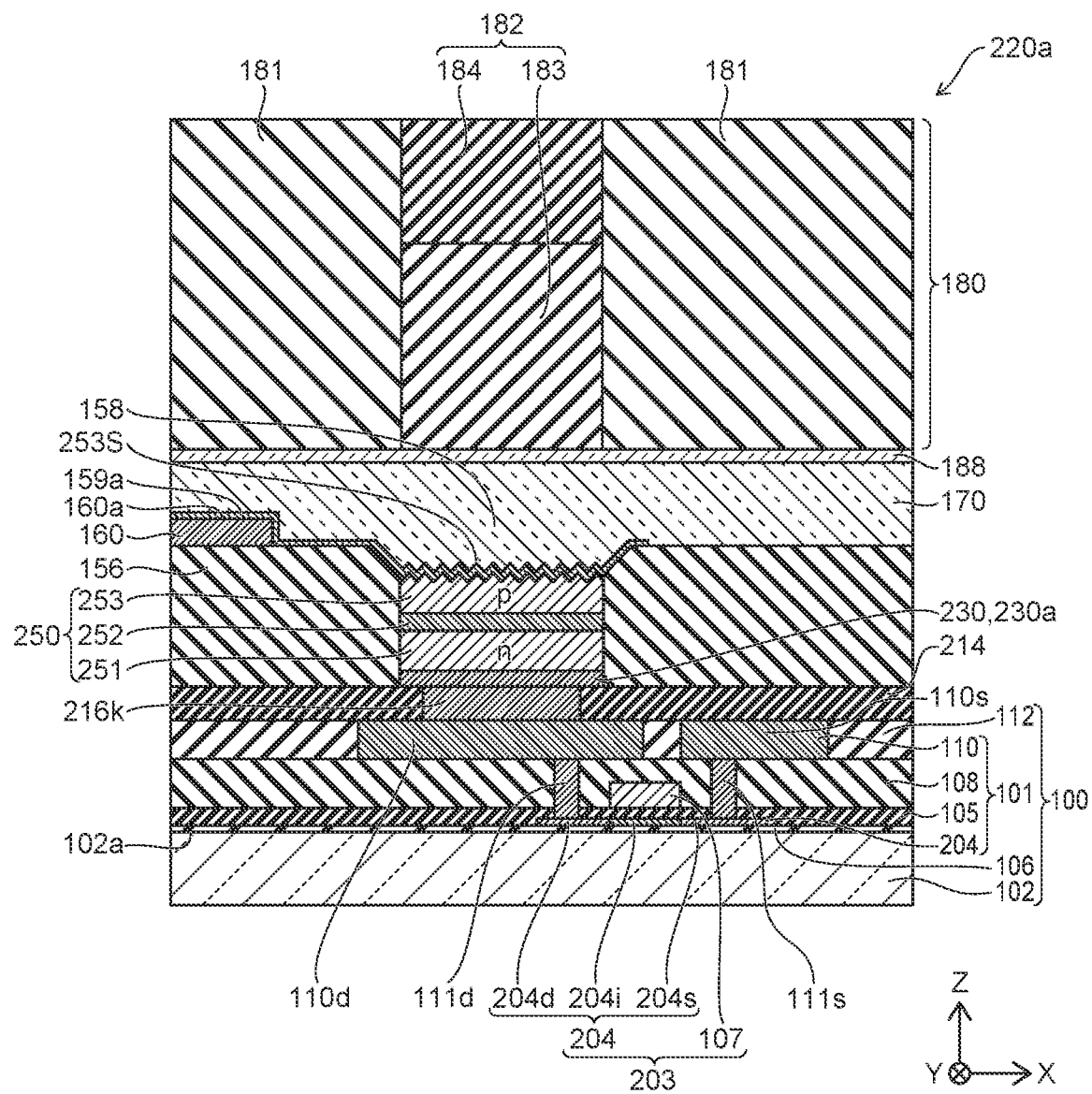
FIG. 13 is a schematic cross-sectional view illustrating a portion of an image display device according to a modified example of the second embodiment.

FIG. 13 is a schematic cross-sectional view illustrating a portion of a modified example of an image display device of the present embodiment.

As illustrated in FIG. 13, in a sub-pixel 220a of this modified example, the plug 216k is connected to the wiring portion 110d without being via the connecting portion 215k illustrated in FIG. 12.

As described in relation to FIG. 12, in a case in which the plug 216k is connected to the wiring portion 110d via the connecting portion 215k, an outer periphery of the plug 216k can be formed protruding outward beyond an outer periphery of the wiring portion 110d in an XY plane view. In a case in which the outer periphery of the plug 216k is inward of the outer periphery of the wiring portion 110d in an XY plane view, as in the present modified example, the plug 216k can be provided directly on the wiring portion 110d and not via the connecting portion 215k. That is, in accordance with a positional relationship between the plug and the wiring portion of the connection destination as well as the respective shapes of the plug and the wiring portion of the connection destination, the wiring portion and the element can be connected to each other with or without the connecting portion being provided. This is the same for each of the embodiments and modified examples described below as well.

Figure 14A:
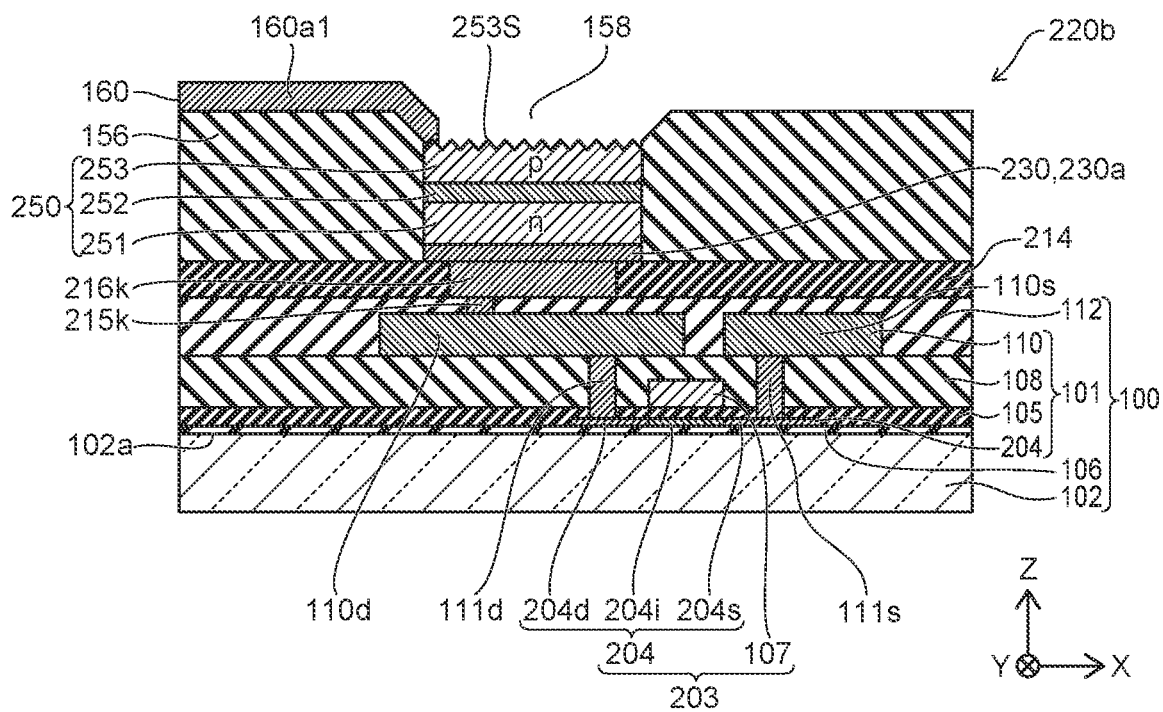
FIG. 14A is a schematic cross-sectional view illustrating a portion of the image display device according to a modified example of the second embodiment.
Figure 14B:
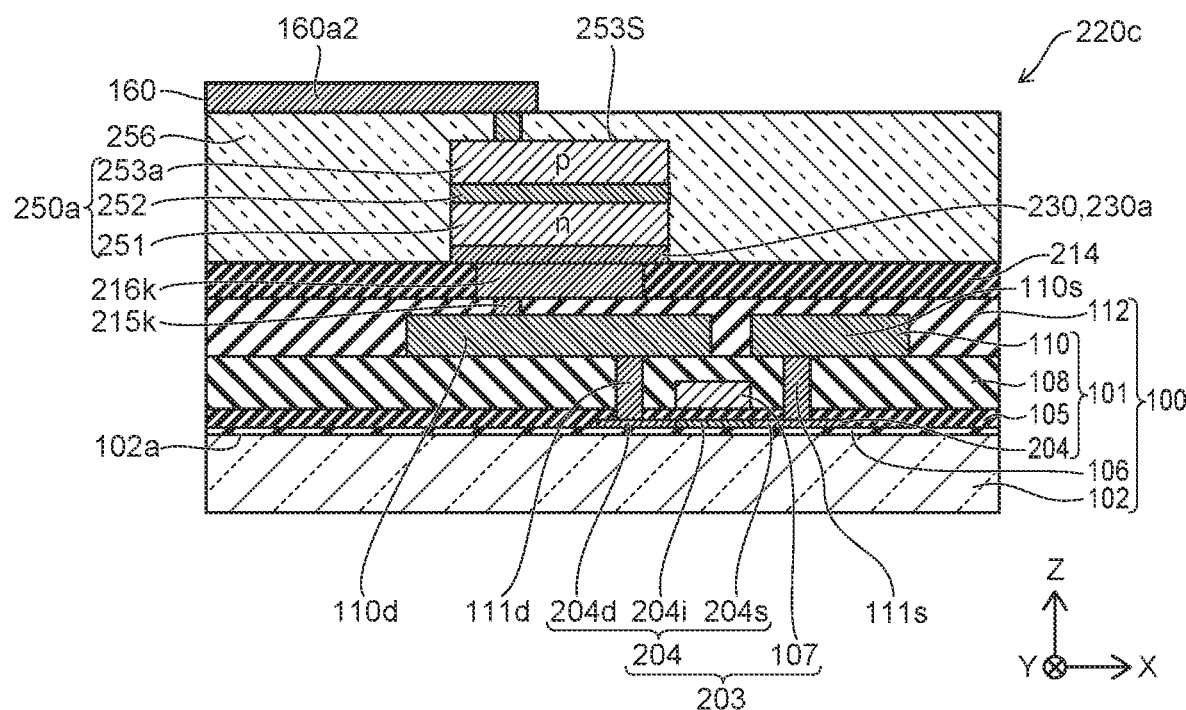
FIG. 14B is a schematic cross-sectional view illustrating a portion of the image display device according to a modified example of the second embodiment.

FIGS. 14A and 14B are schematic cross-sectional views illustrating portions of modified examples of the image display device according to the present embodiment. In the cross-sectional views of the sub-pixels in FIG. 14A and subsequent drawings, illustration of the surface resin layer 170, the transparent thin film adhesive layer 188, and the color filter 180 is omitted in order to avoid complexity. Unless otherwise specified, the surface resin layer 170, the transparent thin film adhesive layer 188, and the color filter 180 are provided on the second interlayer insulating film and the second wiring layer. The same applies to the other embodiments and other modified examples described below as well.

In the case of a sub-pixel 220b of the modified example illustrated in FIG. 14A, the structure of the wiring portion for electrical connection to the light-emitting surface 253S side differs from that of the second embodiment. Other components are the same as those of the second embodiment, are denoted by the same reference signs, and detailed descriptions thereof will be omitted as appropriate.

As illustrated in FIG. 14A, the sub-pixel 220b includes the second wiring layer 160, and the second wiring layer 160 includes a wiring portion 160a1. The wiring layer 160a1 is provided on the second interlayer insulating film 156. In the present modified example, the wiring portion 160a1 is electrically connected to the p-type semiconductor layer 253 by connecting one end of the wiring portion 160a1 to a surface including the light-emitting surface 253S. The surface connecting the one end of the wiring portion 160a1 is coplanar with the light-emitting surface 253S. In the present modified example, the light-transmitting electrode is not provided, and thus the process of forming the light-transmitting electrode can be omitted. The light-emitting surface 253S is preferably roughened as in this example.

In the case of a sub-pixel 220c of the modified example illustrated in FIG. 14B, the configuration of a second interlayer insulating film 256 and a wiring portion 160a2 differs from that of the second embodiment.

As illustrated in FIG. 14B, the sub-pixel 220c includes the second interlayer insulating film 256. The second wiring layer 160 includes the wiring portion 160a2, and the wiring portion 160a2 is provided on the second interlayer insulating film 256. The second interlayer insulating film 256 is a transparent resin. The second interlayer insulating film 256 is not provided with an opening corresponding to the position of the light-emitting surface 253S. The wiring portion 160a2 of the second wiring layer 160 is directly connected to the light-emitting surface 253S.

A light-emitting element 250a emits light from the light-emitting surface 253S via the second interlayer insulating film 256. In the present modified example, the process of forming an opening in the second interlayer insulating film 256 and roughening the surface of the p-type semiconductor layer 253a can be omitted.

The second interlayer insulating film 256 is, for example, formed of a transparent organic insulating material. As a transparent resin material, silicon-based resins such as spin-on glass (SOG), novolac phenolic resin, and the like can be used. As in the other embodiments described above, the second interlayer insulating film 256 is insulation between the light-emitting elements and is provided for protection from the external environment. A front surface of the second interlayer insulating film 256, as in the second interlayer insulating film 156, need only be flat enough to allow formation of the second wiring layer 160.

In any of the modified examples as well, the configuration including the surface resin layer 170, the transparent thin film adhesive layer 188, and the color filter 180 is provided in the same manner as in the other embodiments described above.

Figure 15:
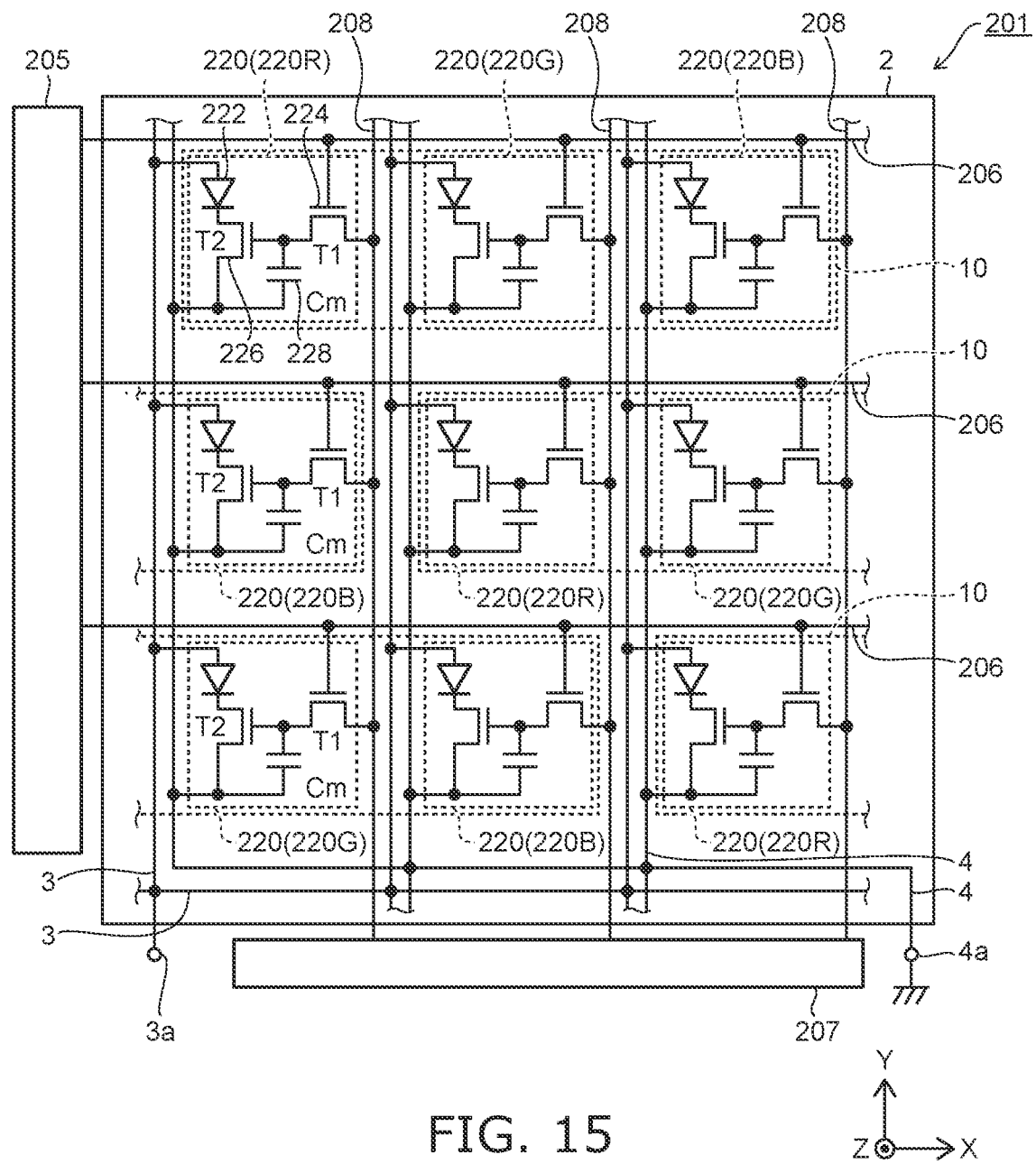
FIG. 15 is a schematic block diagram illustrating the image display device according to the second embodiment.

FIG. 15 is a schematic block diagram illustrating an image display device according to the present embodiment.

As illustrated in FIG. 15, an image display device 201 of the present embodiment includes the display region 2, a row selection circuit 205, and a signal voltage output circuit 207. In the display region 2, a sub-pixel 220 is arrayed in a lattice pattern on the XY plane, for example, as in the other embodiment described above.

The pixel 10, as in the other embodiment described above, includes a plurality of the sub-pixels 220 that emit light of different colors. A sub-pixel 220R emits red light. A sub-pixel 220G emits green light. A sub-pixel 220B emits blue light. The three types of sub-pixels 220R, 220G, 220B emit light at a desired brightness, thereby determining the light emission color and brightness of one pixel 10.

One pixel 10 is formed of the three sub-pixels 220R, 220G, 220B, and the sub-pixels 220R, 220G, 220B are arrayed in a linear shape on the X axis, for example, as in this example. In each pixel 10, sub-pixels of the same color may be arrayed in the same column or, as in this example, sub-pixels of different colors may be arrayed on a per column basis.

The sub-pixel 220 includes a light-emitting element 222, a selection transistor 224, a drive transistor 226, and a capacitor 228. In FIG. 15, the selection transistor 224 may be denoted as T1, the drive transistor 226 may be denoted as T2, and the capacitor 228 may be denoted as Cm.

In the present embodiment, the light-emitting element 222 is provided on the power source line 3 side, and the drive transistor 226 connected in series with the light-emitting element 222 is provided on the ground line 4 side. That is, the drive transistor 226 is connected to a potential side lower than that of the light-emitting element 222. The drive transistor 226 is an n-channel transistor.

The selection transistor 224 is connected between a gate electrode of the drive transistor 226 and a signal line 208. The capacitor 228 is connected between the gate electrode of the drive transistor 226 and the ground line 4.

The row selection circuit 205 and the signal voltage output circuit 207 supply a signal voltage of a polarity different from that of the other embodiment described above to the signal line 208 in order to drive the drive transistor 226 that is an n-channel transistor.

In the present embodiment, the polarity of the drive transistor 226 is the n-channel, and thus the polarity of the signal voltage and the like differ from those of the other embodiment described above. That is, the row selection circuit 205 supplies a selection signal to a scanning line 206, sequentially selecting one row from the array of m rows of the sub-pixels 220. The signal voltage output circuit 207 supplies a signal voltage having the required analog voltage value for each sub-pixel 220 in the selected row. The drive transistor 226 of the sub-pixels 220 of the selected row introduces a current corresponding to the signal voltage to the light-emitting element 222. The light-emitting element 222 emits light at a brightness in accordance with the flowing current.

In the present embodiment, any of the configurations of the sub-pixels 220, 220a, 220b, 220c described above can be included. Further, the embodiments described below may also apply modified examples of sub-pixels as in the present embodiment.

A manufacturing method of the image display device according to the present embodiment will now be described.

FIGS. 16A to 20C are schematic cross-sectional views illustrating the manufacturing method of the image display device according to the present embodiment.

FIGS. 16A to 18B illustrate a procedure of forming a plug on the circuit substrate 1100. In the present embodiment, a formation method of a plug different from the plug formation method described in the first embodiment is employed.

Figure 16A:
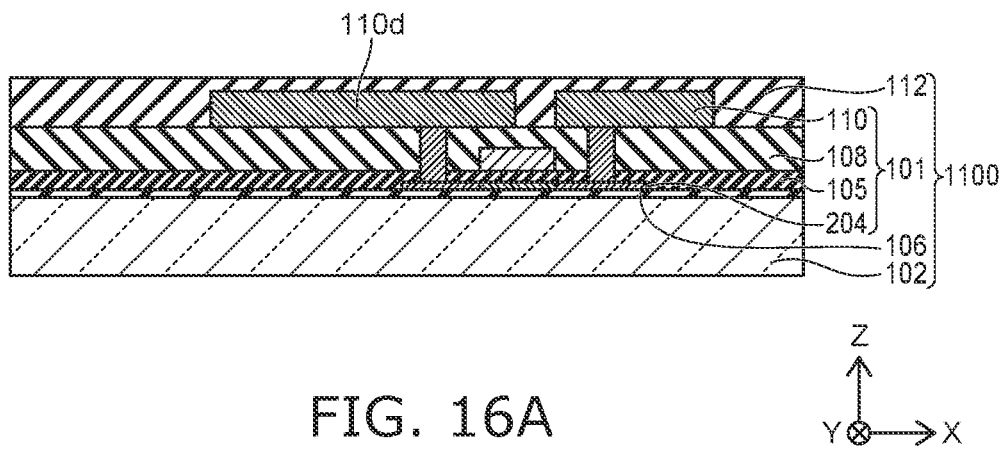
FIG. 16A is a schematic cross-sectional view illustrating a manufacturing method of the image display device according to the second embodiment.

As illustrated in FIG. 16A, the circuit substrate 1100 is prepared. The prepared circuit substrate 1100 may be the same as that in the first embodiment.

Figure 16B:
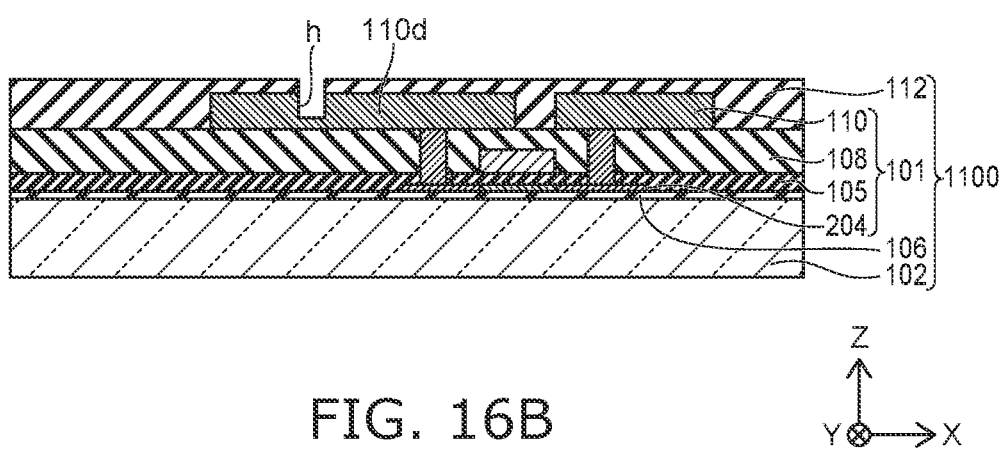
FIG. 16B is a schematic cross-sectional view illustrating the manufacturing method of the image display device according to the second embodiment.

As illustrated in FIG. 16B, the contact hole h is formed in the first interlayer insulating film 112. The location where the contact hole h is formed is a position corresponding to the wiring portion 110d. The contact hole h is formed deeper than the depth reaching the wiring 110d from the first interlayer insulating film 112 as in this example. In a case in which an exposed area of the wiring portion 110d can be sufficiently ensured during formation of the contact hole h, the depth of the contact hole h may be set to a front surface of the wiring portion 110d.

Figure 17A:
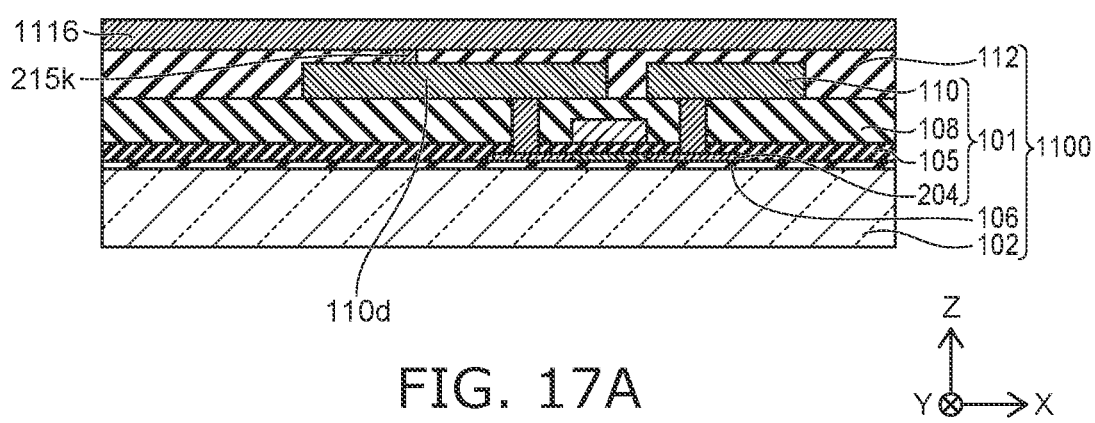
FIG. 17A is a schematic cross-sectional view illustrating the manufacturing method of the image display device according to the second embodiment.

As illustrated in FIG. 17A, a metal layer 1116 is formed over the first interlayer insulating film 112. During formation of the metal layer 1116, the contact hole h illustrated in FIG. 16B is embedded with the same material as that of the metal layer 1116. The connecting portion 215k is formed in the embedded portion.

Figure 17B:
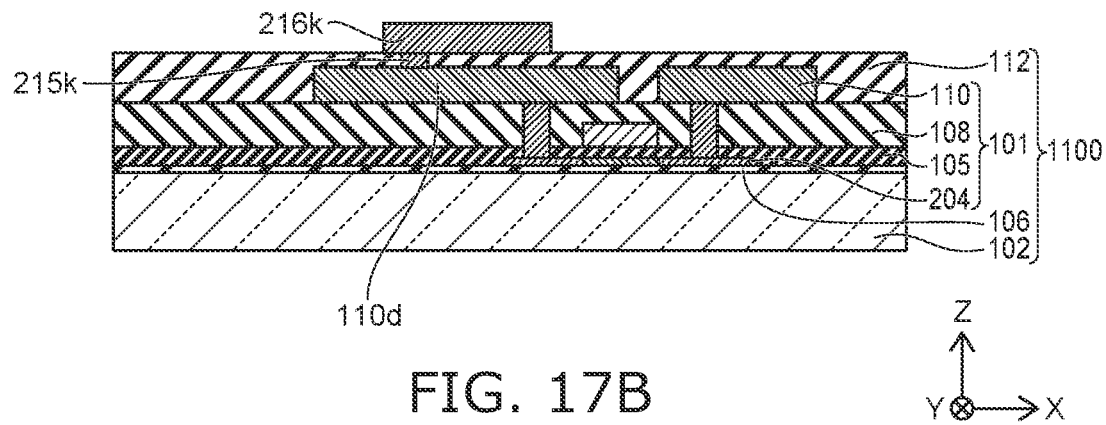
FIG. 17B is a schematic cross-sectional view illustrating the manufacturing method of the image display device according to the second embodiment.

As illustrated in FIG. 17B, the plug 216k is molded into a desired shape from the metal layer 1116 illustrated in FIG. 17A by photolithography, dry etching, or the like.

Figure 18A:
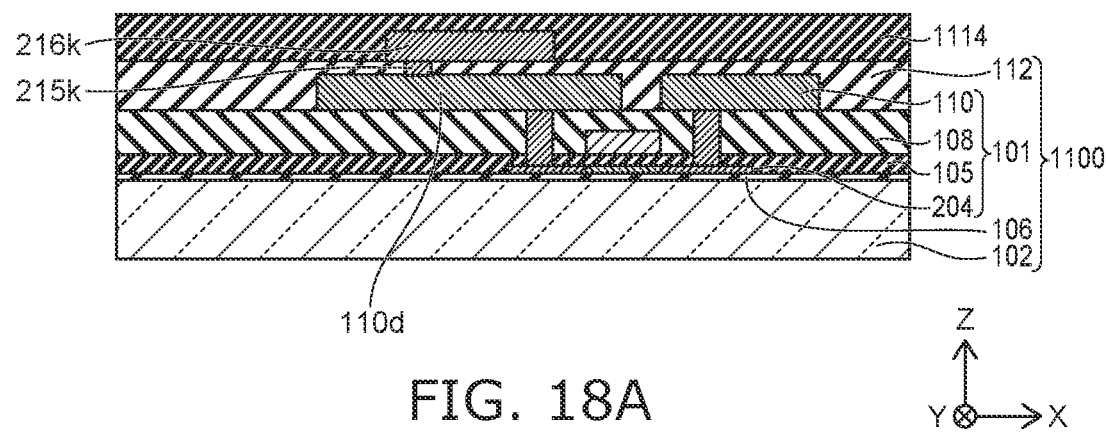
FIG. 18A is a schematic cross-sectional view illustrating the manufacturing method of the image display device according to the second embodiment.

As illustrated in FIG. 18A, a flattening film 1114 is applied, covering the first interlayer insulating film 112 and the plug 216k, and then baked.

Figure 18B:
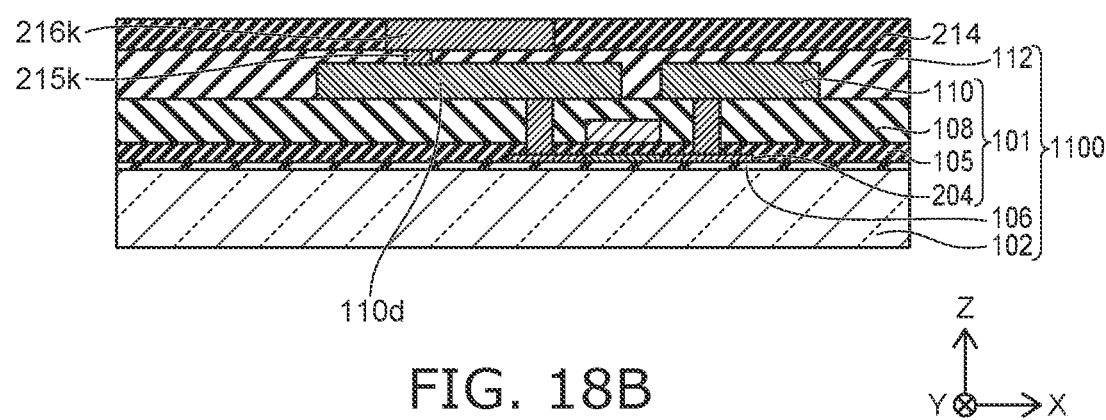
FIG. 18B is a schematic cross-sectional view illustrating the manufacturing method of the image display device according to the second embodiment.

As illustrated in FIG. 18B, a front surface of the flattening film 1114 illustrated in FIG. 18A is polished, exposing a surface of the plug 216k. After the surface of the plug 216k is exposed, the plug 216k and the flattening film 214 are collectively polished and flattened. CMP, for example, is used for polishing the flattening film 1114. In this way, the plug 216k, the connecting portion 215k, and the flattening film 214 are formed.

In the case of the sub-pixel 220a of the modified example illustrated in FIG. 13, in the process illustrated in FIG. 16B, the first interlayer insulating film 112 is etched at least until the front surface of the wiring portion 110d is reached, in accordance with the shape of the plug 216k. Subsequently, as illustrated in FIG. 17A and FIG. 17B, the metal layer 1116 is formed and then the metal layer 1116 is molded into the desired shape of the plug 216k. As illustrated in FIGS. 18A and 18B, the flattening film 1114 is formed and then can be flattened all at once by CMP or the like to form the plug 216k and the flattening film 214.

Subsequently, the process of forming the light-emitting element and the like by bonding a semiconductor growth substrate to a circuit substrate on which a plug is formed will be described.

Figure 19A:
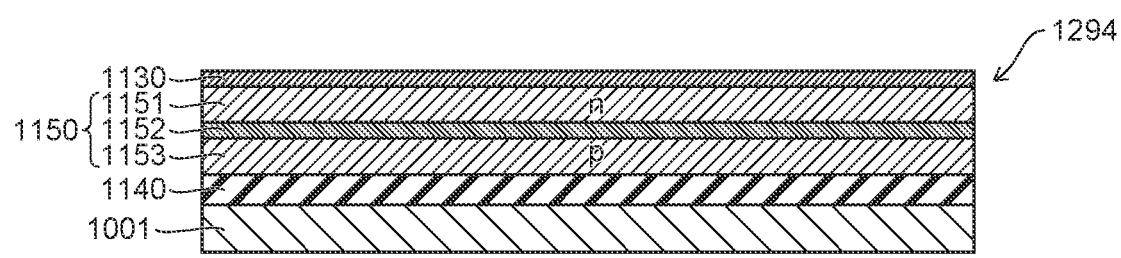
FIG. 19A is a schematic cross-sectional view illustrating the manufacturing method of the image display device according to the second embodiment.

As illustrated in FIG. 19A, a semiconductor growth substrate 1294 is prepared. The semiconductor growth substrate 1294 includes the crystal growth substrate 1001, the buffer layer 1140, and the semiconductor layer 1150. The buffer layer 1140 is formed on the crystal growth substrate 1001. The semiconductor layer 1150 is formed on the buffer layer 1140. The semiconductor layer 1150 includes the p-type semiconductor layer 1153, the light-emitting layer 1152, and the n-type semiconductor layer 1151. The p-type semiconductor layer 1153, the light-emitting layer 1152, and the n-type semiconductor layer 1151 are layered in the order of the p-type semiconductor layer 1153, the light-emitting layer 1152, and the n-type semiconductor layer 1151 from the buffer layer 1140 side. The metal layer 1130 is formed on the exposed surface of the n-type semiconductor layer 1151.

Figure 19B:
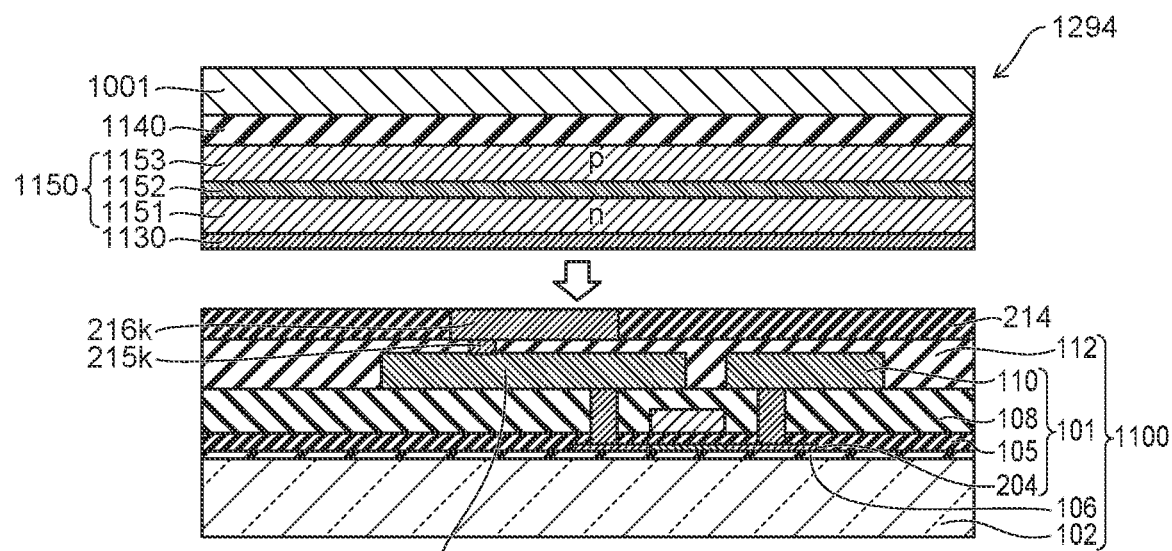
FIG. 19B is a schematic cross-sectional view illustrating the manufacturing method of the image display device according to the second embodiment.

As illustrated in FIG. 19B, the semiconductor growth substrate 1294 on which the metal layer 1130 is formed and the circuit substrate (third substrate) 1100 on which the plug 216k is formed are prepared. The plug 216k of the circuit substrate 1100 and the formed surface of the flattening film 214 are disposed facing the exposed surface of the metal layer 1130 of the semiconductor growth substrate 1294. The surfaces facing each other are bonded to each other. The bonding of the substrates is the same as in the other embodiments described above. Further, the modified example of the manufacturing method described in relation to FIG. 5A to FIG. 5C may be applied. Furthermore, as the semiconductor growth substrate, a substrate in which the semiconductor layer 1150 is directly formed on the crystal growth substrate 1001 without providing the buffer layer 1140 may be used.

Figure 20A:
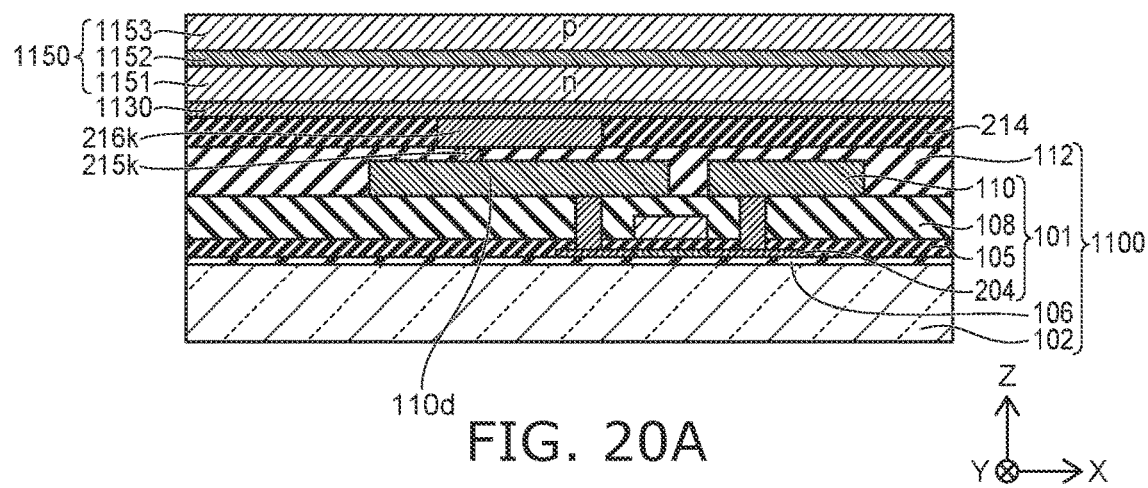
FIG. 20A is a schematic cross-sectional view illustrating the manufacturing method of the image display device according to the second embodiment.

As illustrated in FIG. 20A, the crystal growth substrate 1001 illustrated in FIG. 19B is removed by laser lift-off or the like. In this example, before the semiconductor layer 1150 is etched, the buffer layer 1140 illustrated in FIG. 19B is removed by wet etching or the like. The buffer layer 1140 may be removed after the semiconductor layer 1150 has been etched.

Figure 20B:
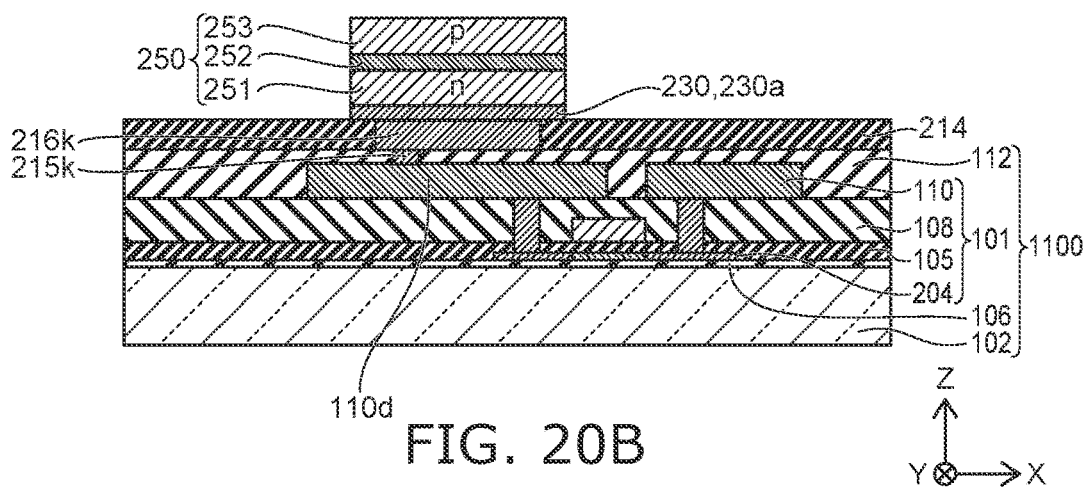
FIG. 20B is a schematic cross-sectional view illustrating the manufacturing method of the image display device according to the second embodiment.

As illustrated in FIG. 20B, the semiconductor layer 1150 and the metal layer 1130 illustrated in FIG. 20A are molded into desired shapes by RIE or the like. The third wiring layer 230 is formed from the metal layer 1130, and the third wiring layer 230 includes the light-reflecting plate 230a. In this example, the semiconductor layer 1150 is overetched, thereby molding the outer periphery of the light-reflecting plate 230a to substantially match the outer periphery of the light-emitting element 250 projected onto the light-reflecting plate 230a in an XY plane view.

In a case in which the semiconductor layer 1150 is not overetched, the semiconductor layer 1150 is etched to form the light-emitting element 250, and then the metal layer 1130 is etched to form the third wiring layer 230. In this case, the outer periphery of the light-emitting element 250 projected onto the light-reflecting plate 230a is located within the outer periphery of the light-reflecting plate 230a in an XY plane view; the outer periphery of the light-reflecting plate 230a can be larger than the outer periphery of the light-emitting element 250.

Figure 20C:
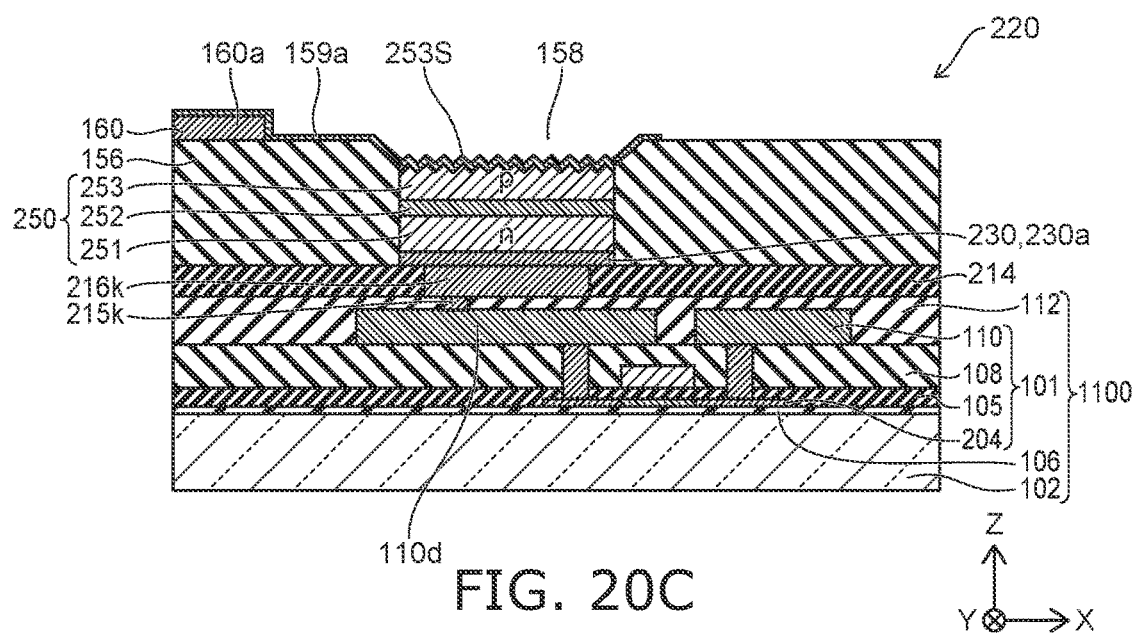
FIG. 20C is a schematic cross-sectional view illustrating the manufacturing method of the image display device according to the second embodiment.

As illustrated in FIG. 20C, the second interlayer insulating film 156 is formed covering the flattening film 214, the third wiring layer 230, and the light-emitting element 250. At a position of the second interlayer insulating film 156 corresponding to the light-emitting element 250, a portion of the second interlayer insulating film 156 is removed by etching to form an opening 158, and the light-emitting surface 253S is exposed from the second interlayer insulating film 156. The exposed light-emitting surface 253S of the p-type semiconductor layer 253 is roughened in order to improve the light emission efficiency.

The second wiring layer 160 is formed on the second interlayer insulating film 156. In the second wiring layer 160, each wiring portion including the wiring portion 160a is formed by photolithography. Note that, in this example, the wiring portion 160a is provided at a position distant from the p-type semiconductor layer 253.

A light-transmitting conductive film covering the second wiring layer 160, the second interlayer insulating film 156, and the light-emitting surface 253S is formed. An ITO film, a ZnO film, or the like is suitably used as the light-transmitting conductive film. The desired light-transmitting electrode 159a is formed by photolithography.

The light-transmitting electrode 159a is provided over the wiring portion 160a. The light-transmitting electrode 159a is formed over the light-emitting surface 253S. The light-transmitting electrode 159a is formed between the wiring portion 160a and the light-emitting surface 253S. Accordingly, the wiring portion 160a and the p-type semiconductor layer 253 are electrically connected by the light-transmitting electrode 159a.

FIGS. 21A to 22B are schematic cross-sectional views illustrating manufacturing methods of the modified examples of the image display device of the present embodiment.

Figure 21A:
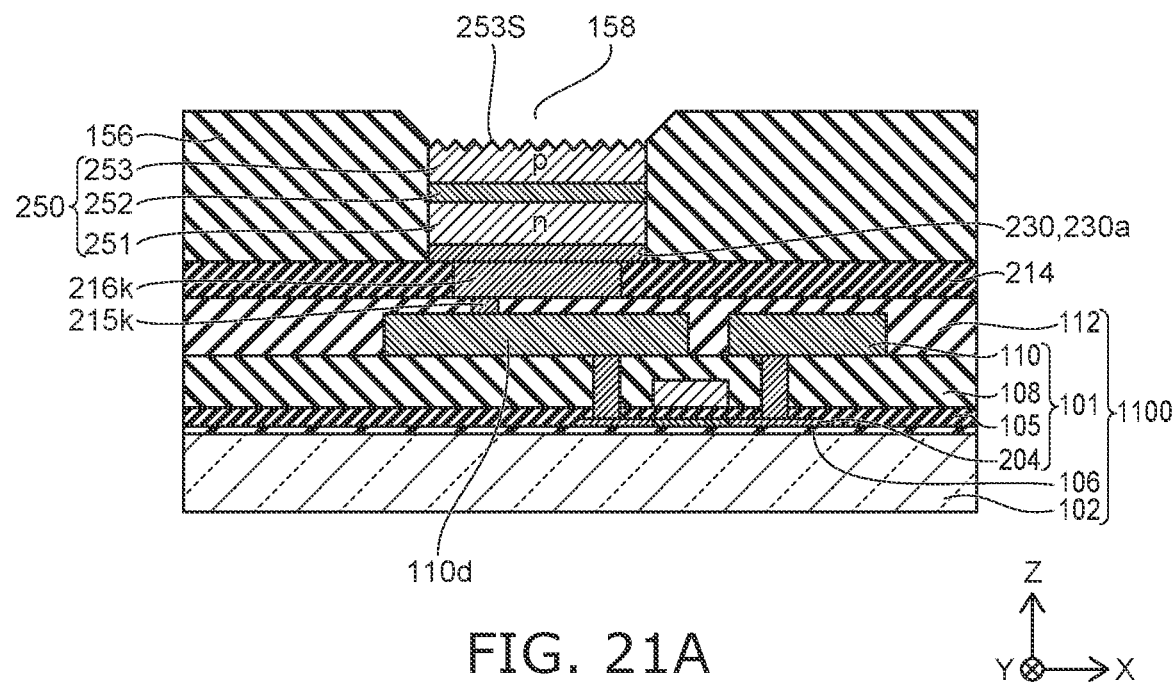
FIG. 21A is a schematic cross-sectional view illustrating a manufacturing method of the modified example of the image display device according to the second embodiment.
Figure 21B:
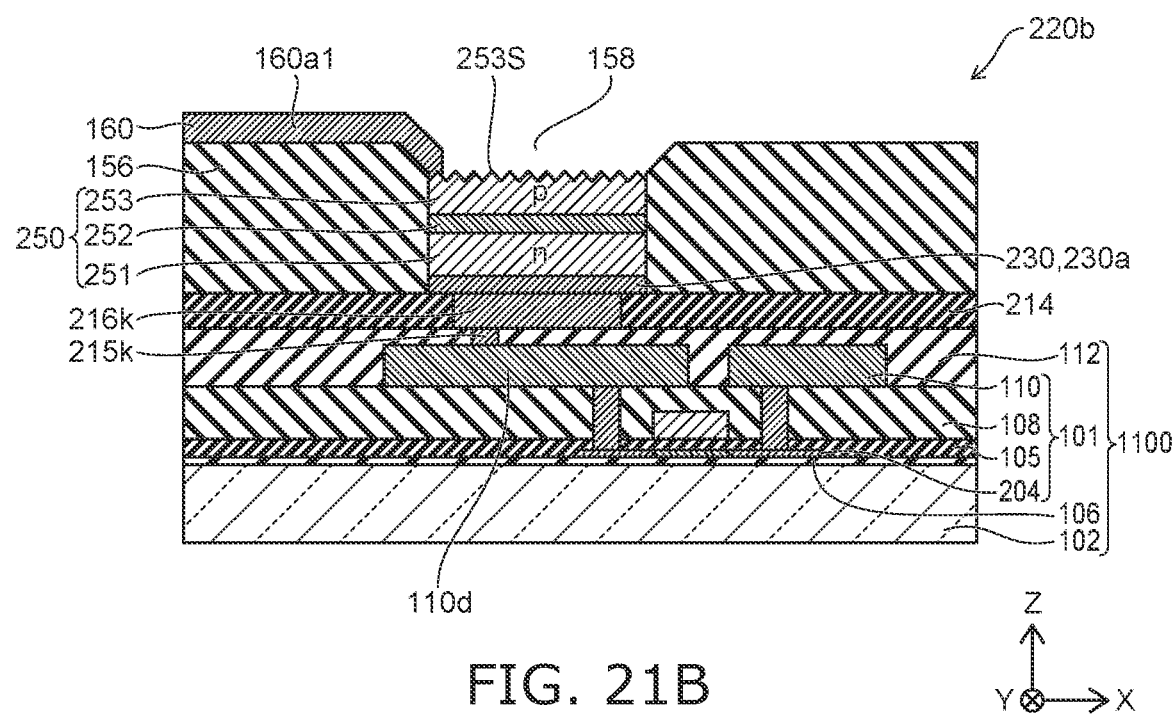
FIG. 21B is a schematic cross-sectional view illustrating a manufacturing method of the modified example of the image display device according to the second embodiment.
Figure 22A:
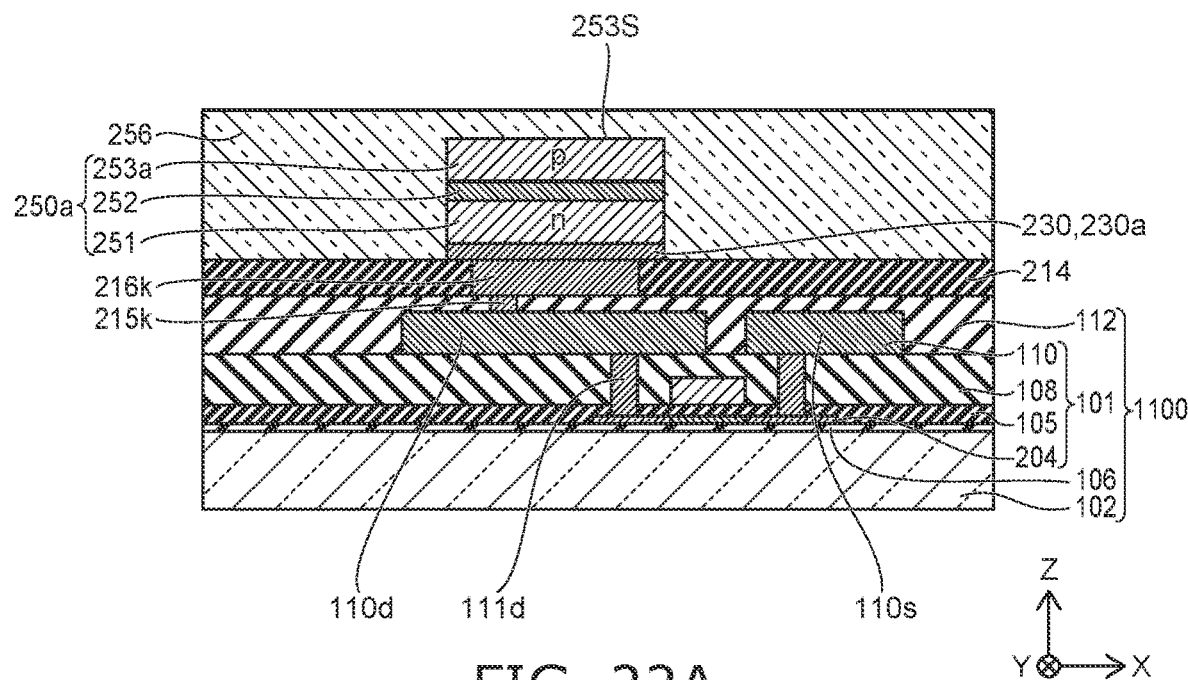
FIG. 22A is a schematic cross-sectional view illustrating the manufacturing method of the modified example of the image display device according to the second embodiment.
Figure 22B:
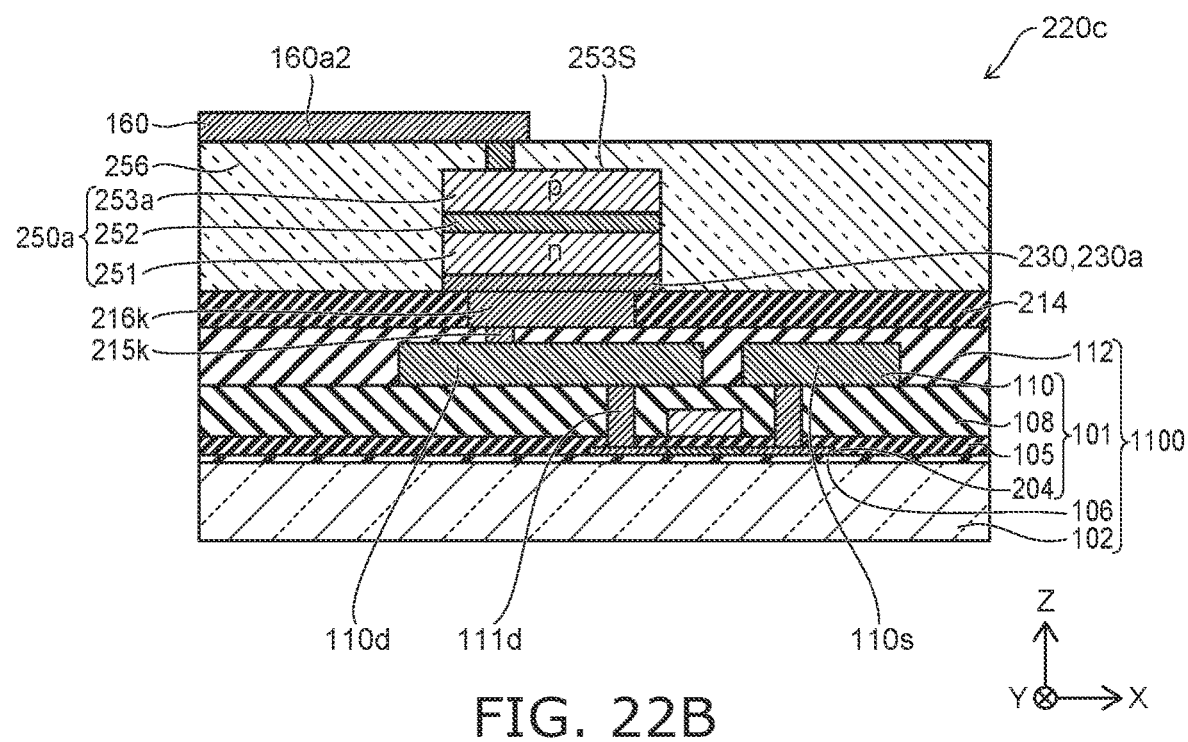
FIG. 22B is a schematic cross-sectional view illustrating the manufacturing method of the modified example of the image display device according to the second embodiment.

FIGS. 21A and 21B illustrate a manufacturing process for forming the sub-pixel 220b of the modified example illustrated in FIG. 14A. FIGS. 22A and 22B illustrate a manufacturing process for forming the sub-pixel 220c of the modified example illustrated in FIG. 14B. All processes in FIGS. 21A and 22A are executed after the processes illustrated in FIG. 20B, and thus the processes following FIG. 20B will be described in the descriptions below.

First, the manufacturing method of the sub-pixel 220*b* will be described.

As illustrated in FIG. 21A, in the sub-pixel 220*b* of the modified example, the second interlayer insulating film 156 is formed covering the flattening film 214, the third wiring layer 230, and the light-emitting element 250, and then the opening 158 is formed. The opening 158 is formed by removing a portion of the second interlayer insulating film 156, thereby exposing the light-emitting surface 253S from the second interlayer insulating film 156. In this example, the light-emitting surface 253S is roughened.

As illustrated in FIG. 21B, the second wiring layer 160 is formed. The second wiring layer 160 includes the wiring portion 160*a*1. The wiring portion 160*a*1 is connected to a surface of the p-type semiconductor layer 253 including the light-emitting surface 253S at one end of the wiring portion 160*a*1. The surface on which the one end of the wiring portion 160*a*1 is connected is parallel to the light-emitting surface 253S.

Subsequently, the manufacturing method of the sub-pixel 220*c* will be described.

As illustrated in FIG. 22A, in the sub-pixel 220*c* of the modified example, the second interlayer insulating film 256 is formed covering the flattening film 214, the third wiring layer 230, and the light-emitting element 250. The second interlayer insulating film 256 is formed of a transparent resin.

As illustrated in FIG. 22B, the contact hole is formed in the second interlayer insulating film 256, and then the second wiring layer 160 is formed. The second wiring layer 160 includes the wiring portion 160*a*2. The wiring portion 160*a*2 is connected to a surface of the p-type semiconductor layer 253 including the light-emitting surface 253S via the contact hole.

Then, the color filter 180 and the like are provided, thereby forming the sub-pixel 220 of the image display device 201 of the present embodiment and the sub-pixels 220*a*, 220*b*, 220*c* of the modified examples.

Effects of the image display device of the present embodiment will now be described. In the image display device of the present embodiment, in addition to the effects of the other embodiment described above, the sub-pixels 220, 220*a*, 220*b*, 220*c* include the light-reflecting plate 230*a* in addition to the plug 216*k*, and thus the plug 216*k* can be made smaller.

Third Embodiment

Figure 23:
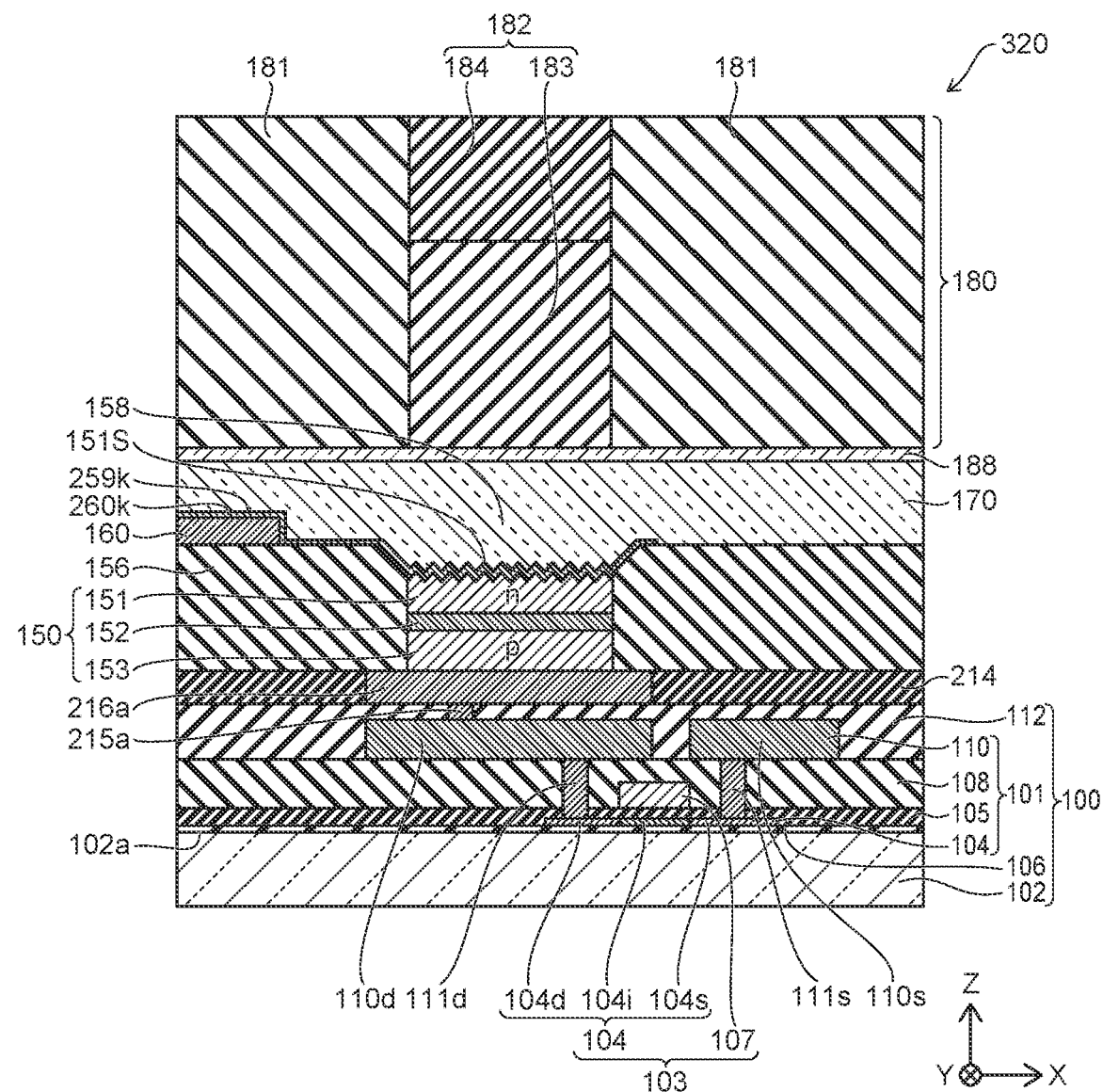
FIG. 23 is a schematic cross-sectional view illustrating a portion of an image display device according to a third embodiment.

FIG. 23 is a schematic cross-sectional view illustrating a portion of an image display device according to the present embodiment.

FIG. 23 schematically illustrates a cross section in a case in which a sub-pixel 320 is cut at a plane parallel to the XZ plane.

In the present embodiment, the light-emitting element 150 differs from those of the second embodiment and the modified examples thereof in being provided on the plug 216*a* without a light-reflecting plate interposed therebetween. Components that are the same as those of the other embodiments described above are denoted by the same reference signs, and detailed descriptions thereof will be omitted as appropriate.

As illustrated in FIG. 23, the sub-pixel 320 of the image display device of the present embodiment includes a transistor 103, the light-emitting element 150, and the plug 216*a*. The transistor 103 is formed on the first surface 102*a* of the substrate 102 as in the other embodiments described above.

The transistor 103 includes the TFT channel 104 and a gate 107. The TFT channel 104 includes regions 104*s*, 104*i*, 104*d*. The regions 104*s*, 104*i*, 104*d* are provided on the TFT lower layer film 106. The region 104*i* is provided between the regions 104*s*, 104*d*. The regions 104*s*, 104*d* are ohmic connected to the vias 111*s*, 111*d*. The transistor is a p-channel TFT.

The gate 107 is provided on the TFT channel 104 with the insulating layer 105 interposed therebetween. The TFT channel 104 and the gate 107 are insulated from each other by the insulating layer 105.

The regions 104*s*, 104*i*, 104*d* of the TFT channel 104 and the gate 107 are formed of the same materials and by the same manufacturing methods as those of the first embodiment.

The vias 111*s*, 111*d* and the wiring portions 110*s*, 110*d* are configured in the same manner as in the second embodiment and the modified examples thereof, and are formed of the same materials and by the same manufacturing methods.

The light-emitting element 150 is provided on the plug 216*a*. The plug 216*a* is connected to the wiring portion 110*d* via the connecting portion 215*a*. The light-emitting element 150 includes the p-type semiconductor layer 153, the light-emitting layer 152, and the n-type semiconductor layer 151. The p-type semiconductor layer 153, the light-emitting layer 152, and the n-type semiconductor layer 151 are layered in the order of the p-type semiconductor layer 153, the light-emitting layer 152, and the n-type semiconductor layer 151 from the side of the plug 216*a* toward the side of the light-emitting surface 151S. Accordingly, the p-type semiconductor layer 153 is electrically connected to the region 104*d* via the plug 216*a*, the connecting portion 215*a*, the wiring portion 110*d*, and the via 111*d*. The wiring portion 110*s* is connected to the power source line 3 of the circuit illustrated in FIG. 2. The wiring portion 110*s* is connected to the region 104*s* through the via 111*s*. Accordingly, the region 104*s* is electrically connected to the power source line 3 through the via 111*s* and the wiring portion 110*s*.

An outer periphery of the light-emitting element 150 is located within the outer periphery of the plug 216*a* includes when the light-emitting element 150 is projected onto the plug 216*a* in an XY plane view. The plug 216*a* functions as a light-reflecting plate. The plug 216*a* reflects light scattering downward of the light-emitting element 150 toward the light-emitting surface 151S side. The plug 216*a* blocks the light scattering downward of the light-emitting element 150, inhibiting the light from reaching circuit elements such as the transistor 103.

The n-type semiconductor layer 151 includes the light-emitting surface 151S, and the light-emitting surface 151S is exposed from the second interlayer insulating film 156 by the opening 158.

The second wiring layer 160 is formed on the second interlayer insulating film 156. The second wiring layer 160 includes a wiring portion 260*k*. The wiring portion 260*k* is connected to the ground line 4 of the circuit illustrated in FIG. 2, for example. A light-transmitting electrode 259*k* is provided over the wiring portion 260*k*. The light-transmitting electrode 259*k* is provided over the light-emitting surface 151S. The light-transmitting electrode 259*k* is provided between the wiring portion 260*k* and the light-emitting surface 151S. Accordingly, the n-type semiconductor layer 151 is electrically connected to the ground line 4 via the light-transmitting electrode 259k and the wiring portion 260k.

The color filter 180 and the like are further provided as in the other embodiments described above.

A manufacturing method of the image display device according to the present embodiment will now be described.

FIGS. 24A to 25C are schematic cross-sectional views illustrating the manufacturing method of the image display device of the present embodiment.

Figure 24A:
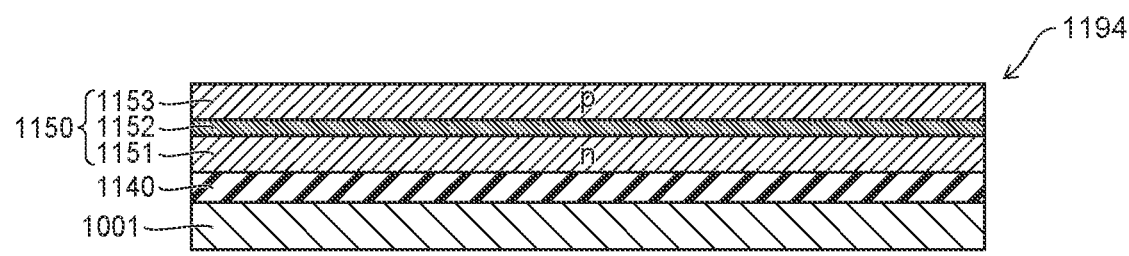
FIG. 24A is a schematic cross-sectional view illustrating a manufacturing method of the image display device according to the third embodiment.

As illustrated in FIG. 24A, a semiconductor growth substrate 1194 is prepared. The semiconductor growth substrate 1194 includes the crystal growth substrate 1001, the buffer layer 1140, and the semiconductor layer 1150. In the semiconductor growth substrate 1194, the buffer layer 1140 is formed on the crystal growth substrate 1001. The semiconductor layer 1150 is formed on the buffer layer 1140. The semiconductor layer 1150 includes the n-type semiconductor layer 1151, the light-emitting layer 1152, and the p-type semiconductor layer 1153. The n-type semiconductor layer 1151, the light-emitting layer 1152, and the p-type semiconductor layer 1153 are layered in the order of the n-type semiconductor layer 1151, the light-emitting layer 1152, and the p-type semiconductor layer 1153 from the buffer layer 1140 side. As in the other embodiments described above, a metal layer may be formed on the exposed surface of the p-type semiconductor layer 1153. In a case in which the metal layer is formed, a light-transmitting conductive film may be provided between the p-type semiconductor layer 1153 and the metal layer.

Figure 24B:
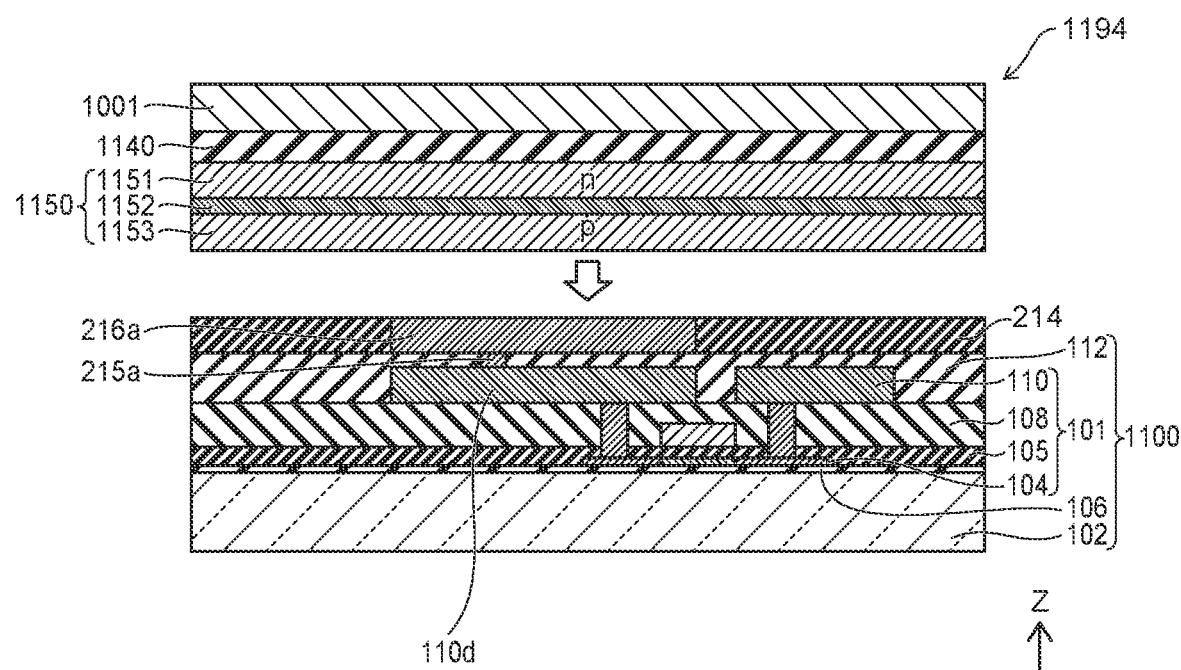
FIG. 24B is a schematic cross-sectional view illustrating the manufacturing method of the image display device according to the third embodiment.

As illustrated in FIG. 24B, the semiconductor growth substrate 1194 and the circuit substrate (second substrate) 1100 on which the plug 216a is formed are prepared. The plug 216a and the connecting portion 215a are formed by applying the manufacturing processes described in relation to FIGS. 16A to 18B.

The prepared semiconductor growth substrate 1194 and the circuit substrate 1100 on which the plug 216a is formed are bonded to each other. The bonding surface of the semiconductor growth substrate 1194 is an exposed surface of the p-type semiconductor layer 1153. The exposed surface of the p-type semiconductor layer 1153 faces the surface on which the light-emitting layer 1152 is provided. The bonding surface of the circuit substrate 1100 on which the plug 216a is formed is the flattened surface of the plug 216a and the flattening film 214.

Figure 25A:
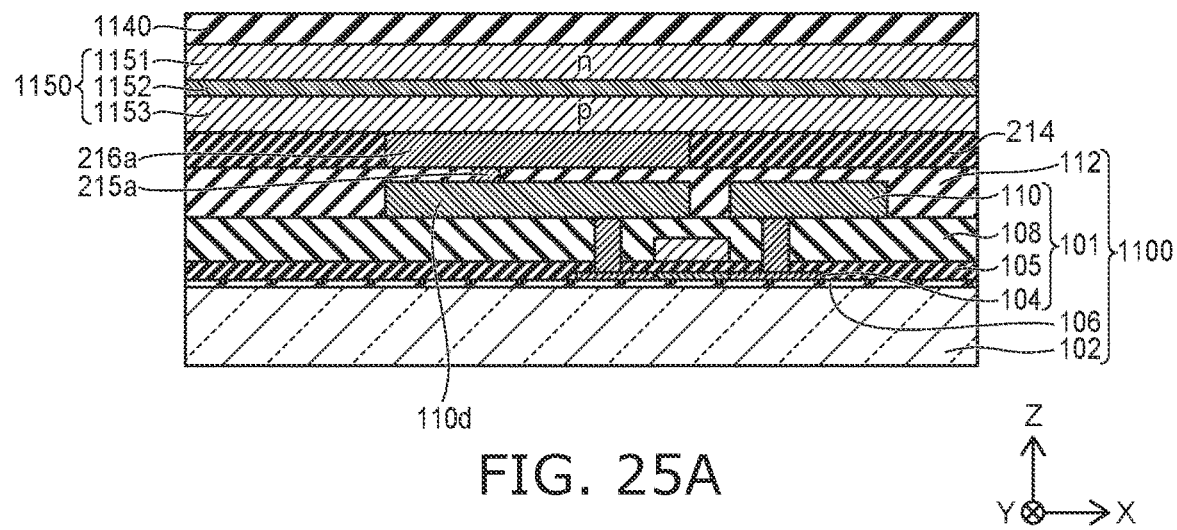
FIG. 25A is a schematic cross-sectional view illustrating the manufacturing method of the image display device according to the third embodiment.

As illustrated in FIG. 25A, after the wafer bonding of the semiconductor layer 1150 and the circuit substrate 1100, the crystal growth substrate 1001 is removed.

Figure 25B:
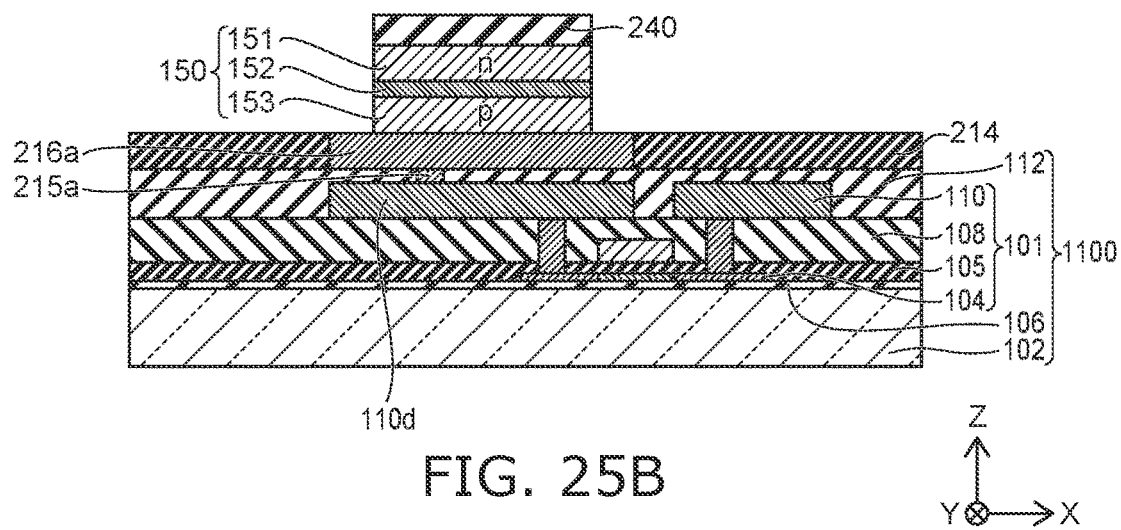
FIG. 25B is a schematic cross-sectional view illustrating the manufacturing method of the image display device according to the third embodiment.

As illustrated in FIG. 25B, the semiconductor layer 1150 illustrated in FIG. 25A is etched, forming the light-emitting element 250. In this example, the buffer layer 1140 and the semiconductor layer 1150 illustrated in FIG. 25A are molded simultaneously by RIE or the like.

Figure 25C:
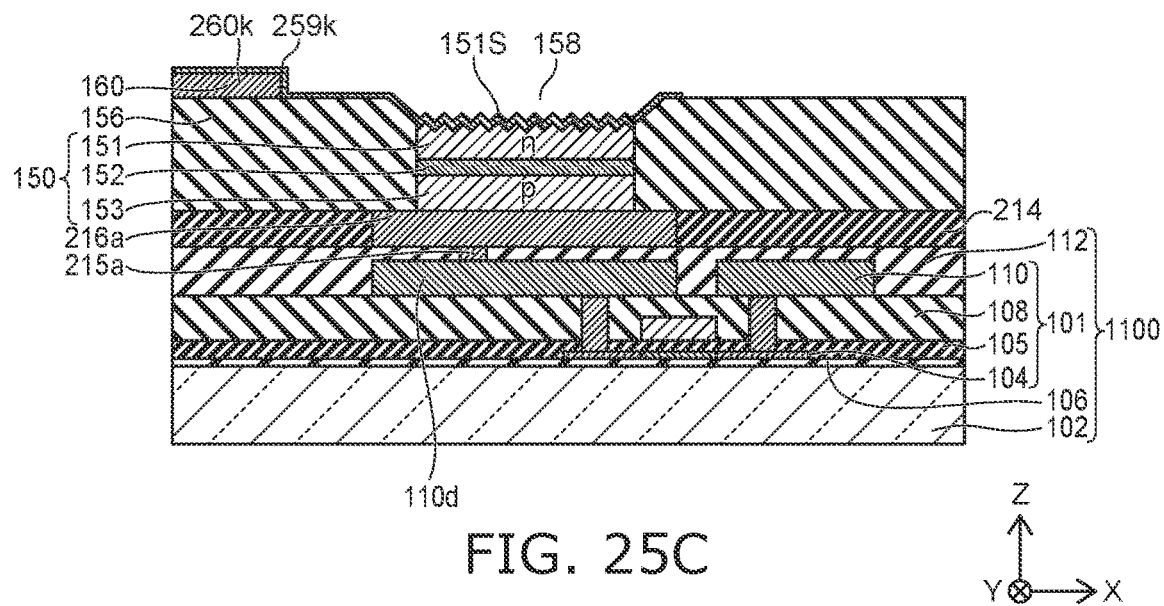
FIG. 25C is a schematic cross-sectional view illustrating the manufacturing method of the image display device according to the third embodiment.

As illustrated in FIG. 25C, the buffer layer 240 is removed, and then the second interlayer insulating film 156 covering the flattening film 214, the plug 216a, and the light-emitting element 150 is formed. A portion of the second interlayer insulating film 156 is removed, thereby forming the opening 158 in the second interlayer insulating film 156, and the light-emitting surface 151S exposed from the opening 158 is roughened. Subsequently, the second wiring layer 160 including the wiring portion 260k is formed, and the light-transmitting electrode 259k is formed on the second wiring layer 160 by an ITO film or the like.

Effects of the image display device of the present embodiment will now be described. The present embodiment has the same effects as those of the other embodiments described above. In addition, because the plug 216a is utilized as a light-reflecting plate, the process of forming the light-reflecting plate separately can be omitted.

Because a light-reflecting plate is not provided between the plug 216a and the p-type semiconductor layer 153, the resistance between the p-type semiconductor layer 153 and the transistor 103 can be reduced.

Fourth Embodiment

Figure 26:
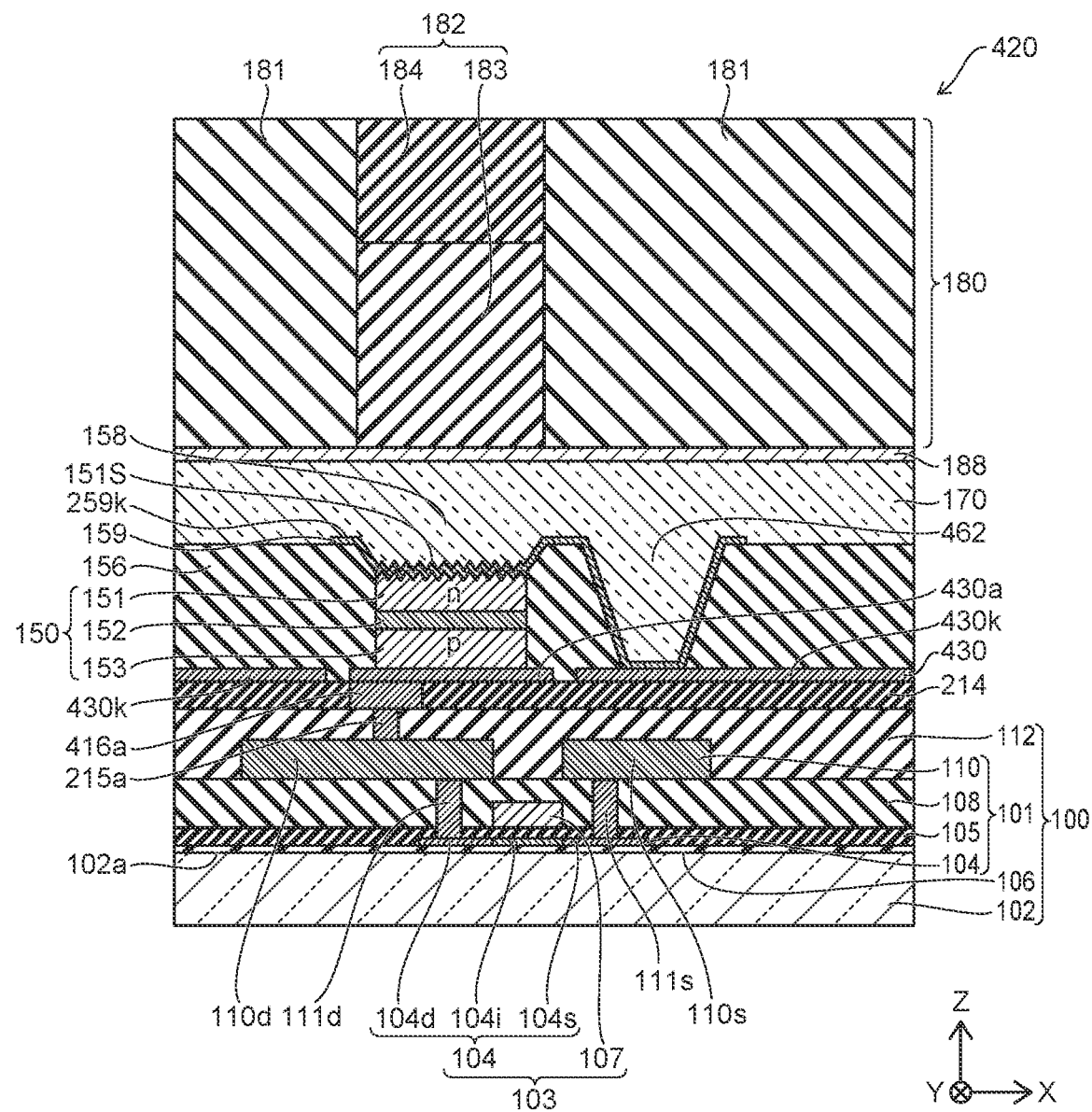
FIG. 26 is a schematic cross-sectional view illustrating a portion of an image display device according to a fourth embodiment.

FIG. 26 is a schematic cross-sectional view illustrating a portion of an image display device according to the present embodiment.

FIG. 26 schematically illustrates a cross section in a case in which a sub-pixel 420 is cut at a plane parallel to the XZ plane.

In the present embodiment, the configuration of the light-emitting element 150 is the same as that of the third embodiment. That is, the light-emitting element 150 includes the p-type semiconductor layer 153, the light-emitting layer 152, and the n-type semiconductor layer 151 layered from the lower layer toward the upper layer. The transistor 103 for driving the light-emitting element 150 is a p-channel transistor, and the circuit configuration illustrated in FIG. 2 is applied to the drive circuit of the sub-pixel 420, for example. Components that are the same as those of the other embodiments described above are denoted by the same reference signs, and detailed descriptions thereof will be omitted as appropriate.

As illustrated in FIG. 26, the sub-pixel 420 of the image display device of the present embodiment includes the transistor 103, the light-emitting element 150, a third wiring layer 430, and a plug 416a. In the present embodiment, the p-type semiconductor layer 153 is connected to a drain electrode of the transistor 103 via a wiring portion 430a of the third wiring layer 430 and the plug 416a. The n-type semiconductor layer 151 is connected to the ground line 4 of the circuit illustrated in FIG. 2, for example, via the light-transmitting electrode 259k of the second wiring layer 159 and a wiring portion 430k of the third wiring layer 430.

The structure of the transistor 103, the structure of the upper portion of the transistor 103, and the structure of the wiring portions in the circuit substrate 100 are the same as those of the third embodiment described above, and detailed description thereof will be omitted.

The flattening film 214 and the plug 416k are formed on the first interlayer insulating film 112. The flattening film 214 is also provided on a lateral surface of the plug 416a. That is, the plug 416a is embedded in the flattening film 214. The exposed surface of the plug 416a from the flattening film 214 is formed in substantially the same plane as that of the flattening film 214. This plane is substantially parallel to the XY plane. The plug 416a is connected to the wiring portion 110d by the connecting portion 215a provided in the first interlayer insulating film 112.

The third wiring layer (third wiring layer) 430 is provided on the flattening film 214 and the plug 416a. The third wiring layer 430 includes the wiring portions 430a and 430k. The wiring portion 430a is provided on the plug 416a, and the wiring portion 430a and the plug 416a are electrically connected.

The light-emitting element 150 is provided on the wiring portion 430a. The light-emitting element 150 is layered in the order of the p-type semiconductor layer 153, the light-emitting layer 152, and the n-type semiconductor layer 151 from the side of the wiring layer 430a toward the side of the light-emitting surface 151S. That is, the top of the wiring portion 430a is connected to the p-type semiconductor layer 153. Preferably, the wiring portion 430a is ohmic connected to the p-type semiconductor layer 153 and is connected to the wiring portion 110d via the plug 416a and the connecting portion 215a.

The wiring portion 430a also functions as a light-reflecting plate. That is, the outer periphery of the light-emitting element 150 projected onto the wiring portion 430a is located within an outer periphery of the wiring portion 430a includes in an XY plane view.

The wiring portion 430k is connected to the ground line 4 of the circuit illustrated in FIG. 2, for example. The wiring portion 430k surrounds the wiring portion 430a, for example.

The second interlayer insulating film 156 is formed on the flattening film 214, the third wiring layer 430, and the light-emitting element 150. The second interlayer insulating film 156 includes the openings 158, 462. The opening 158 is provided at a position corresponding to the light-emitting element 150. The opening 158, with a portion of the second interlayer insulating film 156 being removed, exposes the light-emitting surface 151S from the second interlayer insulating film 156. The opening 462 is provided at a position corresponding to the wiring portion 430k. The opening 462, with a portion of the second interlayer insulating film 156 being removed, exposes a portion of the wiring portion 430k from the second interlayer insulating film 156.

The light-transmitting electrode 259k is provided over the light-emitting surface 151S. The light-transmitting electrode 259k is provided over the wiring portion 430k exposed from the second interlayer insulating film 156 via the opening 462. The light-transmitting electrode 259k is provided across the wiring portion 430k exposed from the light-emitting surface 151S and the second interlayer insulating film 156. The light-transmitting electrode 259k electrically connects the n-type semiconductor layer 151 and the wiring portion 430k.

Modified Example of Sub-Pixel

Figure 27:
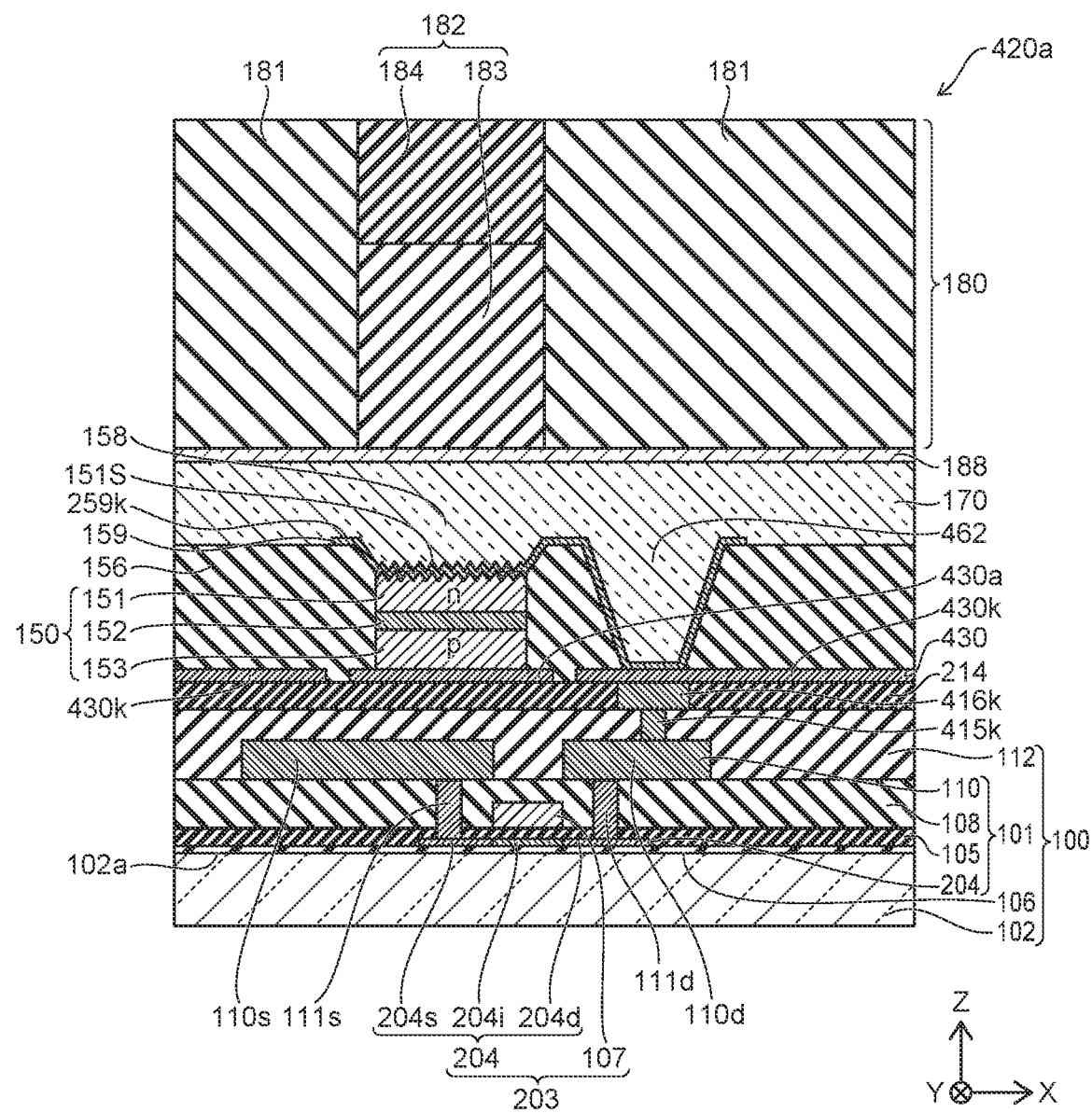
FIG. 27 is a schematic cross-sectional view illustrating a portion of a modified example of the image display device according to the fourth embodiment.

FIG. 27 is a schematic cross-sectional view illustrating a portion of a modified example of the image display device according to the present embodiment.

In this modified example, the light-emitting element 150 differs from that of the fourth embodiment described above in being driven by the transistor 203 of an n-channel. The configuration of the light-emitting element 150 is the same as that of the fourth embodiment. The circuit configuration illustrated in FIG. 15, for example, is applied to the drive circuit that drives the light-emitting element 150 by the transistor 203.

In the modified example of this sub-pixel, a sub-pixel 420a includes a plug 416k. The plug 416k is connected to the wiring portion 110d via a connecting portion 415k.

The wiring portion 430k is provided on the plug 416k, and the plug 416k is electrically connected to the wiring portion 430k. The wiring portion 430k is exposed from the second interlayer insulating film 156 via the opening 462. The wiring portion 430k exposed from the second interlayer insulating film 156 is connected to the light-transmitting electrode 259k. The light-transmitting electrode 259k is provided over the light-emitting surface 151S and connected to the n-type semiconductor layer 151.

The p-type semiconductor layer 153 is provided on the wiring portion 430a, and the p-type semiconductor layer 153 is electrically connected to the wiring portion 430a. The wiring portion 430a is electrically connected to the power source line 3 illustrated in FIG. 15, for example. That is, in the present modified example, a drive circuit such as illustrated in FIG. 15 that drives the light-emitting element 150 provided on the power source line 3 side by the transistor 203 provided on the ground line 4 side is applied.

A manufacturing method of the image display device according to the present embodiment will now be described.

Figure 28A:
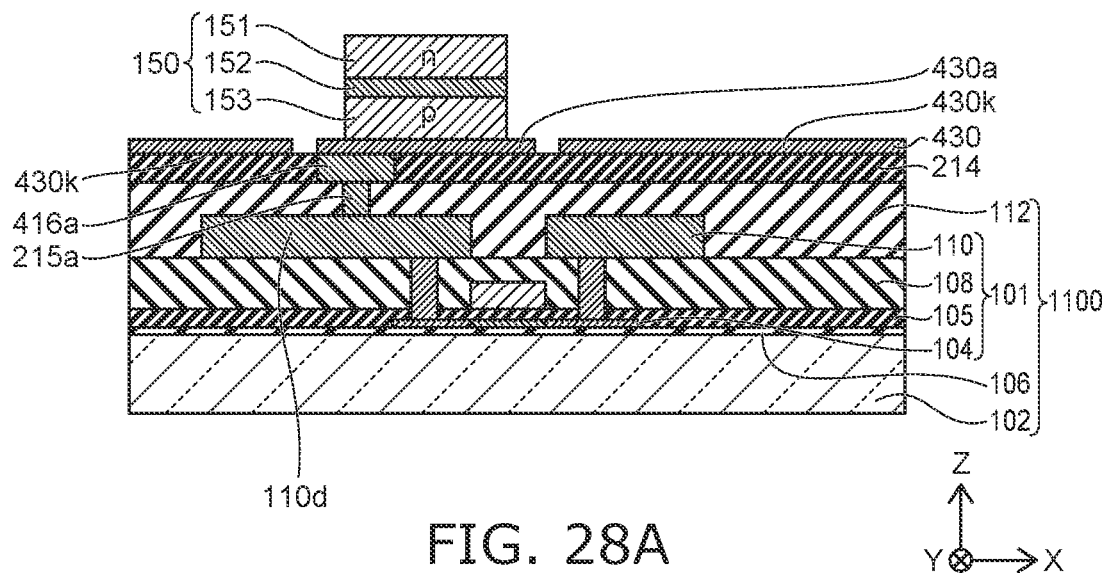
FIG. 28A is a schematic cross-sectional view illustrating a manufacturing method of the image display device according to the fourth embodiment.
Figure 28B:
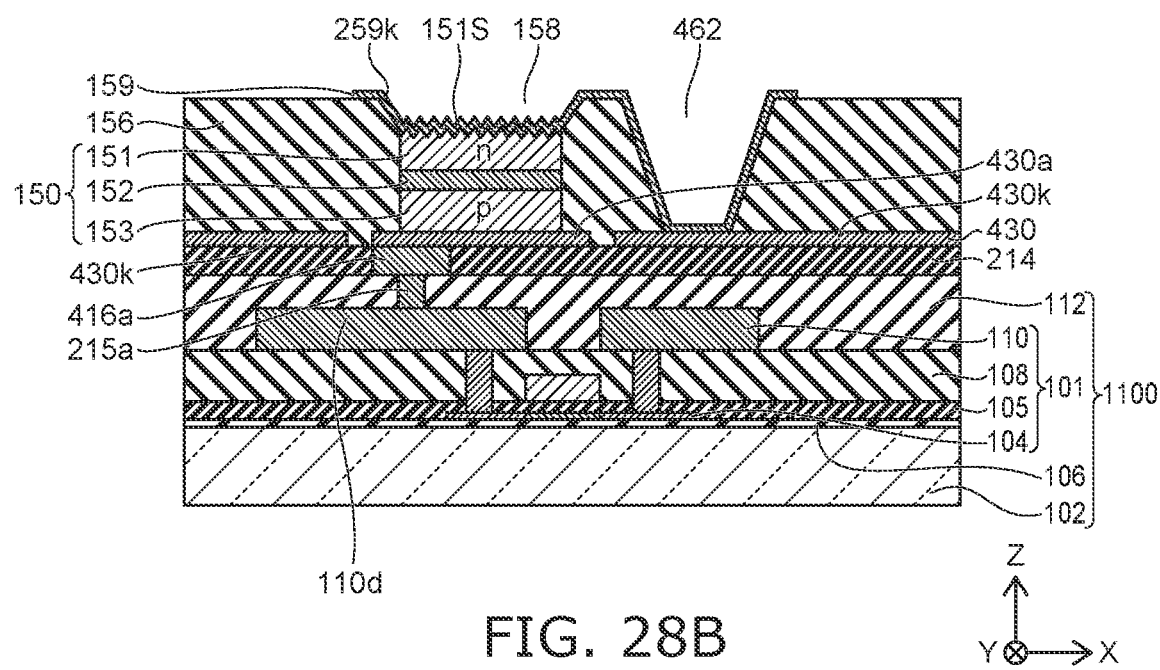
FIG. 28B is a schematic cross-sectional view illustrating the manufacturing method of the image display device according to the fourth embodiment.

FIGS. 28A and 28B are schematic cross-sectional views illustrating the manufacturing method of the image display device of the present embodiment.

In the present embodiment, the processes up to the semiconductor layer 1150 on which the metal layer 1130 is formed being bonded to the circuit substrate 1100 on which the plug is formed are the same as those in the second embodiment, for example, described above, as illustrated in FIG. 19A to FIG. 20A. Hereinafter, the manufacturing processes following the wafer bonding and the removal of the crystal growth substrate 1001 will be described. Note that, in the second embodiment, while the p-type semiconductor layer 1153 is formed on the crystal growth substrate 1001 side as illustrated in FIGS. 19A to 20A and the like, in the present embodiment, a semiconductor growth substrate in which the n-type semiconductor layer 1151 is formed on the crystal growth substrate 1001 side, and the metal layer 1130 is formed on the exposed surface of the p-type semiconductor layer 1153, as illustrated in FIG. 3A and the like, is used. A layer of a conductive thin film having hole injection properties may be provided between the p-type semiconductor layer 1153 and the metal layer 1130.

As illustrated in FIG. 28A, the semiconductor layer 1150 is processed by RIE or the like to form the light-emitting element 150. After formation of the light-emitting element 150, the metal layer 1130 is processed by dry etching or wet etching to form the third wiring layer 430 including the wiring portions 430a, 430k.

As illustrated in FIG. 28B, the second interlayer insulating film 156 is formed, covering the third wiring layer 430, the flattening film 214, and the light-emitting element 150.

The openings 158, 462 are formed in the second interlayer insulating film 156. A portion of the second interlayer insulating film 156 is etched until the opening 158 reaches the n-type semiconductor layer 151, exposing the light-emitting surface 151S from the second interlayer insulating film 156. The light-emitting surface 151S is roughened. A portion of the second interlayer insulating film 156 is etched until the opening 462 reaches the wiring portion 430k, exposing the wiring portion 430k from the second interlayer insulating film 156.

The second wiring layer 159 is formed on the second interlayer insulating film 156. The second wiring layer 159 includes the light-transmitting electrode 259k. The light-transmitting electrode 259k electrically connects the n-type semiconductor layer 151 and the wiring portion 430k.

Thereafter, the color filter is formed as in the other embodiments.

In this way, the image display device of the present embodiment can be manufactured.

Effects of the image display device of the present embodiment will now be described. The image display device of the present embodiment achieves the same effects as those of the other embodiments described above, and further has the following effects.

The sub-pixel 420 of the image display device of the present embodiment is electrically connected on the light-emitting surface 151S side by the light-transmitting electrode 259k, and electrically connected on the side of the surface facing the light-emitting surface 151S via the wiring portion 430a, the plug 416a, and the connecting portion 215a. Therefore, all wiring portions on the light-emitting surface 151S side can be light-transmitting electrodes, making it possible to improve the light emission efficiency of the light-emitting element 150 and reduce the cost of the wiring process.

By using light-transmitting electrodes for all wiring layers on the light-emitting surface 151S side and using the third wiring layer 430 that is an inner layer for wiring portions such as the power source line and the ground line, the degree of freedom of the wiring pattern of the power source line, the ground line, and the like can be improved, and thus improving the design efficiency of the image display device.

With regard to the sub-pixel 420a of the modified example as well, the electrical connection on the light-emitting surface 151S side is made by the light-transmitting electrode 259k, making it possible to improve the light emission efficiency of the light-emitting element 150 and reduce the wiring process cost. Further, by changing the connection destinations of the plugs 430k, 416k, an appropriate circuit can be selected as the drive circuit as desired.

Fifth Embodiment

In an image display device of the present embodiment, circuit elements such as a transistor is formed on a flexible substrate instead of a glass substrate. In other respects, components that are the same as those of the other embodiments described above are denoted by the same reference signs, and detailed descriptions thereof will be omitted as appropriate.

Figure 29:
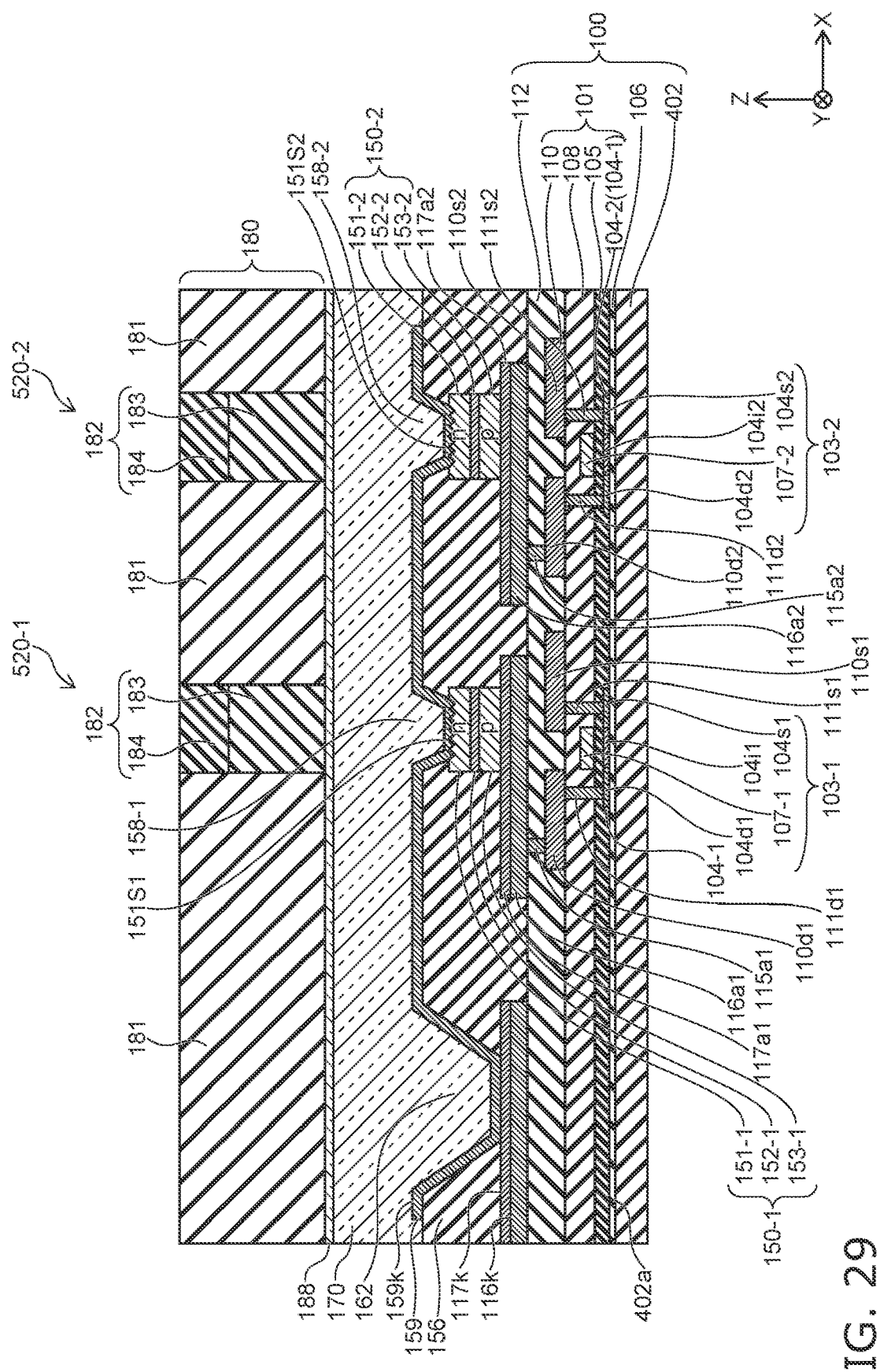
FIG. 29 is a schematic cross-sectional view illustrating a portion of an image display device according to a fifth embodiment.

FIG. 29 is a schematic cross-sectional view illustrating a portion of the image display device according to the present embodiment.

FIG. 29 schematically illustrates a cross section when sub-pixels 520-1, 520-2 are cut at a plane parallel to the XZ plane.

As illustrated in FIG. 29, the image display device of the present embodiment includes the sub-pixels 520-1. 520-2. The sub-pixels 520-1, 520-2 include a substrate 402 that is common to both. The substrate 402 includes the first surface 402a. Circuit elements such as the transistors 103-1, 103-2 are provided on the first surface 402a. In the sub-pixels 520-1, 520-2, an upper structure including circuit elements, wiring layers, and the like is formed on the first surface 402a.

The substrate 402 is flexible. The substrate 402 is, for example, formed of a polyimide resin. The first interlayer insulating film 112, the second interlayer insulating film 156, the first wiring layer 110, the second wiring layer 159, and the like are preferably formed of a material having a certain degree of flexibility in accordance with the flexibility of the substrate 402. Note that the element having the highest risk of destruction during bending is the first wiring layer 110 having the longest wiring length. Therefore, it is desirable to adjust various film thicknesses, film qualities, and material qualities, thereby positioning, on the first wiring layer 110, a neutral surface including a plurality of protective films and the like added to the front surface and the back surface as needed.

In this example, the structure above the TFT lower layer film 106 is the same as that in the first embodiment described above. Configurations of the other embodiments can also be readily applied.

A manufacturing method of the image display device according to the present embodiment will now be described.

Figure 30A:
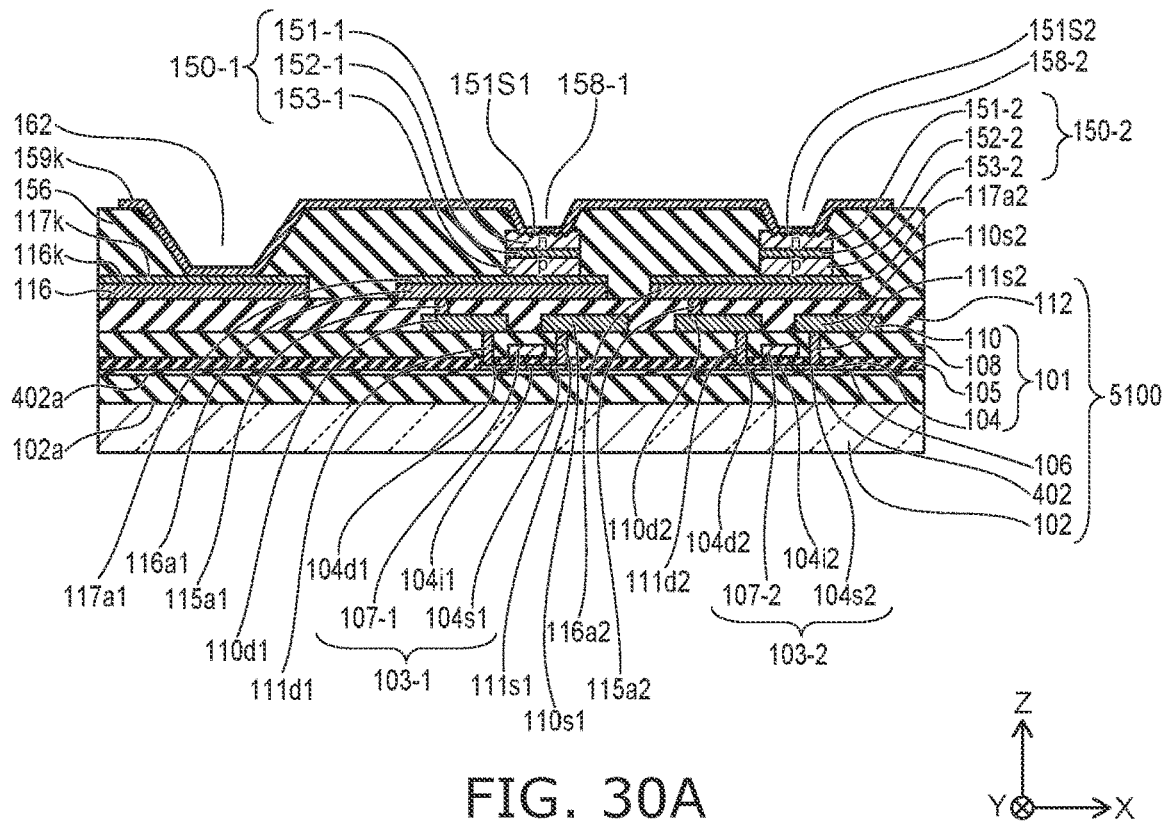
FIG. 30A is a schematic cross-sectional view illustrating a manufacturing method of the image display device according to the fifth embodiment.
Figure 30B:
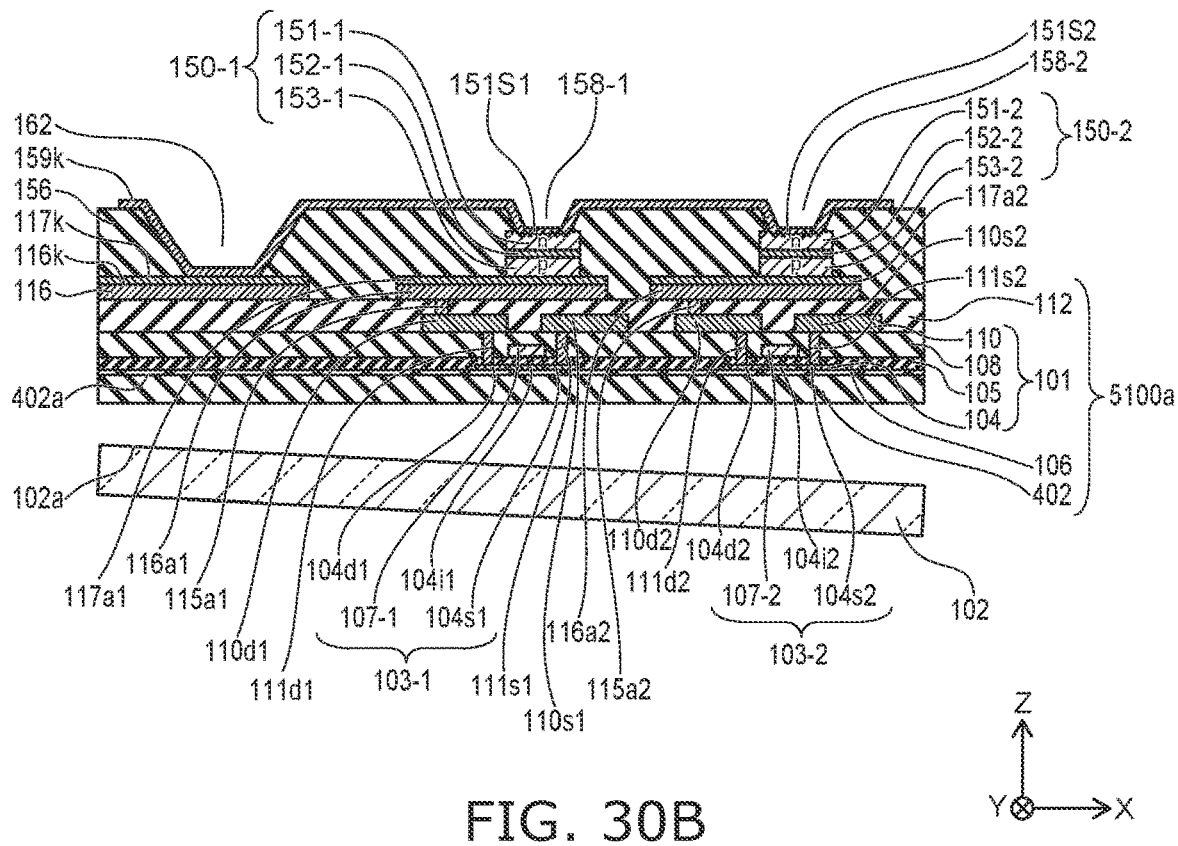
FIG. 30B is a schematic cross-sectional view illustrating the manufacturing method of the image display device according to the fifth embodiment.

FIGS. 30A and 30B are schematic cross-sectional views illustrating the manufacturing method of the image display device of the present embodiment.

As illustrated in FIG. 30A, in the present embodiment, a circuit substrate 5100 different from those of the other embodiments described above is prepared. The circuit substrate (third substrate) 5100 includes the two layers of the substrates 102, 402. As described above, the substrate 102 is, for example, a glass substrate. The substrate (fourth substrate) 402 is provided on the first surface 102a of the substrate 102. For example, the substrate 402 is formed by, for example, applying and then baking a polyimide material on the first surface 102a of the substrate 102. An inorganic film such as $SiN_x$ may be further interposed between the two layers of the substrates 102, 402. The TFT lower layer film 106, the circuit 101, and the first interlayer insulating film 112 are provided on the first surface 402a of the substrate 402. The first surface 402a of the substrate 402 is the surface facing the surface on which the substrate 102 is provided.

In such a circuit substrate 5100, an upper structure of the sub-pixels 520-1, 520-2 is formed by applying the processes described in FIGS. 3A to 11D, for example.

As illustrated in FIG. 30B, the substrate 102 is removed from the structure in which an upper structure including the color filter (not illustrated) and the like are formed, forming a new circuit substrate 5100a. To remove the substrate 102, laser lift-off is used, for example. Removal of the substrate 102 is not limited to the point in time described above, and can be performed at another appropriate point in time. For example, the substrate 102 may be removed after wafer bonding or before formation of the color filter. By removing the substrate 102 at an earlier point in time, defects such as cracking and chipping during the manufacturing process can be reduced.

Effects of the image display device of the present embodiment will now be described. The substrate 402 is flexible and thus can be bent as an image display device and can be adhered to a curved surface or utilized with a wearable terminal or the like without any discomfort.

Sixth Embodiment

In the present embodiment, a plurality of light-emitting surfaces corresponding to a plurality of light-emitting elements are formed in a single semiconductor layer including a light-emitting layer, thereby realizing an image display device having a higher light emission efficiency. In the description below, components that are the same as those of the other embodiments described above are denoted by the same reference signs, and detailed descriptions thereof will be omitted as appropriate.

Figure 31:
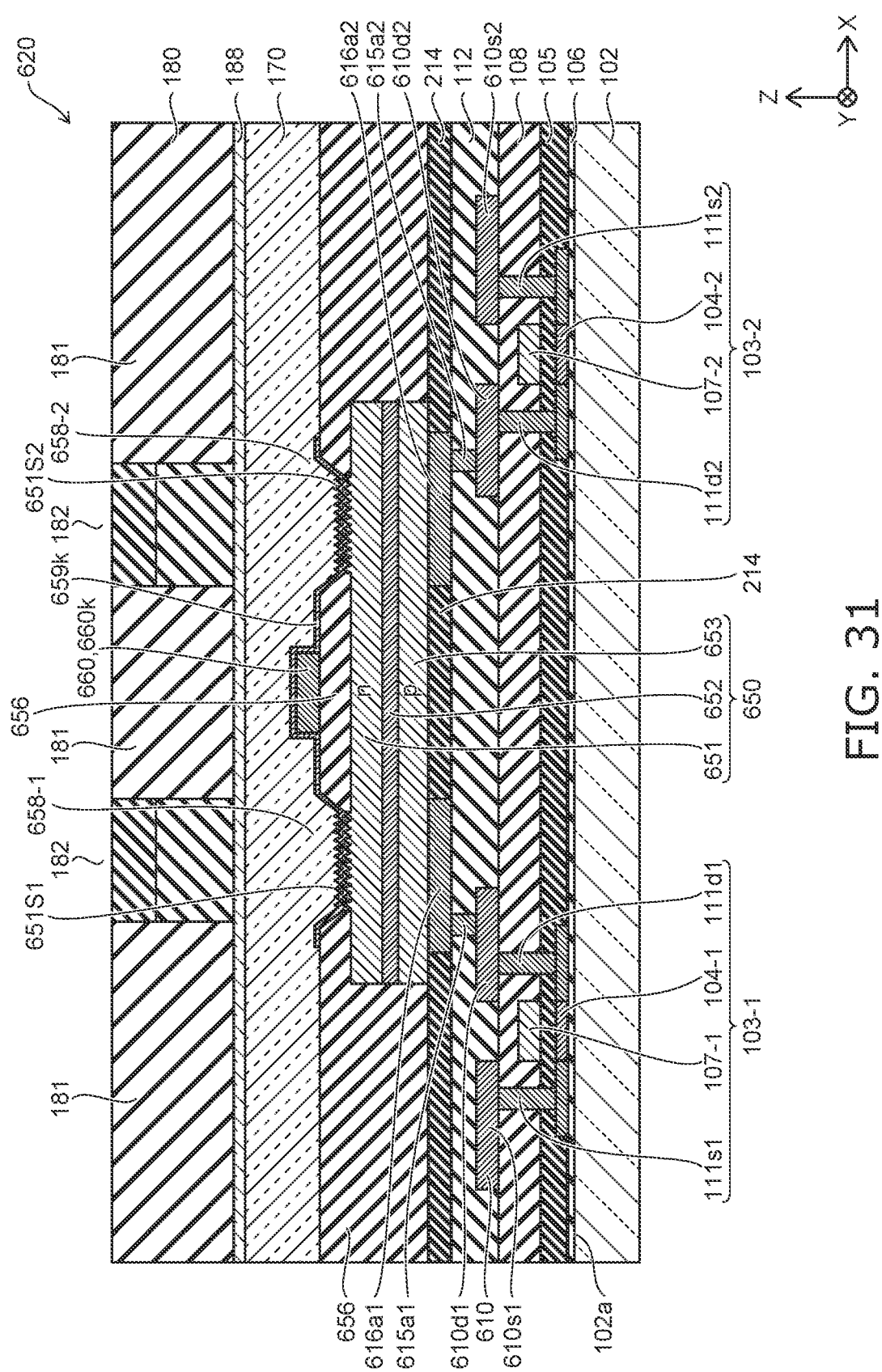
FIG. 31 is a schematic cross-sectional view illustrating a portion of an image display device according to a sixth embodiment.

FIG. 31 is a schematic cross-sectional view illustrating a portion of an image display device according to the present embodiment.

As illustrated in FIG. 31, the image display device includes a sub-pixel group 620. The sub-pixel group 620 includes the plurality of transistors 103-1, 103-2, a first wiring layer 610 (first wiring layer), the first interlayer insulating film (first insulating film) 112, plugs 616a1, 616a2, a semiconductor layer 650, a second interlayer insulating film (second insulating film) 656, and a second wiring layer (second wiring layer) 660.

In the present embodiment, the transistors 103-1, 103-2 of a p-channel are turned on, thereby injecting holes into the semiconductor layer 650 via the plugs 616a1, 616a2 and injecting electrons into the semiconductor layer 650 via the second wiring layer 660, causing a light-emitting layer 652 to emit light. The circuit configuration illustrated in FIG. 2, for example, is applied to the drive circuit. The n-type semiconductor layer and the p-type semiconductor layer of the semiconductor layer can be vertically interchanged by using the other embodiments described above to make a configuration in which the semiconductor layer is driven by an n-channel transistor. In such a case, the circuit configuration of FIG. 15, for example, is applied to the drive circuit.

The semiconductor layer 650 includes two light-emitting surfaces 651S1, 651S2, and the sub-pixel group 620 substantially includes two sub-pixels. In the present embodiment, the display region is formed by arraying the sub-pixel group 620 substantially including two sub-pixels in a lattice pattern, as in the other embodiments described above.

The transistors 103-1, 103-2 are respectively formed in TFT channels 104-1, 104-2. In this example, the TFT channels 104-1, 104-2 each include a p-doped region, and a channel region is interposed between these regions.

On the TFT channel 104-1, 104-2, the insulating layer 105 is formed and gates 107-1, 107-2 are formed with the insulating layer 105 interposed therebetween. The gates 107-1, 107-2 are gates of the transistors 103-1, 103-2. In this example, the transistors 103-1, 103-2 are p-channel TFTs.

The insulating film 108 covers the two transistors 103-1, 103-2. The first wiring layer 610 is formed on the insulating film 108.

The vias 111$s$1, 111$d$1 are provided between the p-type doped region of the transistor 103-1 and the first wiring layer 610. The vias 111$s$2, 111$d$2 are provided between the p-type doped region of the transistor 103-2 and the first wiring layer 610.

The first wiring layer 610 includes wiring portions 610$s$1, 610$s$2, 610$d$1, 610$d$2. The wiring portion 610$s$1 is connected to a region corresponding to the source electrode of the transistor 103-1 by the via 111$s$1. The wiring portion 610$s$2 is connected to a region corresponding to the source electrode of the transistor 103-2 by the via 111$s$2. The wiring portion 610$d$1 is connected to a region corresponding to the drain electrode of the transistor 103-1 by the via 111$d$1. The wiring portion 610$d$2 is connected to a region corresponding to the drain electrode of the transistor 103-2 by the via 111$d$2.

The first interlayer insulating film 112 covers the insulating film 108, the first wiring layer 610, and connecting portions 615$a$1, 615$a$2.

The flattening film 214 is formed on the first interlayer insulating film 112. The plugs 616$a$1, 616$a$2 are embedded in the flattening film 214, and the flattening film 214 and the plugs 616$a$1, 616$a$2 each include a surface in the same plane in an XY plane view. This surface faces the surface on the first interlayer insulating film 112 side. That is, the flattening film 214 is provided between the plugs 616$a$1, 616$a$2.

The connecting portion 615$a$1 is provided between the plug 616$a$1 and the wiring portion 610$d$1. The connecting portion 615$a$1 electrically connects the plug 616$a$1 and the wiring portion 610$d$1. The connecting portion 615$a$2 is provided between the plug 616$a$2 and the wiring portion 610$d$2. The connecting portion 615$a$2 electrically connects the plug 616$a$2 and the wiring portion 610$d$2.

The semiconductor layer 650 is provided on the flattening film 214 and the plugs 616$a$1, 616$a$2.

The semiconductor layer 650 includes a p-type semiconductor layer 653, the light-emitting layer 652, and an n-type semiconductor layer 651. The semiconductor layer 650 is layered in the order of the p-type semiconductor layer 653, the light-emitting layer 652, and the n-type semiconductor layer 651 from the side of the plugs 616$a$1, 616$a$2 toward the side of the light-emitting surfaces 651S1, 651S2. The plugs 616$a$1, 616$a$2 are connected to the p-type semiconductor layer 653.

The second interlayer insulating film (second insulating film) 656 covers the flattening film 214 and the plugs 616$a$1, 616$a$2. The second interlayer insulating film 656 covers a portion of the semiconductor layer 650. Preferably, the second interlayer insulating film 656 covers a surface of the n-type semiconductor layer 651, excluding the light-emitting surfaces (exposed surfaces) 651S1, 651S2 of the semiconductor layer 650. The second interlayer insulating film 656 covers a lateral surface of the semiconductor layer 650. The second interlayer insulating film 656 is preferably a white resin. A material similar to that of the second interlayer insulating film 156 in the other embodiments described above is used as the white resin.

Openings 658-1, 658-2 are formed in portions of the semiconductor layer 650 not covered by the second interlayer insulating film 656. The openings 658-1, 658-2 are formed at positions corresponding to the light-emitting surfaces 651S1, 651S2. The light-emitting surfaces 651S1, 651S2 are formed in distant positions on the n-type semiconductor layer 651. The light-emitting surface 651S1 is provided on the n-type semiconductor layer 651 at a position closer to the transistor 103-1. The light-emitting surface 651S2 is provided on the n-type semiconductor layer 651 at a position closer to the transistor 103-2.

The openings 658-1, 658-2 have, for example, square or rectangular shapes in an XY plane view. The shape is not limited to rectangular, and may be circular, elliptical, or polygonal such as hexagon. The light-emitting surfaces 651S1, 651S2 also have square, rectangular, other polygonal, or circular shape, or the like in an XY plane view. The shape of the light-emitting surfaces 651S1, 651S2 may be similar to or different from the shape of the openings 658-1, 658-2.

The second wiring layer 660 is provided on the second interlayer insulating film 656. The second wiring layer 660 includes a wiring portion 660$k$. The wiring portion 660$k$ is provided between the openings 658-1, 658-2. The second interlayer insulating film 656 provided with the wiring portion 660$k$ is provided on the n-type semiconductor layer 651. The wiring portion 660$k$ is connected to a ground line (not illustrated). Note that, in FIG. 31, the reference sign of this second wiring layer 660 is denoted in conjunction with the reference sign of the wiring portion 660$k$, and the second wiring layer 660 includes the wiring portion 660$k$. The same applies to FIG. 34 described below.

A light-transmitting electrode 659$k$ is provided over each of the light-emitting surfaces 651S1, 651S2 exposed from the openings 658-1, 658-2. The light-transmitting electrode 659$k$ is provided over the wiring portion 660$k$. The light-transmitting electrode 659$k$ is provided between the light-emitting surface 651S1 and the wiring portion 660$k$, and is provided between the light-emitting surface 651S2 and the wiring portion 660$k$. The light-transmitting electrode 659$k$ electrically connects the light-emitting surfaces 651S1, 651S2 and the wiring portion 660$k$. The light-transmitting electrode 659$k$ is formed of, for example, an ITO film.

As described above, the light-transmitting electrode 659$k$ is connected to the light-emitting surfaces 651S1, 651S2 exposed from the openings 658-1, 658-2. Therefore, electrons supplied from the light-transmitting electrode 659$k$ are respectively supplied to the n-type semiconductor layer 651 from the exposed light-emitting surfaces 651S1, 651S2. On the other hand, holes are respectively supplied to the p-type semiconductor layer 653 via the plugs 616$a$1, 616$a$2.

The transistors 103-1, 103-2 are drive transistors of adjacent sub-pixels and are driven sequentially. Accordingly, holes supplied from either one of the two transistors 103-1, 103-2 are injected into the light-emitting layer 652, electrons supplied from the wiring portion 660k are injected into the light-emitting layer 652, and the light-emitting layer 652 emits light.

The opening 658-1 and the light-emitting surface 651S1 are provided in positions closer to the transistor 103-1 than the position of the transistor 103-2. Therefore, when the transistor 103-1 is turned on, holes are injected via the wiring portion 610d1, the connecting portion 615a1, and the plug 616a1, causing the light-emitting surface 651S1 to emit light.

The opening 658-2 and the light-emitting surface 65152 are provided in positions closer to the transistor 103-2 than the position of the transistor 103-1. Therefore, when the transistor 103-2 is turned on, the light-emitting surface 651S2 emits light via the wiring portion 610d2, the connecting portion 615a2, and the plug 616a2.

Outer peripheries of the plugs 616a1, 616a2 are located within an outer periphery of the semiconductor layer 650. That is, an area of the plugs 616a1, 616a2 in an XY plane view is set smaller than an area of the semiconductor layer 650 in an XY plane view. Nevertheless, the plugs 616a1, 616a2 also function as light-reflecting plates, as follows.

An outer periphery of the light-emitting surface 651S1 is located within the outer periphery of the plug 616a1 includes in an XY plane view. An outer periphery of the light-emitting surface 651S2 is located within the outer periphery of the plug 616a2 in an XY plane view.

In the present embodiment, a resistance of the n-type semiconductor layer 651 and the p-type semiconductor layer 653 suppresses a drift current flowing in a direction parallel to the XY plane. Therefore, the electrons injected from the light-emitting surfaces 651S1, 651S2 and the holes injected from the plugs 616a1, 616a2 travel substantially straight. An area outside the light-emitting surfaces 651S1, 651S2 is rarely an emission source. Accordingly, with the outer periphery of the light-emitting surface 651S1 located within the outer periphery of the plug 616a1, and the outer periphery of the light-emitting surface 651S2 located within the outer periphery of the plug 616a2, the plugs 616a1, 616a2 function as light-reflecting plates. That is, the light scattering downward from the semiconductor layer 650 is reflected by the plugs 616a1, 616a2 toward the side of the light-emitting surfaces 651S1, 651S2. The plugs 616a1, 616a2 function as light-blocking plates. The light scattering downward from the semiconductor layer 650 is inhibited from reaching the transistors 103-1, 103-2 by the plugs 6161a1, 616a2.

A manufacturing method of the image display device according to the present embodiment will now be described.

FIGS. 32A to 33B are schematic cross-sectional views illustrating the manufacturing method of the image display device of the present embodiment.

Figure 32A:
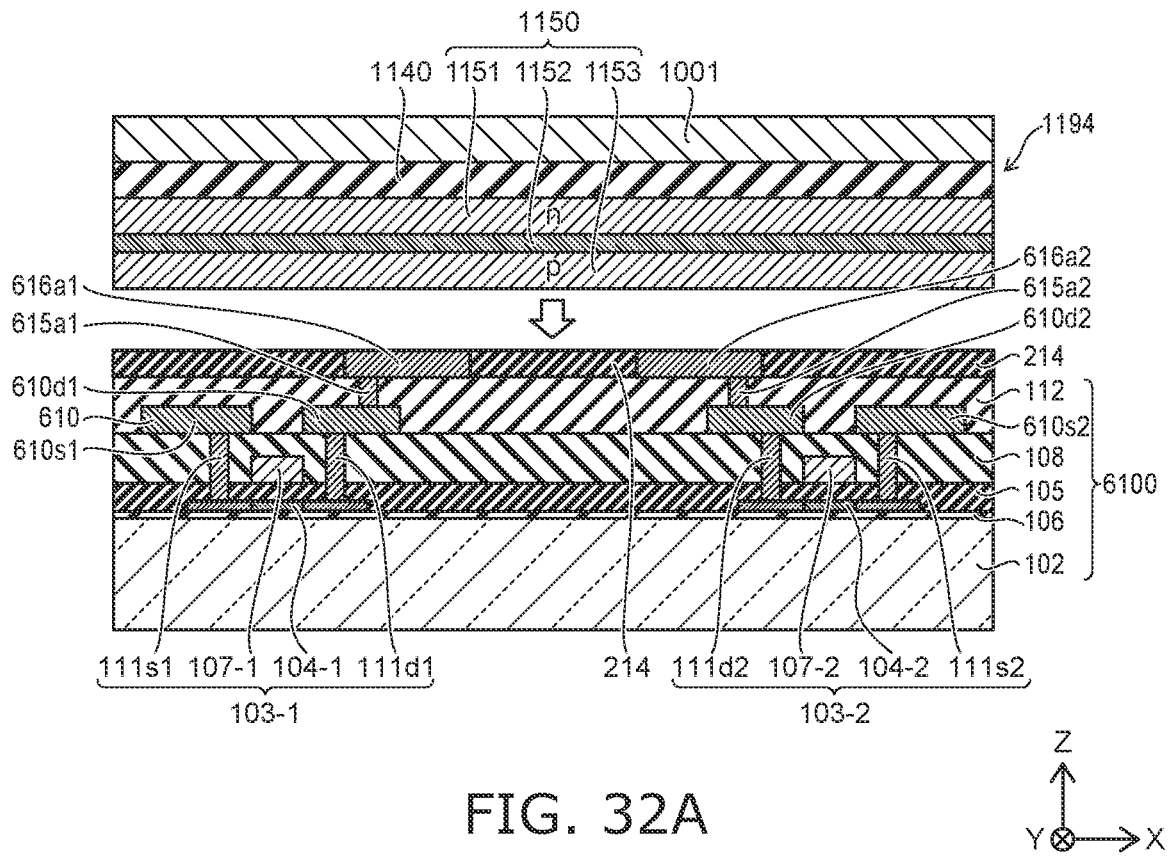
FIG. 32A is a schematic cross-sectional view illustrating a manufacturing method of the image display device according to the sixth embodiment.

As illustrated in FIG. 32A, the semiconductor growth substrate 1194 and a circuit substrate 6100 on which the plugs 616a1, 616a2 are formed are prepared. The semiconductor growth substrate 1194 includes the crystal growth substrate 1001, the buffer layer 1140, and the semiconductor layer 1150. The semiconductor growth substrate 1194 includes the semiconductor layer 1150 formed with the buffer layer 1140 provided on the crystal growth substrate 1001 interposed therebetween. The semiconductor layer 1150 includes the n-type semiconductor layer 1151, the light-emitting layer 1152, and the p-type semiconductor layer 1153. The n-type semiconductor layer 1151, the light-emitting layer 1152, and the p-type semiconductor layer 1153 are layered in the order of the n-type semiconductor layer 1151, the light-emitting layer 1152, and the p-type semiconductor layer 1153 from the buffer layer 1140 side. The semiconductor layer 1150 is formed by epitaxial growth by MOCVD or the like as in the other embodiments described above.

The exposed surface of the p-type semiconductor layer 1153 is bonded, by wafer bonding, to the flat surface of the plugs 616a1, 616a2 and the flattening film 214 formed on the circuit substrate 6100.

The processes illustrated in FIG. 16A to FIG. 18B of the second embodiment can be used for the procedure of forming the plugs 616a1, 616a2 and the connecting portions 615a1, 615a2 on the circuit substrate 6100. The circuit substrate 6100 has the same circuit configuration as that of the first embodiment and the third embodiment, and has the same structure as already described in most portions. In the following, the reference signs for the first wiring layer 610 and the wiring portions included in the first wiring layer 610 are replaced and the other components are the same as those in the first embodiment and the third embodiment, and thus detailed descriptions will be omitted as appropriate.

Figure 32B:
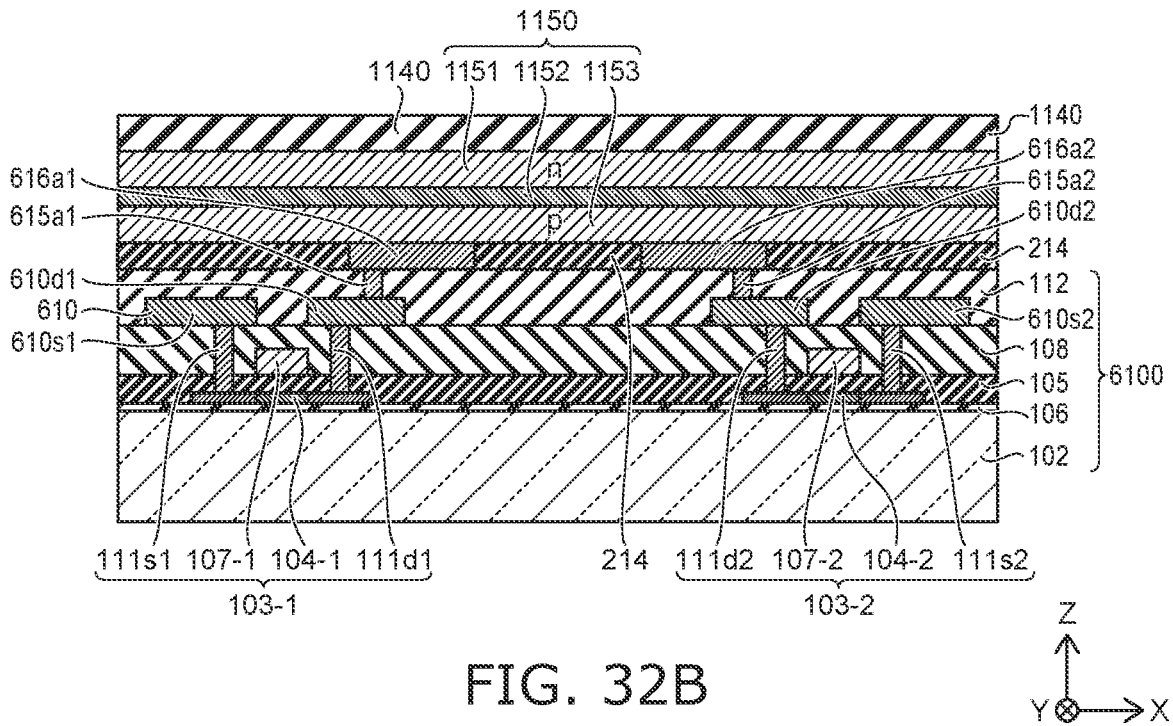
FIG. 32B is a schematic cross-sectional view illustrating the manufacturing method of the image display device according to the sixth embodiment.

As illustrated in FIG. 32B, after wafer bonding, the crystal growth substrate 1001 illustrated in FIG. 32A is removed.

Figure 33A:
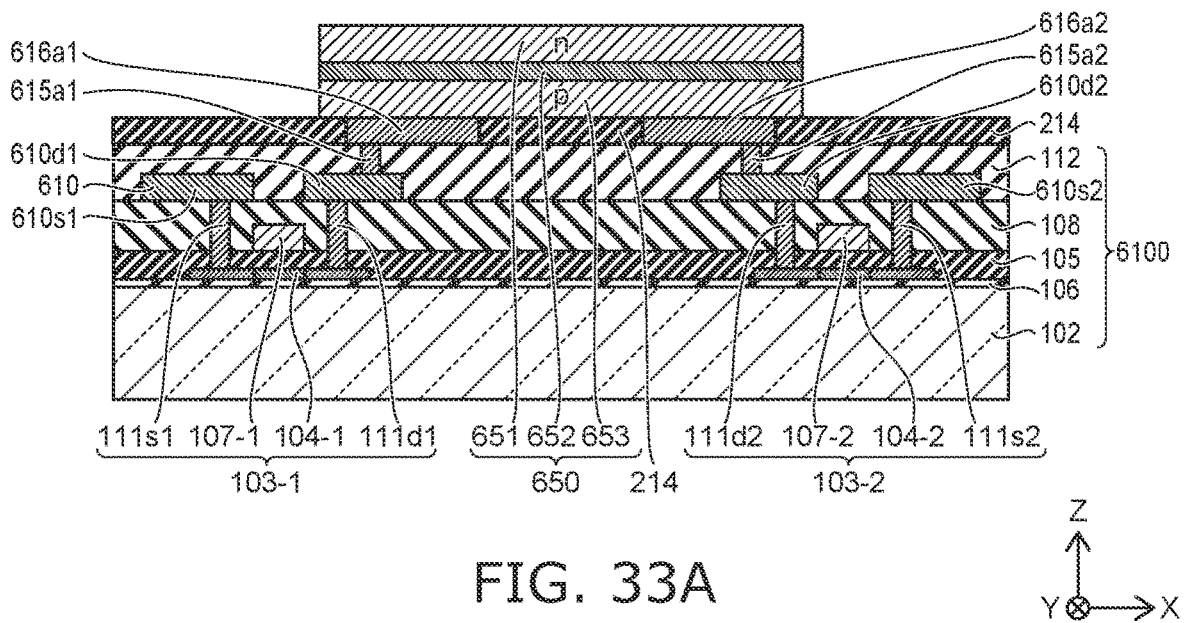
FIG. 33A is a schematic cross-sectional view illustrating the manufacturing method of the image display device according to the sixth embodiment.

As illustrated in FIG. 33A, the semiconductor layer 1150 illustrated in FIG. 32B is etched by RIE or the like to form the semiconductor layer 650.

Figure 33B:
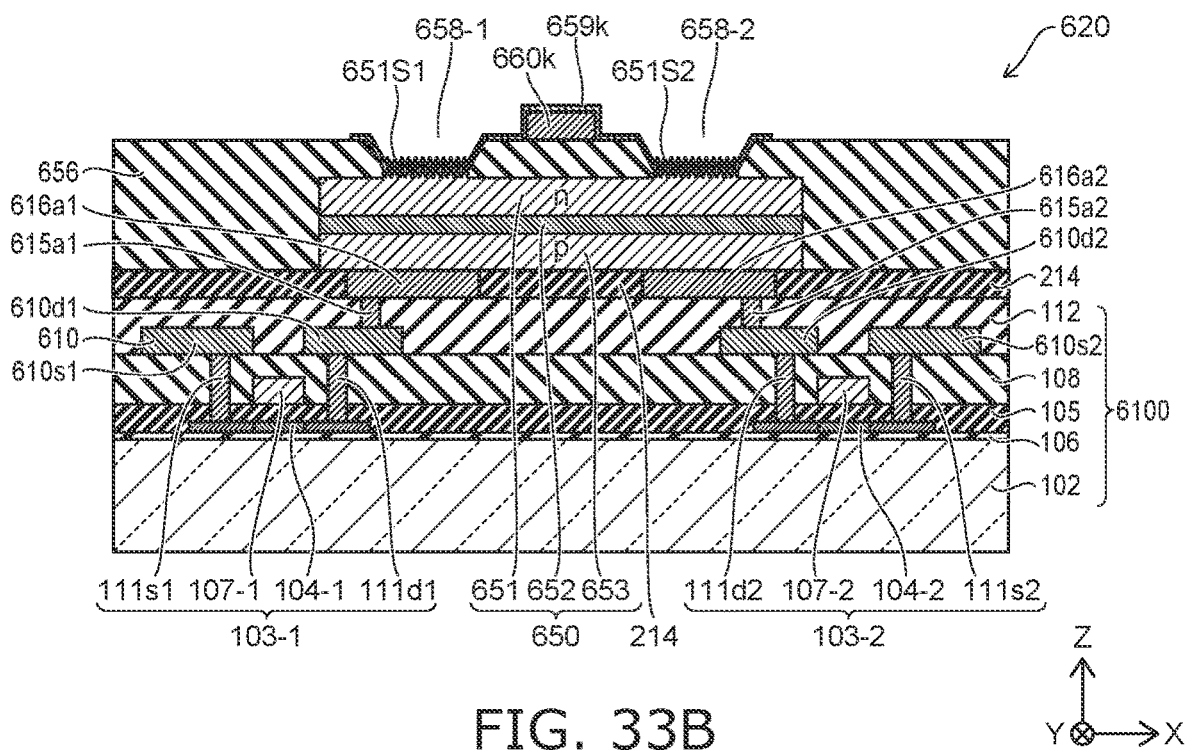
FIG. 33B is a schematic cross-sectional view illustrating the manufacturing method of the image display device according to the sixth embodiment.

As illustrated in FIG. 33B, the second interlayer insulating film 656 that covers the flattening film 214, the plugs 616a1, 616a2, and the semiconductor layer 650 is formed.

The second wiring layer 660 is formed on the second interlayer insulating film 656, and the wiring portion 660k and the like are formed by etching.

A portion of the second interlayer insulating film 656 at a position corresponding to that of the light-emitting surface 651S1 is removed, forming the opening 658-1. A portion of the second interlayer insulating film 656 at a position corresponding to that of the light-emitting surface 651S2 is removed, forming the opening 658-2.

The light-emitting surfaces 651S1, 651S2 exposed from the second interlayer insulating film 656 are each roughened. Subsequently, the light-transmitting electrode 659k is formed on the second interlayer insulating film 656. The light-transmitting electrode 659k electrically connects the n-type semiconductor layer 651 and the wiring portion 660k via the light-emitting surface 651S1. The light-transmitting electrode 659k electrically connects the n-type semiconductor layer 651 and the wiring portion 660k via the light-emitting surface 651S2.

In this manner, the sub-pixel group 620 including the semiconductor layer 650 that uses the two light-emitting surfaces 651S1, 651S2 in common is formed.

In the present example, the two light-emitting surfaces 651S1, 651S2 are provided in one semiconductor layer 650, but the number of light-emitting surfaces is not limited to two, and three or more light-emitting surfaces can be provided on one semiconductor layer 650. As an example, one or two columns of sub-pixels may be realized by a single semiconductor layer 650. As a result, as described below, a recombination current that does not contribute to light emission per light-emitting surface can be reduced and the effect of realizing a finer light-emitting element can be increased.

Modified Example

Figure 34:
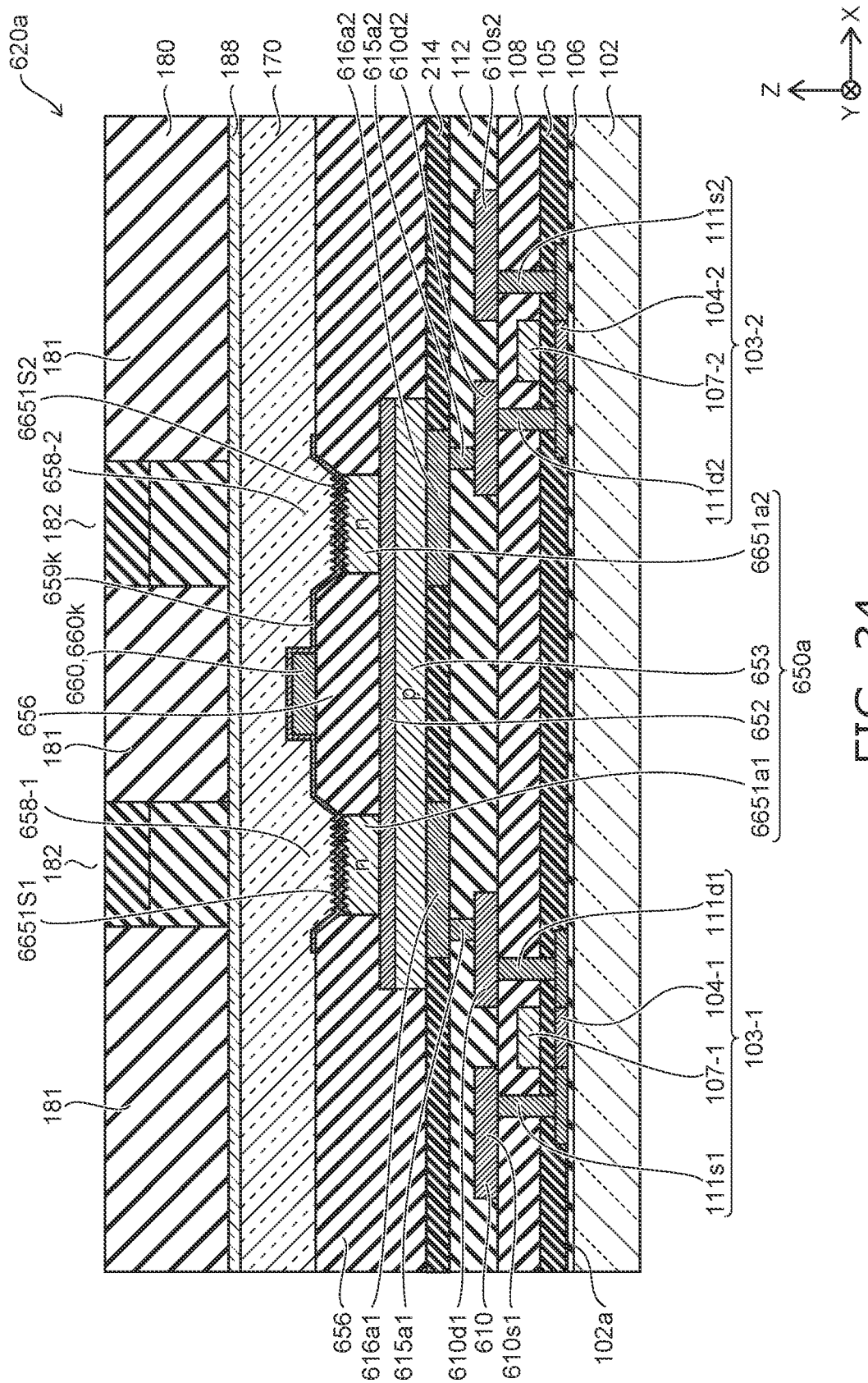
FIG. 34 is a schematic cross-sectional view illustrating a portion of an image display device according to a modified example of the sixth embodiment.

FIG. 34 is a schematic cross-sectional view illustrating a portion of an image display device according to a modified example of the present embodiment.

The present modified example differs from the sixth embodiment described above in that two n-type semiconductor layers 6651a1, 6651a2 are provided on the light-emitting layer 652. In other respects, components that are the same as those of the sixth embodiment are denoted by the same reference signs, and detailed descriptions thereof will be omitted as appropriate.

As illustrated in FIG. 34, the image display device of the present modified example includes a sub-pixel group 620a. The sub-pixel group 620a includes a semiconductor layer 650a. The semiconductor layer 650a includes the p-type semiconductor layer 653, the light-emitting layer 652, and the n-type semiconductor layers 6651a1, 6651a2. The p-type semiconductor layer 653, the light-emitting layer 652, and the n-type semiconductor layers 6651a1, 6651a2 are layered in this order from the side of the first interlayer insulating film 112 toward the side of light-emitting surfaces 6651S1, 6651S2.

The n-type semiconductor layers 6651a1, 6651a2 are distant in the X-axis direction on the light-emitting layer 652. The second interlayer insulating film 656 is provided between the n-type semiconductor layers 6651a1, 6651a2, and the n-type semiconductor layers 6651a1, 6651a2 are separated by the second interlayer insulating film 656.

The n-type semiconductor layers 6651a1, 6651a2 have substantially the same shape in an XY plane view, and the shape thereof is substantially square or rectangular, and may be another polygonal shape, circular, or the like.

The n-type semiconductor layers 6651a1, 6651a2 respectively include light-emitting surface 6651S1, 6651S2. The light-emitting surfaces 6651S1, 6651S2 are surfaces of the n-type semiconductor layers 6651a1, 6651a2 respectively exposed by the openings 658-1, 658-2.

The light-emitting surfaces 6651S1, 6651S2 have substantially the same shape in an XY plane view and have a substantially square shape or the like, similar to the shape of the light-emitting surfaces in the sixth embodiment. The shape of the light-emitting surfaces 6651S1, 6651S2 is not limited to a rectangular shape such as in the present embodiment, and may be circular, elliptical, or polygonal such as hexagonal. The shape of the light-emitting surfaces 6651S1, 6651S2 may be similar to or different from the shape of the openings 658-1, 658-2.

The light-transmitting electrode 659k is provided on each of the light-emitting surfaces 6651S1, 6651S2. The light-transmitting electrode 659k is also provided on the wiring portion 660k. The light-transmitting electrode 659k is provided between the wiring portion 660k and the light-emitting surface 6651S1, and is provided between the wiring portion 660k and the light-emitting surface 6651S2. The light-transmitting electrode 659k electrically connects the wiring portion 660k and the light-emitting surfaces 6651S1, 6651S2.

A manufacturing method of the present modified example will now be described.

Figure 35A:
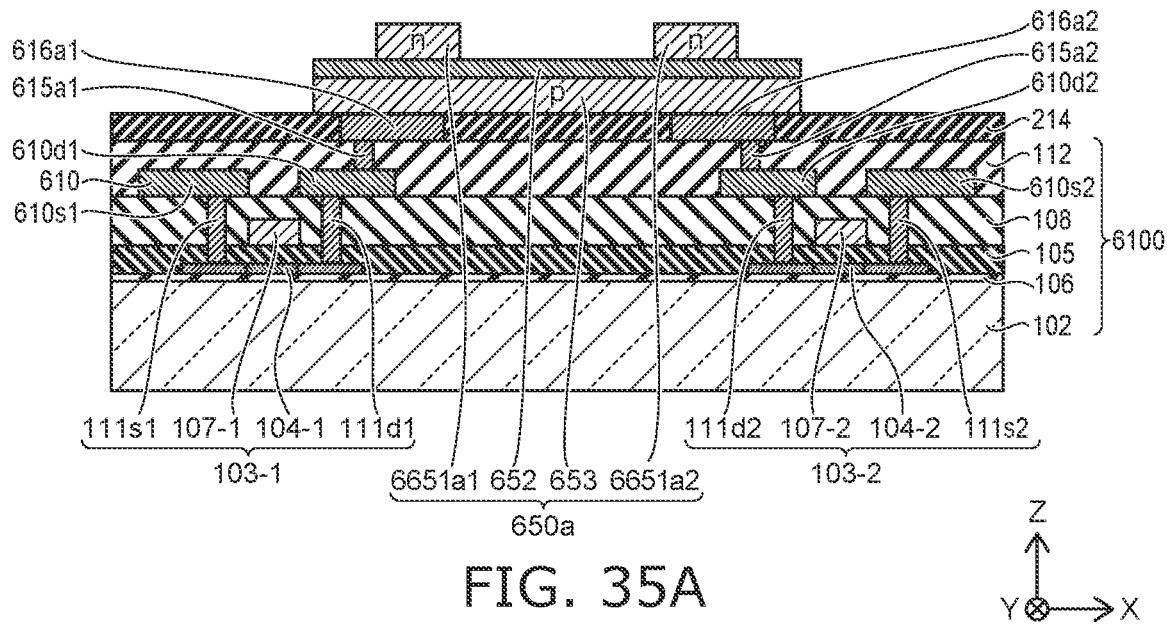
FIG. 35A is a schematic cross-sectional view illustrating a manufacturing method of the image display device of the modified example of the sixth embodiment.
Figure 35B:
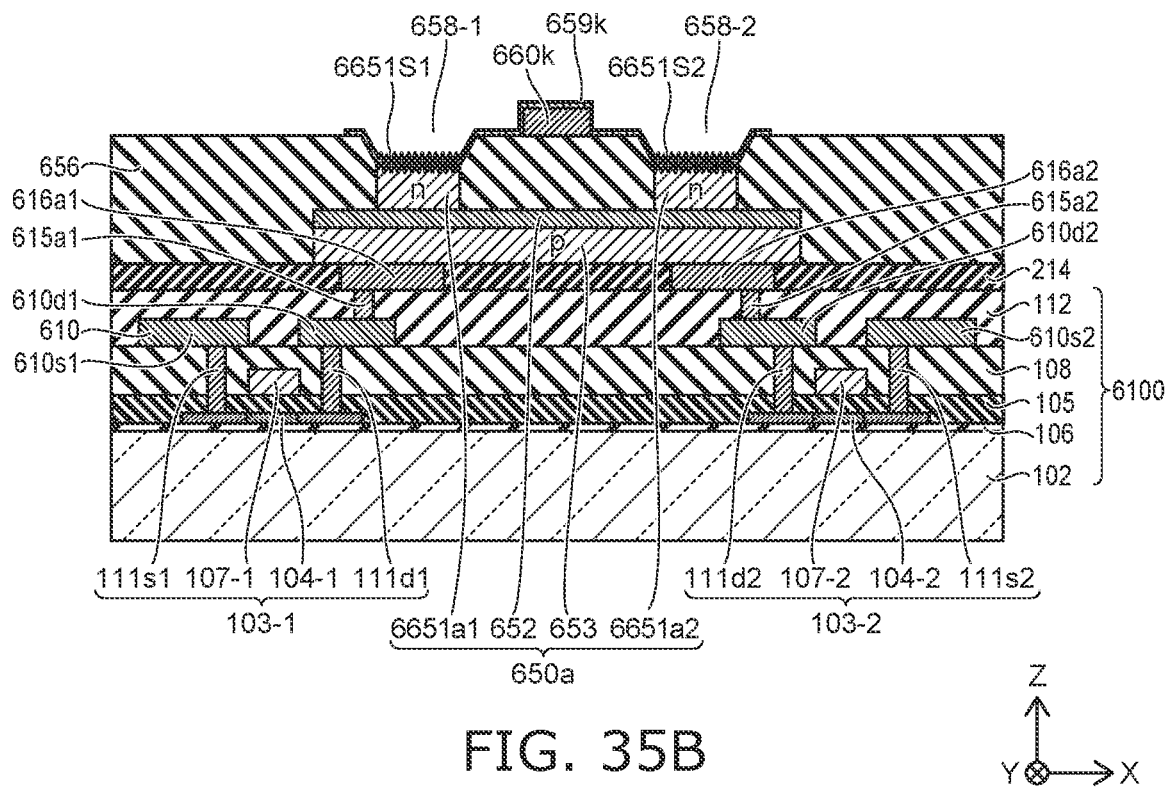
FIG. 35B is a schematic cross-sectional view illustrating the manufacturing method of the image display device of the modified example of the sixth embodiment.

FIGS. 35A and 35B are schematic cross-sectional views illustrating the manufacturing method of the image display device of the present modified example.

In the present modified example, until the bonding of the circuit substrate 6100 on which the plugs 616a1, 616a2 and the connecting portions 615a1, 615a2 are formed to the semiconductor layer 1150, the same processes as those described in FIG. 32A and FIG. 32B in the sixth embodiment are applied. In the following, the processes following the process described in FIG. 32B will be described.

As illustrated in FIG. 35A, in the present modified example, the semiconductor layer 1150 illustrated in FIG. 32B is etched to form the light-emitting layer 652 and the p-type semiconductor layer 653. Etching is further performed to form the two n-type semiconductor layers 6651a1, 6651a2.

The n-type semiconductor layers 6651a1, 6651a2 may be formed by deeper etching. For example, the etching for forming the n-type semiconductor layers 6651a1, 6651a2 may be performed to a depth that reaches inside the light-emitting layer 652 and inside the p-type semiconductor layer 653. In a case in which the n-type semiconductor layers are thus deeply etched, an etching position of the n-type semiconductor layer 1151 is preferably separated from outer peripheries of the light-emitting surfaces 6651S1, 6651S2 of the n-type semiconductor layer described below by 1 µm or more. By separating the etching position from the outer peripheries of the light-emitting surfaces 6651S1, 6651S2, a recombination current can be suppressed.

As illustrated in FIG. 35B, an interlayer insulating film covering the flattening film 214, the plugs 616a1, 616a2, and the semiconductor layer 650a is formed. The second wiring layer 660 is formed on the second interlayer insulating film 656, and the wiring portion 660k and the like are formed by etching.

The openings 658-1, 658-2 are each formed by removing a portion of the second interlayer insulating film 656 at a position corresponding to the respective light-emitting surfaces 6651S1, 6651S2. The light-emitting surfaces 6651S1, 6651S2 of the p-type semiconductor layer exposed by the openings 658-1, 658-2 are each roughened. Subsequently, the light-transmitting electrode 659k is formed.

In this manner, the sub-pixel group 620a including the two light-emitting surfaces 6651S1, 6651S2 is formed.

In the case of the present modified example as well, as in the case of the sixth embodiment, the number of light-emitting surfaces is not limited to two, and three or more light-emitting surfaces may be provided on one semiconductor layer 650a.

Effects of the image display device of the present embodiment will now be described.

Figure 36:
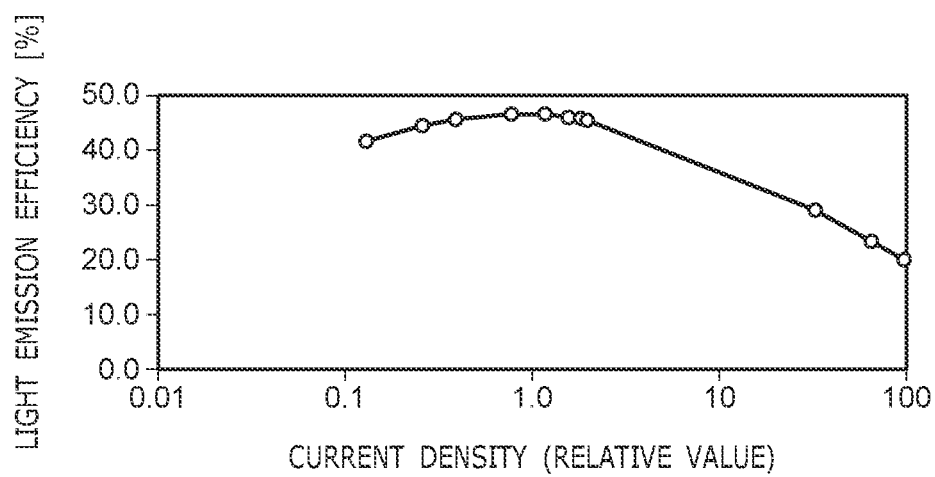
FIG. 36 is a graph showing features of a pixel LED element.

FIG. 36 is a graph showing features of a pixel LED element.

The vertical axis in FIG. 36 indicates light emission efficiency (%). The horizontal axis indicates the current density of the current flowing in the pixel LED element by a relative value.

As shown in FIG. 36, in regions where the relative value of the current density is less than 1.0, the light emission efficiency of the pixel LED element is substantially constant or increases monotonically. In regions where the relative value of the current density is greater than 1.0, the light emission efficiency decreases monotonically. That is, in the pixel LED element, there exists an appropriate current density that results in the greatest light emission efficiency.

It is expected that a highly efficient image display device is realized by suppressing the current density to the extent that sufficient brightness can be acquired from the light-emitting element. Nevertheless, it is shown by FIG. 36 that, at low current densities, the light emission efficiency tends to decrease as the current density decreases.

For example, as described in the first embodiment to the fifth embodiment, the light-emitting elements are formed by individually separating all layers of the semiconductor layer 1150 including the light-emitting layers by etching or the like. At this time, a bonding surface between the light-emitting layers and the n-type semiconductor layer is exposed at an end portion. Similarly, a bonding surface between the light-emitting layers and the p-type semiconductor layer is exposed at an end portion.

If such an end portion is present, electrons and holes are recombined at the end portion. On the other hand, such a recombination does not contribute to light emission. Recombination at the end portion occurs almost regardless of the current flowing in the light-emitting element. Recombination is thought to occur depending on a length, at the end portion, of the bonding surface that contributes to light emission.

When two cubic-shaped light-emitting elements having the same dimensions are made to emit light, recombination can occur at a total of eight end portions because the end portions are formed in four directions for each light-emitting element.

In contrast, in the present embodiment, in the semiconductor layers 650, 650a including two light-emitting surfaces, there are four end portions. Because the region between the openings 658-1, 658-2 has few injections of electrons and holes and hardly contributes to light emission, the number of end portions contributing to light emission can be regarded as six. Thus, in the present embodiment, the number of end portions of the semiconductor layer is substantially reduced, making it possible to reduce the recombination that does not contribute to light emission and reduce the drive current by the reduction in the recombination current.

For high definition and the like, in a case in which the distance between sub-pixels is reduced or a case in which the current density is relatively high or the like, the distance between the light-emitting surfaces 651S1, 651S2 is shortened in the sub-pixel group 620 of the sixth embodiment. In this case, when the p-type semiconductor layer 653 is shared, there is a risk that a portion of the electrons injected on the side of the adjacent light-emitting surface may be diverted, causing the light-emitting surface on the side not being driven to emit a small amount of light. In the modified example, the p-type semiconductor layer is separated from the light-emitting surfaces, making it possible to reduce the occurrence of small light emission in the light-emitting surface on the side not being driven.

In the present embodiment, the semiconductor layer including the light-emitting layer is layered in the order of the n-type semiconductor layer, the light-emitting layer, and the p-type semiconductor layer from the side of the first interlayer insulating film 112, and the exposed surface of the p-type semiconductor layer is roughened, which is preferred from the viewpoint of improving the light emission efficiency. As in the other embodiments described above, instead of the layered order of the p-type semiconductor layer and the n-type semiconductor layer, the p-type semiconductor layer, the light-emitting layer, and the n-type semiconductor layer may be layered in this order.

Specific examples of the respective sub-pixels and sub-pixel groups of the image display devices according to the embodiments described above have been described. Each of the specific examples is merely an example, and other configuration examples can be obtained by combining the configurations, processes, and procedures of these embodiments as appropriate. For example, in the first embodiment, the p-type semiconductor layer can be used as the light-emitting surface instead of the n-type semiconductor layer and, in the second embodiment, the n-type semiconductor layer can be used as the light-emitting surface instead of the p-type semiconductor layer.

Seventh Embodiment

The image display device described above can be, as an image display module including an appropriate number of pixels, a computer display, a television, a mobile terminal such as a smartphone, or a car navigation system, for example.

Figure 37:
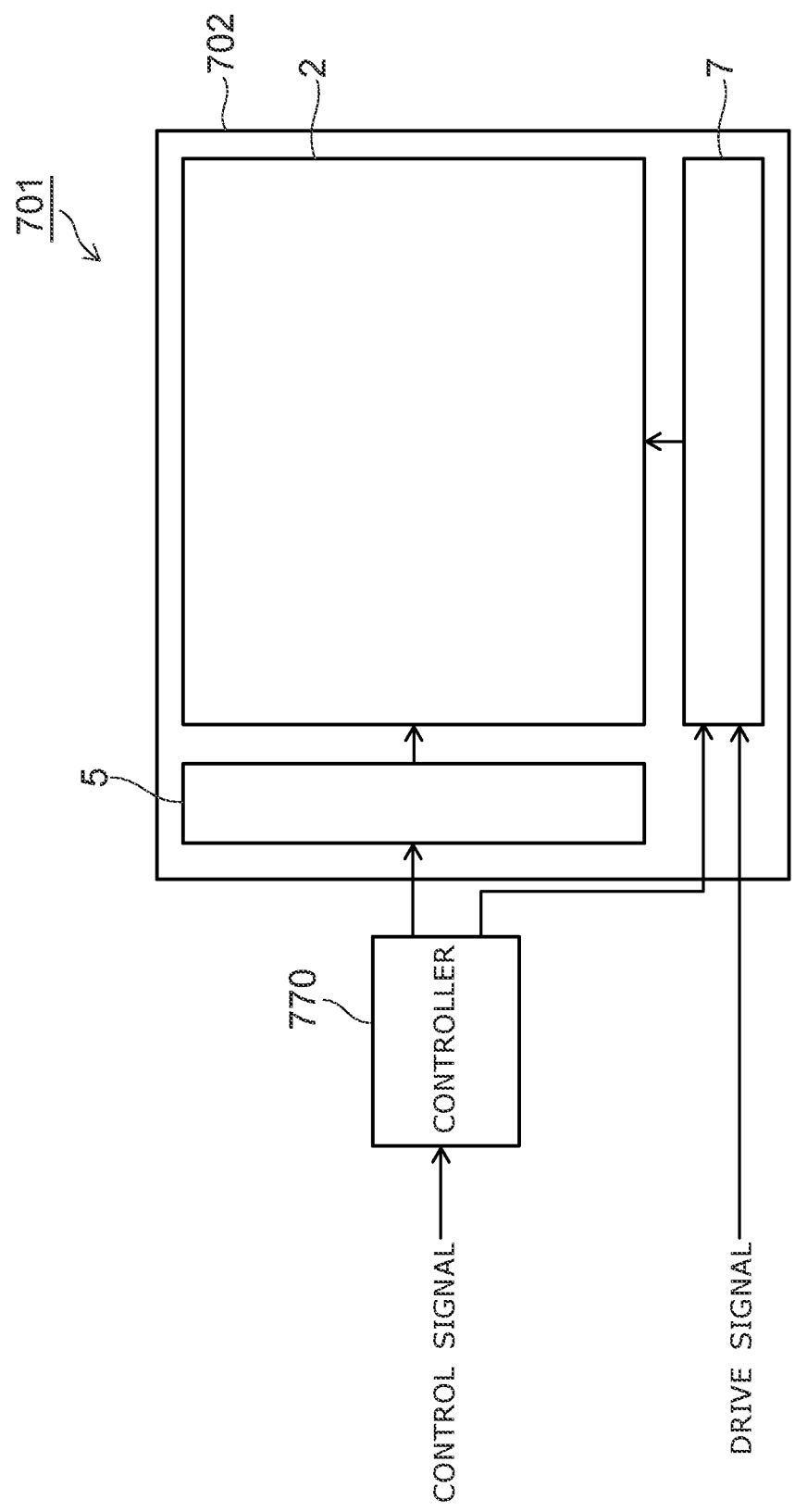
FIG. 37 is a block diagram illustrating an image display device according to a seventh embodiment.

FIG. 37 is a block diagram illustrating an image display device according to the present embodiment.

A main portion of a configuration of a computer display is illustrated in FIG. 37.

As illustrated in FIG. 37, an image display device 701 includes an image display module 702. The image display module 702 is, for example, an image display device provided with the configuration of the first embodiment described above. The image display module 702 includes the display region 2 in which the plurality of sub-pixels including the sub-pixels 20-1, 20-2 are arrayed, the row selection circuit 5, and the signal voltage output circuit 7.

The image display device 701 further includes a controller 770. The controller 770 inputs control signals separated and generated by an interface circuit (not illustrated) to control the drive and drive sequence of each sub-pixel with respect to the row selection circuit 5 and the signal voltage output circuit 7.

Modified Example

The image display device described above can be, as an image display module including an appropriate number of pixels, a computer display, a television, a mobile terminal such as a smartphone, or a car navigation system, for example.

Figure 38:
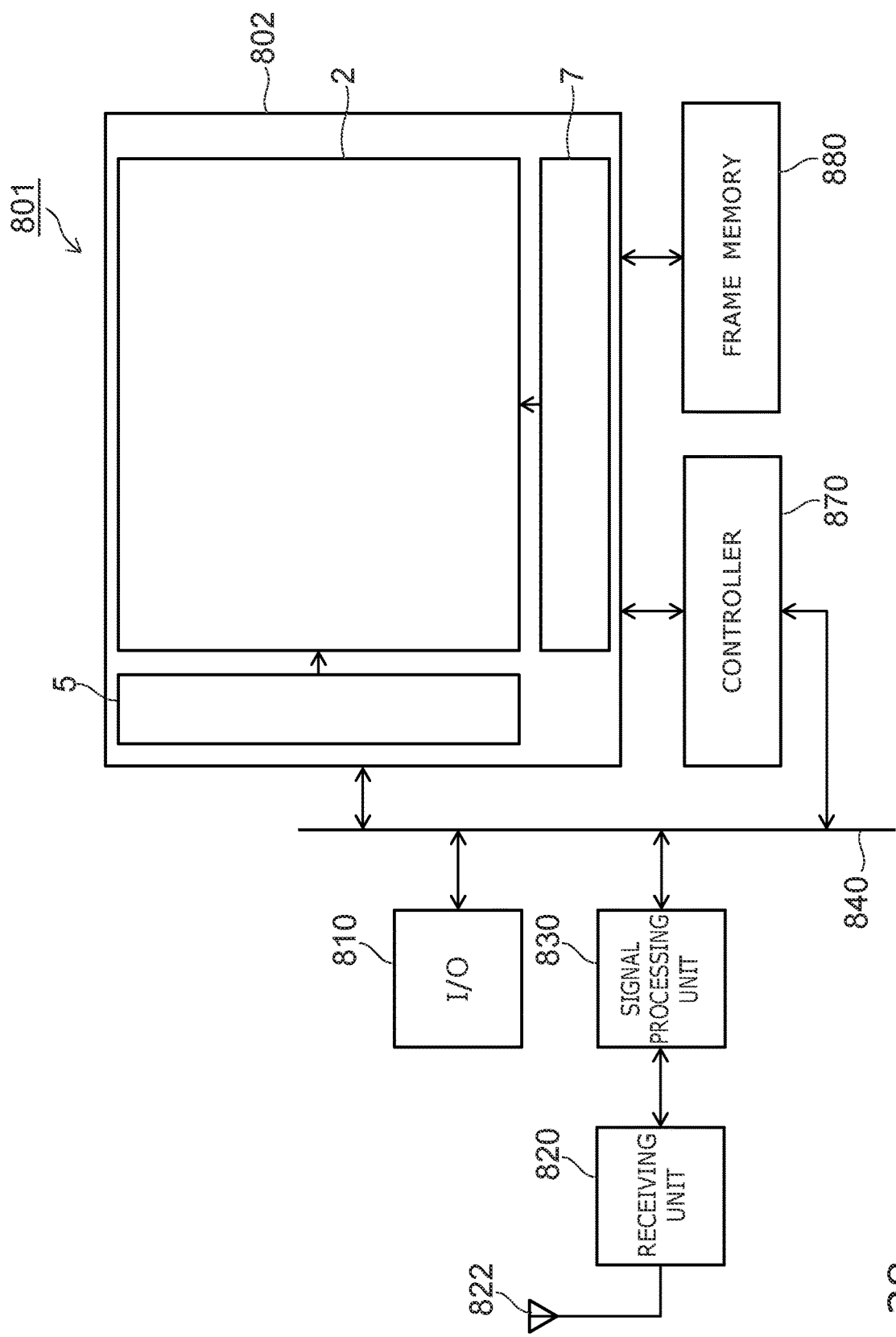
FIG. 38 is a block diagram illustrating an image display device according to a modified example of the seventh embodiment.

FIG. 38 is a block diagram illustrating an image display device according to a modified example of the present embodiment.

FIG. 38 illustrates a configuration of a high-definition, flat-screen television.

As illustrated in FIG. 38, an image display device 801 includes an image display module 802. The image display module 802 is, for example, the image display device 1 provided with the configuration of the first embodiment described above. The image display device 801 includes a controller 870 and a frame memory 880. The controller 870 controls the drive sequence of each sub-pixel in the display region 2 on the basis of the control signal supplied by a bus 840. The frame memory 880 stores the display data of one frame and is used for processing, such as smooth video playback.

The image display device 801 includes an I/O circuit 810. The I/O circuit 810 provides an interface circuit and the like for connection to an external terminal, device, or the like. The I/O circuit 810 includes, for example, a universal serial bus (USB) interface for connecting an external hard disk device or the like, and an audio interface.

The image display device 801 includes a receiving unit 820 and a signal processing unit 830. The receiving unit 820 is connected with an antenna 822 to separate and generate necessary signals from radio waves received by the antenna 822. The signal processing unit 830 includes a digital signal processor (DSP), a central processing unit (CPU), and the like, and signals separated and generated by the receiving unit 820 are separated and generated into image data, audio data, and the like by the signal processing unit 830.

Other image display devices can be made as well by using the receiving unit 820 and the signal processing unit 830 as high-frequency communication modules for transmission/reception of mobile phones, Wi-Fi, global positioning system (GPS) receivers, and the like. For example, an image display device provided with an image display module with an appropriate screen size and resolution may be made into a mobile information terminal such as a smartphone or a car navigation system.

The image display module in the case of the present embodiment is not limited to the configuration of the image display device in the first embodiment, and may be the configuration of a modified example or other embodiment.

Figure 39:
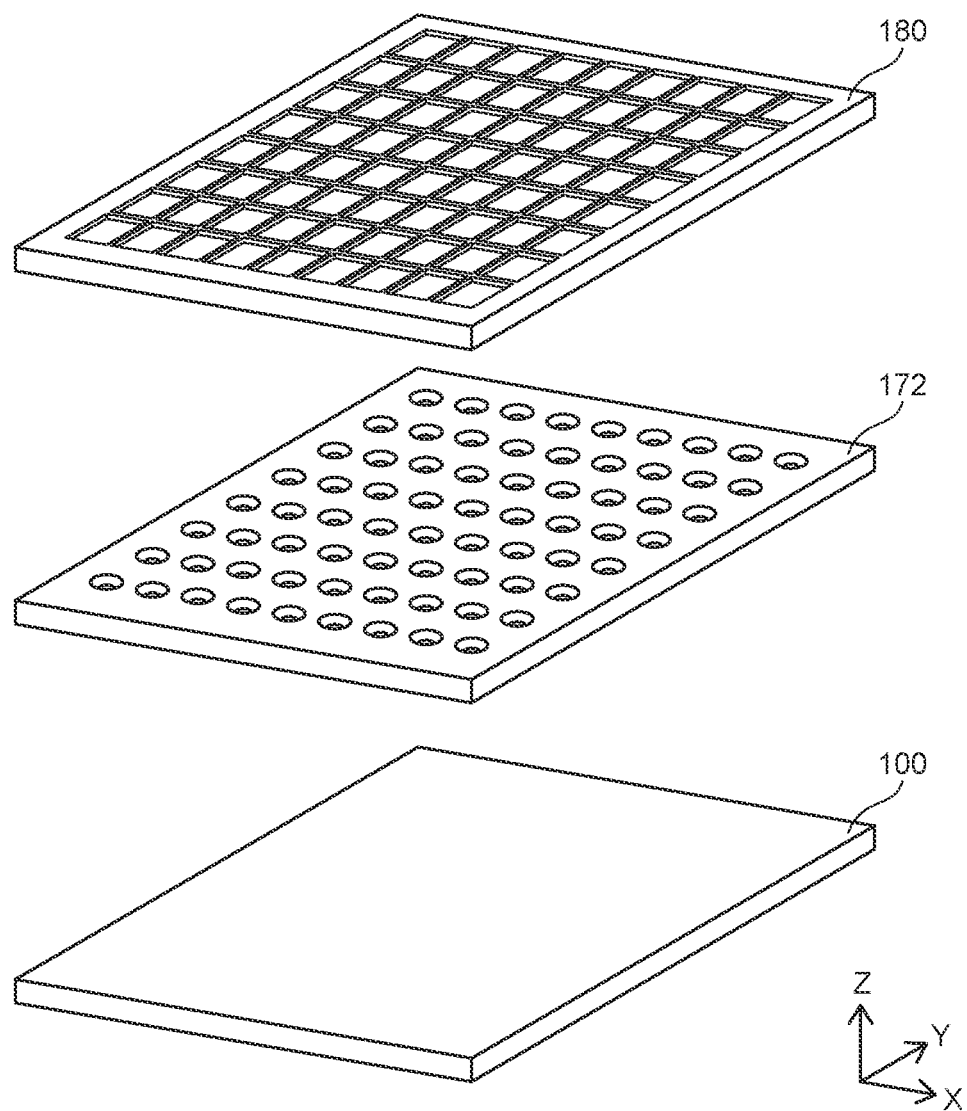
FIG. 39 is a perspective view schematically illustrating the image display devices according to the first to sixth embodiments and the modified examples thereof.

FIG. 39 is a perspective view schematically illustrating the image display devices according to the first to sixth embodiments and the modified examples thereof.

As illustrated in FIG. 39, the light-emitting circuit portion 172 including the plurality of sub-pixels is provided on the circuit substrate 100. The color filter 180 is provided on the light-emitting circuit portion 172. Note that, in the seventh embodiment, the structures including the circuit substrate 100, the light-emitting circuit portion 172, and the color filter 180 are the image display modules 702, 802 and are incorporated into the image display devices 701, 801.

According to the embodiments described above, an image display device manufacturing method and an image display device that reduce a transfer process of a light-emitting element and improve yield are realized.

While several embodiments of the present invention have been described above, these embodiments have been presented by way of example, and are not intended to limit the scope of the invention. These novel embodiments may be implemented in various other forms and various omissions, substitutions, and changes may be made without departing from the spirit of the invention. These embodiments and variations thereof are included in the scope and spirit of the invention, and are within the scope of the invention described in the claims and equivalents thereof. Further, each of the aforementioned embodiments may be implemented in combination with each other.

What is claimed is:

1. A method of manufacturing an image display device, the method comprising:
    providing a semiconductor growth substrate comprising a semiconductor layer, wherein the semiconductor layer comprises a light-emitting layer and is grown on a crystal growth substrate;
    providing a circuit substrate comprising:
        a circuit element located on a light-transmitting substrate,
        a first wiring layer located on the circuit element, and
        a first insulating film covering the circuit element and the first wiring layer;
    forming a first metal layer that is located on the first insulating film and is electrically connected to the first wiring layer;
    bonding the semiconductor growth substrate to the circuit substrate and electrically connecting the first metal layer to the semiconductor layer;
    etching the semiconductor layer to form a light-emitting element;
    etching the first metal layer to form a plug electrically connected to the light-emitting element;
    forming a second insulating film covering the plug, the light-emitting element, and the first insulating film;
    removing a portion of the second insulating film to expose a light-emitting surface at a side opposite to a surface of the light-emitting element on a first insulating film side; and
    forming a second wiring layer electrically connected to the light-emitting surface.

2. The method according to claim 1, wherein the step of bonding the semiconductor growth substrate to the circuit substrate comprises bonding a plurality of the semiconductor growth substrates to one circuit substrate.

3. The method according to claim 2, wherein, in the step of etching the semiconductor layer to form a light-emitting element, the light-emitting element is formed at a position distant from each end portion of the plurality of semiconductor growth substrates.

4. The method according to claim 1, wherein the light-transmitting substrate is a glass substrate.

5. The method according to claim 4, further comprising:
    after bonding the semiconductor growth substrate to the circuit substrate, removing the glass substrate; wherein:
    the circuit substrate comprises a flexible substrate located between the glass substrate and the circuit element.

6. The method according to claim 1, further comprising, before the step of bonding the semiconductor growth substrate to the circuit substrate, forming a second metal layer on the semiconductor layer.

7. The method according to claim 6, further comprising:
    before the step of forming the second metal layer, forming a conductive layer on the semiconductor layer; wherein:
    in the step of forming the second metal layer, the second metal layer is formed on the conductive layer and is light-reflective.

8. The method according to claim 6, further comprising, after the step of bonding the semiconductor growth substrate to the circuit substrate, processing the second metal layer to form a third wiring layer.

9. The method according to claim 1, wherein the crystal growth substrate comprises silicon or sapphire.

10. The method according to claim 1, wherein the semiconductor layer comprises a gallium nitride compound semiconductor.

11. The method according to claim 1, further comprising forming a wavelength conversion member on the light-emitting element.

12. A method of manufacturing an image display device, the method comprising:
    providing a semiconductor growth substrate comprising a semiconductor layer, wherein the semiconductor layer comprises a light-emitting layer and is grown on a crystal growth substrate;
    providing a circuit substrate comprising:
        a circuit element located on a light-transmitting substrate,
        a first wiring layer located on the circuit element, and
        a first insulating film covering the circuit element and the first wiring layer;
    forming a plug that is located on the first insulating film and electrically connected to the first wiring layer;
    bonding the semiconductor growth substrate to the circuit substrate and electrically connecting the plug to the semiconductor layer;
    etching the semiconductor layer to form a light-emitting element;
    forming a second insulating film covering the plug, the light-emitting element, and the first insulating film;
    removing a portion of the second insulating film to expose a light-emitting surface at a side opposite to a surface of the light-emitting element on a first insulating film side; and
    forming a second wiring layer electrically connected to the light-emitting surface.

* * * * *